US010467952B2

(12) United States Patent
Pan

(10) Patent No.: US 10,467,952 B2
(45) Date of Patent: Nov. 5, 2019

(54) INTEGRATED LIGHT-EMITTING DIODE ARRAYS FOR DISPLAYS

(71) Applicant: Shaoher Pan, Palo Alto, CA (US)

(72) Inventor: Shaoher Pan, Palo Alto, CA (US)

(*) Notice: Subject to any disclaimer, the term of this patent is extended or adjusted under 35 U.S.C. 154(b) by 0 days.

(21) Appl. No.: 15/291,330

(22) Filed: Oct. 12, 2016

(65) Prior Publication Data
US 2018/0102085 A1 Apr. 12, 2018

(51) Int. Cl.
*G09G 3/22* (2006.01)
*G09G 3/20* (2006.01)
(Continued)

(52) U.S. Cl.
CPC ............... *G09G 3/22* (2013.01); *G06F 3/044* (2013.01); *G09G 3/2003* (2013.01);
(Continued)

(58) Field of Classification Search
CPC .... G09G 3/22; G09G 3/2003; G09G 2300/08; G09G 2300/0452; G09G 2310/0275; G09G 2310/0267; G09G 2300/0408; G06F 3/044; G06F 2203/04103; H01L 33/62; H01L 33/504; H01L 33/30; H01L 33/06; H01L 27/156; H01L 2933/0066; H01L 2933/0041; H01L 2933/0016
See application file for complete search history.

(56) References Cited

U.S. PATENT DOCUMENTS 5,827,753 A 10/1998 Huang et al.
6,844,903 B2 1/2005 Mueller-Mach et al.
(Continued)

FOREIGN PATENT DOCUMENTS

CN 102751296 10/2012
JP 2002-141492 5/2002
(Continued)

OTHER PUBLICATIONS

Horng et al., "Performance of GaN-based Light-emitting Diodes Fabricated Using GaN Epilayers Grown on Silicon Substrates," Optics Express, 22(1):179-187.
(Continued)

*Primary Examiner* — Vinh T Lam
(74) *Attorney, Agent, or Firm* — Fish & Richardson P.C.

(57) ABSTRACT

Integrated light-emitting diode (LED) arrays based devices or systems and methods of forming the integrated LED arrays based devices or systems are provided. In one aspect, an integrated active-matrix LED display includes a silicon substrate including a first side and a second side, an array of active-matrix LED pixels formed on the first side, each LED pixel including at least one LED and at least one non-volatile memory coupled to the at least one LED, display drivers formed on the first side and coupled to the LED pixels, integrated circuits formed on the second side, and conductive electrodes penetrating through the silicon substrate and coupling the display drivers to the integrated circuits. The integrated circuits transmit image/video data to the display drivers via the conductive electrodes, and the display drivers select particular LED pixels and control the particular LED pixels to emit light based on the image/video data.

67 Claims, 34 Drawing Sheets

(51) Int. Cl.

| | | |
|---|---|---|
| *G06F 3/044* | (2006.01) | |
| *H01L 27/15* | (2006.01) | |
| *H01L 33/06* | (2010.01) | |
| *H01L 33/30* | (2010.01) | |
| *H01L 33/50* | (2010.01) | |
| *H01L 33/62* | (2010.01) | |
| *G09G 3/32* | (2016.01) | |
| *G09G 3/3233* | (2016.01) | |
| *G09G 3/3291* | (2016.01) | |

(52) U.S. Cl.
CPC ........... *G09G 3/2096* (2013.01); *G09G 3/32* (2013.01); *G09G 3/3233* (2013.01); *G09G 3/3291* (2013.01); *H01L 27/15* (2013.01); *H01L 27/156* (2013.01); *H01L 33/06* (2013.01); *H01L 33/30* (2013.01); *H01L 33/504* (2013.01); *H01L 33/62* (2013.01); *G06F 2203/04103* (2013.01); *G09G 2300/0408* (2013.01); *G09G 2300/0452* (2013.01); *G09G 2300/08* (2013.01); *G09G 2300/0842* (2013.01); *G09G 2300/0857* (2013.01); *G09G 2310/027* (2013.01); *G09G 2310/0267* (2013.01); *G09G 2310/0275* (2013.01); *G09G 2370/08* (2013.01); *H01L 2933/0016* (2013.01); *H01L 2933/0041* (2013.01); *H01L 2933/0066* (2013.01)

(56) References Cited

U.S. PATENT DOCUMENTS

| | | | |
|---|---|---|---|
| 7,248,310 B2 | 7/2007 | Mueller-Mach et al. | |
| 7,956,370 B2 | 6/2011 | Pan | |
| 8,642,363 B2 | 2/2014 | Lau et al. | |
| 8,674,383 B2 | 3/2014 | Pan | |
| 9,287,382 B1* | 3/2016 | Lee | H01L 21/845 |
| 9,423,535 B1 | 8/2016 | Hu et al. | |
| 9,905,602 B2 | 2/2018 | Takahashi et al. | |
| 2003/0025118 A1* | 2/2003 | Yamazaki | H01L 51/529 257/79 |
| 2003/0082889 A1* | 5/2003 | Maruyama | H01L 27/1214 438/455 |
| 2004/0238827 A1* | 12/2004 | Takayama | H01L 27/1214 257/79 |
| 2008/0116468 A1 | 5/2008 | Radkov et al. | |
| 2009/0032799 A1 | 2/2009 | Pan | |
| 2010/0308300 A1 | 12/2010 | Pan | |
| 2011/0177636 A1* | 7/2011 | Pan | H01L 33/24 438/28 |
| 2011/0193056 A1* | 8/2011 | Wang | H01L 24/32 |
| 2012/0146066 A1* | 6/2012 | Tischler | H01L 27/156 257/89 |
| 2012/0169682 A1 | 7/2012 | Kuhlman et al. | |
| 2012/0223875 A1 | 9/2012 | Lau et al. | |
| 2012/0241809 A1 | 9/2012 | Pan et al. | |
| 2014/0063393 A1* | 3/2014 | Zhong | G02F 1/13306 349/42 |
| 2014/0152619 A1* | 6/2014 | Hotelling | G09G 3/3648 345/174 |
| 2014/0225838 A1* | 8/2014 | Gupta | G06F 3/0412 345/173 |
| 2014/0264268 A1 | 9/2014 | Tseng et al. | |
| 2015/0070616 A1* | 3/2015 | Ogasawara | G02F 1/1339 349/43 |
| 2015/0072450 A1* | 3/2015 | Ei-Ghoroury | H01L 27/14618 438/23 |
| 2015/0091849 A1* | 4/2015 | Ludden | G06F 3/0412 345/174 |
| 2016/0163765 A1 | 6/2016 | Hu et al. | |
| 2016/0259368 A1* | 9/2016 | Bibl | G06F 3/0412 |
| 2016/0284652 A1 | 9/2016 | Kanaoka et al. | |
| 2016/0299395 A1* | 10/2016 | Kosuge | G02F 1/136209 |
| 2016/0313848 A1* | 10/2016 | Rhee | G06F 3/0412 |
| 2017/0069611 A1* | 3/2017 | Zhang | H01L 25/0753 |
| 2017/0123529 A1* | 5/2017 | Ho | G06F 3/044 |
| 2017/0185193 A1* | 6/2017 | Kim | G06F 3/0412 |
| 2017/0279019 A1* | 9/2017 | Ueda | H01L 33/62 |
| 2017/0352791 A1* | 12/2017 | Kang | H01L 33/58 |
| 2018/0114800 A1 | 4/2018 | Pan | |

FOREIGN PATENT DOCUMENTS

| | | |
|---|---|---|
| JP | 2007-005372 | 1/2007 |
| WO | WO 2013-105347 | 7/2013 |

OTHER PUBLICATIONS

Huang et al., "Static active-matrix OLED Display without Pixel Refresh Enabled by Amorphous-silicon Non-volatile Memory," Journal of the SID, 18/11, 2010, pp. 879-883.

Setlur, "Phosphors for LED-based Solid-State Lighting," The Electrochemical Society Interface, Winter 2009, pp. 32-36.

Singh et al., "Design and Fabrication of InGaN/GaN MQWs Blue LED on Sapphire Substrate for High Voltage Operation," IRACST—Engineering Science and Technology: An International Journal (ESTIJ), ISSN: 2250-3498, 5(4):299-301, Aug. 2015.

Authorized officer Sang Bum Chin, International Search Report and Written Opinion in PCT/US2017/056378, dated Mar. 6, 2018, 17 pages.

* cited by examiner

Crystalline Planes of Silicon
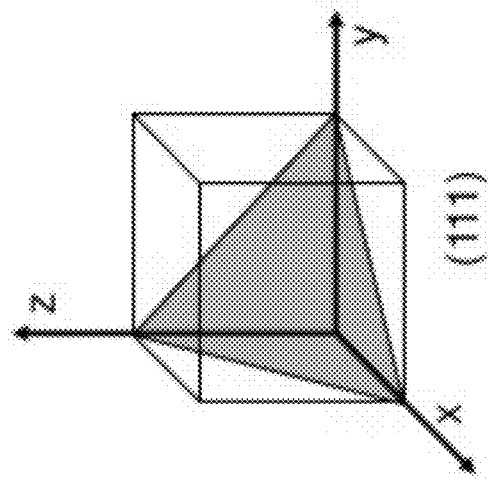
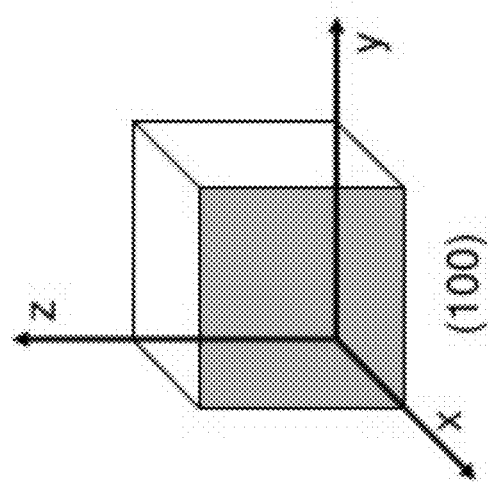
FIG. 1C

INTEGRATED LIGHT-EMITTING DIODE ARRAYS FOR DISPLAYS

TECHNICAL FIELD

This disclosure relates generally to display devices or systems, particularly to integrated light-emitting diode (LED) arrays for display devices or systems.

BACKGROUND

Displays utilizing arrays of light emitting pixels are popular in the electronic field and especially in portable electronic and communication devices, because large amounts of data and pictures can be transmitted rapidly and virtually to any location. Light emitting diode (LED) arrays are becoming more popular than liquid crystal displays (LCD) as an image source in both direct view and virtual image displays. One reason for this is that LEDs are capable of generating relatively high luminance, thus displays incorporating LED arrays can be used in a greater variety of ambient conditions.

Although LED arrays offer certain advantages, a major disadvantage is the complexity of their manufacturing process. In some cases, the arrays are manufactured by depositing materials on a supporting substrate and addressing/driver connections to row and column buses are made around the edges. Thus, the supporting substrate size is larger than the array size because of the necessary I/O pads or terminals. Providing very small contact pads in an effort to increase the array size greatly reduces the assembly yield. Another problem is that the driver circuitry for the LED arrays has a relatively high power consumption and adds a further manufacturing complexity.

SUMMARY

Described herein are integrated light-emitting diode (LED) array-based devices or systems and methods of making them.

One aspect of the present disclosure features a device including: a substrate including a first side and a second side; an array of light-emitting pixels formed on the first side, each pixel including at least one light-emitting element and at least one non-volatile memory coupled to the at least one light-emitting element; control electronics formed on the second side; and interconnects penetrating through the substrate and conductively coupling the array of pixels on the first side to the control electronics on the second side.

The foregoing and other embodiments can each optionally include one or more of the following features, alone or in combination. For instance, the non-volatile memory can include at least two transistors. The device can further include scanning drivers and data drivers, wherein each pixel is coupled to one of the scanning drivers through at least one word line and to one of the data drivers through at least one bit line.

In some implementations, the word lines and the bit lines are formed on the first side. The scanning drivers and the data drivers can be formed on the first side and coupled to the control electronics through the interconnects. A number of the interconnects can be smaller than a sum of a number of the scanning drivers and a number of the data drivers. In some examples, the scanning drivers and the data drivers are formed on the second side and coupled to the word lines and the bit lines through the interconnects, and the scanning drivers and the data drivers are conductively coupled to the control electronics on the second side.

In some implementations, the word lines and the bit lines are formed on the second side and coupled to the pixels through the interconnects, and the scanning drivers and the data drivers are formed on the second side and conductively coupled to the control electronics on the second side.

Each pixel can include at least three light-emitting elements operable to emit at least three different colors. Each of the at least three light-emitting elements can be coupled to a respective non-volatile memory in the pixel, and the respective non-volatile memory can be coupled to the one of the scanning drivers through a respective word line and the one of the data drivers through a respective bit line. In some examples, the at least three light-emitting elements include red, blue, and green light-emitting diodes (LEDs). In some examples, the at least three light-emitting elements include a white LED.

In some examples, the at least three light-emitting elements include one or more quantum well layers formed by Group III-V compounds. The at least three light-emitting elements can have the same quantum well layers configured to emit light with a first color, and at least one of the at least three light-emitting elements includes a phosphor material or a quantum-dot material configured to emit a second light having a color different from the first color.

The control electronics can include a controller configured to transmit a data signal to one or more particular data drivers and one or more particular scanning drivers, wherein the particular scanning drivers are configured to select one or more light-emitting pixels through corresponding word lines, and wherein the particular data drivers are configured to transmit a power signal based on the data signal through corresponding bit lines to the selected light-emitting pixels such that the selected light-emitting pixels emit light based on the power signal. In some examples, the control electronics includes a processor configured to process an image for display, the data signal being based on a result of processing the image.

The substrate can be a silicon semiconductor substrate. In some implementations, the silicon substrate has a first surface having a (111) orientation on the first side and a second surface having a (111) orientation on the second side and opposite to the first surface, and the light-emitting pixels are formed on the first surface, and the control electronics are formed on the second surface.

In some implementations, the silicon substrate has a first surface having a (111) orientation on the first side and a second surface having a (100) orientation on the second side, the first surface being not parallel to the second surface, and the light-emitting elements of the pixels are at least partially formed on the first surface, and the control electronics are formed on the second surface. In some examples, the first side includes an array of trenches defining a plurality of sub-surfaces each having a (111) orientation, the sub-surfaces including the first surface and being not parallel to the second surface, and the light-emitting elements of the pixels are at least partially formed on the sub-surfaces of the trenches. In some examples, the silicon substrate has a third surface having a (100) orientation on the first side and parallel to the second surface, and the non-volatile memories of the pixels are formed on the third surface.

In some implementations, the device further includes a protective layer covering the array of light-emitting pixels on the first side and coupled to the non-volatile memories in the light-emitting pixels, and the protective layer and the non-volatile memories form a touch screen position sensor operable to generate an electrical change in response to a touch on a spot of the protective layer. The control electronics can include a touch screen signal processor coupled to the non-volatile memories through the interconnects.

In some implementations, the control electronics includes one or more digital signal processors including at least one of: a digital signal analyzer, a digital processor, an image processor, a volatile memory, a non-volatile memory, or a touch screen processor. The control electronics can include one or more analog signal processors including at least one of: a light signal sensor, an electrical signal sensor, a sound signal sensor, a sound signal processor, an analog signal amplifier, an analog to digital converter (ADC), a digital to analog converter (DAC), or a touch screen signal processor.

Another aspect of the present disclosure features an integrated active-matrix light-emitting diode (LED) pixel display, including: a silicon semiconductor substrate including a first side and a second side; an array of active-matrix LED pixels formed on the first side, each LED pixel including at least one LED and at least one non-volatile memory coupled to the at least one LED; a plurality of display drivers formed on the first side and coupled to the LED pixels; one or more integrated circuits formed on the second side; and a plurality of conductive electrodes penetrating through the silicon substrate and coupling the display drivers on the first side to the one or more integrated circuits on the second side, wherein the one or more integrated circuits transmit image or video data to the display drivers via the conductive electrodes, and the display drivers select one or more particular LED pixels and control the particular LED pixels to emit light based on the image or video data.

The foregoing and other embodiments can each optionally include one or more of the following features, alone or in combination. For instance, the plurality of display drivers can include scanning drivers and data drivers formed on the first side, and each of the LED pixels cam be coupled to one of the scanning drivers through at least one word line and to one of the data drivers through at least one bit line, the word lines and the bit lines being formed on the first side. A number of the plurality of conductive electrodes can be no more than a number of the plurality of display drivers.

In some implementations, the one or more integrated circuits include a controller configured to transmit the image or video data to one or more particular data drivers and one or more particular scanning drivers, the particular scanning drivers are configured to select one or more light-emitting pixels through corresponding word lines, and the particular data drivers are configured to transmit a power signal based on the data signal through corresponding bit lines to the selected light-emitting pixels such that the selected light-emitting pixels emit light based on the power signal.

In some implementations, the silicon semiconductor substrate includes: a first surface along a (111) crystalline plane direction on the first side, the array of active-matrix LED pixels and the display drivers being formed on the first surface; and a second surface along the (111) crystalline plane direction on the second side, the second surface being opposite to the first surface, the one or more integrated circuits being formed on the second surface.

In some implementations, the silicon semiconductor substrate including a first surface along a (111) crystalline plane direction on the first side, the light-emitting elements of the pixels being at least partially formed on the first surface; a second surface along a (100) crystalline plane direction on the first side, the non-volatile memories of the pixels and the display drivers being formed on the second surface; and a third surface along the (100) crystalline plane direction on the second side, the one or more integrated circuits being formed on the third surface.

Each of the pixels can include at least three light-emitting elements operable to emit at least three different colors. The at least three light-emitting elements can include same quantum well layers formed by Group III-V compounds and configured to emit light with a first color, and at least one of the at least three light-emitting elements can include a phosphor material or a quantum-dot material configured to emit a second light different from the first color.

A third aspect of the present disclosure features a method of forming integrated light-emitting pixel arrays for display, including: preparing a substrate that has a first side and a second side; forming light-emitting pixel arrays on the first side, each pixel including at least one light-emitting element and at least one non-volatile memory coupled to the at least one light-emitting element; forming conductive interconnects through the substrate; and forming one or more integrated circuits on the second side, the interconnects conductively coupling the one or more integrated circuits to the light-emitting pixels.

The foregoing and other embodiments can each optionally include one or more of the following features, alone or in combination. For instance, forming light-emitting pixel arrays on the first side can include forming light-emitting diodes (LEDs) including one or more quantum well layers including Group III-V compounds.

In some implementations, the method further includes forming scanning drivers and data drivers on the first side; and forming word lines and bit lines on the first side, such that each pixel is coupled to one of the scanning drivers through at least one word line and to one of the data drivers through at least one bit line. The scanning drivers and the data drivers can be coupled to the one or more integrated circuits through the interconnects.

In some implementations, the method includes forming scanning drivers and data drivers on the second side, wherein the scanning drivers and the data drivers are conductively coupled to the one or more integrated circuits on the second side; and forming word lines and bit lines on the second side, wherein the pixels are coupled to the word lines and bit lines through the interconnects, such that each pixel is coupled to one of the scanning drivers through at least one word line and to one of the data drivers through at least one bit line.

The formed light-emitting elements can be configured to emit light with a first color. The method can further include: patterning by photoresist the first side to select particular light-emitting elements; depositing a phosphor film or a quantum-dot film on the selected light-emitting elements; and removing the photoresist to form light-emitting elements for emitting light with a second color different from the first color.

In some implementations, the substrate is a (111) silicon semiconductor substrate having a first surface on the first side and a second surface on the second side and opposite to the first surface, and the light-emitting elements and the non-volatile memories are formed on the first surface, and the one or more integrated circuits are formed on the second surface.

In some implementations, the substrate is a (100) silicon semiconductor substrate having a first surface along a (100) crystalline plane direction on the first side and a second surface along the (100) crystalline plane direction on the second side, the second surface being parallel to the first surface. Preparing a substrate can include etching the first side of the substrate to form a third surface having along a (111) crystalline plane, the third surface being not parallel to the first surface. In some examples, forming light-emitting pixel arrays on the first side includes: forming the light-emitting elements of the pixels on the third surface; and forming the non-volatile memories on the first surface. In some examples, forming one or more integrated circuits on the second side includes forming the one or more integrated circuits on the second surface.

A fourth aspect of the present disclosure features a method of displaying an image on an integrated display system formed on a substrate, the method including: receiving an instruction to display an image on the display system; analyzing, by a controller of the display system, the image to obtain image data, the controller being formed on a first side of the substrate; transmitting, by the controller, the image data to one or more display drivers formed on a second side of the substrate via conductive interconnects penetrating trough the substrate; selecting, by the display drivers, one or more light-emitting pixels of an array of light-emitting pixels formed on the second side of the substrate; and controlling, by the display drivers, the selected light-emitting pixels to emit light corresponding to the image data to display the image.

A fifth aspect of the present disclosure features a device including a substrate including a first side and a second side; an array of light-emitting elements formed on the first side; a plurality of non-volatile memories formed on the second side; a plurality of scanning drivers and data drivers on the second side; and interconnects penetrating through the substrate and conductively coupling the array of light-emitting elements on the first side to the plurality of non-volatile memories on the second side, wherein each of the light-emitting elements is coupled to a respective one of the plurality of non-volatile memories to form a corresponding active-matrix light-emitting pixel, wherein each of the active-matrix light-emitting pixels is coupled to one of the scanning drivers through at least one word line and one of the data drivers through at least one bit line, and wherein the word lines and the bits lines are formed on the second side.

The foregoing and other embodiments can each optionally include one or more of the following features, alone or in combination. In some implementations, the substrate is a (111) silicon semiconductor substrate having a first surface on the first side and a second surface on the second side and opposite to the first surface, and the light-emitting elements can be formed on the first surface and the non-volatile memories are formed on the second surface. In some implementations, the substrate is a silicon semiconductor substrate including a first surface having a (111) orientation on the first side and a second surface having a (100) orientation on the second side, the first surface being not parallel to the second surface, and the light-emitting elements of the pixels can be at least partially formed on the first surface, and the non-volatile memories can be formed on the second surface.

A sixth aspect of the present disclosure features an integrated light-emitting diode (LED) display device, including: a silicon substrate including a first side and a second side; an array of light-emitting pixels formed on the first side, each pixel including at least one light-emitting diode (LED) and at least one non-volatile memory; a plurality of scanning drivers and a plurality of data drivers formed on the first side, wherein each pixel is coupled to a corresponding scanning driver through at least one word line and to a corresponding data driver through at least one data line, the word lines and the data lines being conductive metal lines; one or more digital signal processors and one or more analog signal processors formed on the second side; and a plurality of conductive electrodes penetrating through the silicon substrate and between the first side and the second side, the conductive electrodes coupling the plurality of scanning drivers and the plurality of data drivers on the first side to the digital signal processors on the second side to form the integrated LED display device.

The foregoing and other embodiments can each optionally include one or more of the following features, alone or in combination. For instance, the integrated LED display device can be configured to display static or dynamic images or videos with multiple colors. Each pixel can include at least an III-V compound based LED operable to emitting a blue color. Each pixel can include at least one secondary light emitting material configured to change a primary color emitted by the LED in the pixel, and the secondary light emitting material can include at least one of a different color phosphor material or a different size quantum dot material. Each pixel can include at least three LEDs for emitting three primary colors, and where the three primary colors include red, blue, and green. Each non-volatile memory can include at least two transistors. An emitting surface of the LEDs can be not parallel to a surface of the silicon substrate.

In some implementations, the digital signal processors include at least one of: a digital signal analyzer, a digital processor, an image processor, a volatile memory, a non-volatile memory, or a touch screen signal processor. In some implementations, the analog signal processors include at least one of: a light signal sensor, an electrical signal sensor, a sound signal sensor, a sound signal processor, an analog signal amplifier, an analog to digital converter (ADC), a digital to analog converter (DAC), or a touch screen signal processor, or any other associated electronic components.

The integrated LED display device can further include a transparent protective layer on the first side and configured to cover the light-emitting pixels, and the transparent protective layer and the non-volatile memories underneath in the light-emitting pixels can form a touch screen position sensor.

A seventh aspect of the present disclosure features a method of fabricating an integrate LED pixel display device, including: forming an array of silicon surfaces parallel to a (111) crystalline plane on a first side of a silicon substrate; epitaxially growing an array of LEDs on the (111) silicon surfaces by at least one of metal-organic chemical vapor deposition (MOCVD), molecular beam epitaxy (MBE), or atomic layer deposition (ALD); forming, for each LED pixel, at least one non-volatile memory adjacent to each of the LEDs in the LED pixel on the first side of the silicon substrate; forming a plurality of row scanning drivers and a plurality of column data drivers on the first side of the silicon substrate; forming row metal connection lines and column metal connection lines on the first side of the silicon substrate, wherein each of the LEDs is connected to a corresponding non-volatile memory that is connected to one of the scanning drivers through at least one row metal connection line and to one of the data drivers through at least one column line; forming conductive electrodes connecting the first side and a second side of the silicon substrate by: dry etching the silicon substrate from the second side to form through-holes in the silicon substrate, insulating inner surfaces of the through-holes, and filling metal in the through-holes; forming control electronics on the second side of the silicon substrate, wherein the control electronics includes at least one of: a controller, a data processor, an image processor, a signal amplifier, an analog to digital converter (ADC), a digital to analog converter (DAC), a memory, or a signal sensor; forming an array of secondary light emitting elements on surfaces of the formed LEDs by using different color phosphor materials or different size quantum dots materials, such that the array of LEDs is operable to emit at least three colors including red, blue, and green; and then forming a transparent protective layer on the array of the LEDs, wherein the transparent protective layer is configured to form, together with the non-volatile memories under the transparent protective layer, a capacitive touch screen position sensor.

An eighth aspect of the present disclosure features a device including a substrate including a first side and a second side; an array of light-emitting pixels formed on the first side, each pixel including at least one light-emitting element; one or more display drivers formed on the first side and coupled to the array of light-emitting pixels; one or more integrated circuits formed on the second side; and interconnects penetrating through the substrate and conductively coupling the control electronics on the second side to the one or more display drivers.

The foregoing and other embodiments can each optionally include one or more of the following features, alone or in combination. For instance, the display drivers can include scanning drivers and data drivers, and each pixel can be coupled to one of the scanning drivers through at least one word line and to one of the data drivers through at least one bit line, and the word lines and the bit lines are formed on the first side.

In some implementations, the control electronics includes a controller configured to transmit a data signal to one or more particular data drivers and one or more particular scanning drivers, the particular scanning drivers are configured to select one or more light-emitting pixels through corresponding word lines, and the particular data drivers are configured to transmit a power signal based on the data signal through corresponding bit lines to the selected light-emitting pixels such that the selected light-emitting pixels emit light based on the power signal. The control electronics can include a processor configured to process an image for display, the data signal being based on a result of processing the image.

Each pixel can include at least three light-emitting elements operable to emit at least three different colors. The at least three light-emitting elements can include red, blue, and green light-emitting diodes (LEDs). The at least three light-emitting elements can include a white LED. The at least three light-emitting elements can include one or more quantum well layers formed by Group III-V compounds.

In some examples, the at least three light-emitting elements have the same quantum well layers configured to emit light with a first color, and at least one of the at least three light-emitting elements can include a phosphor material or a quantum-dot material configured to emit a second light having a color different from the first color.

The substrate can be a silicon semiconductor substrate. In some implementations, the silicon substrate has a first surface having a (111) orientation on the first side and a second surface having a (111) orientation on the second side and opposite to the first surface, and the light-emitting pixels and the display drivers can be formed on the first surface, and the control electronics are formed on the second surface.

In some implementations, the silicon substrate has a first surface having a (111) orientation on the first side and a second surface having a (100) orientation on the second side, the first surface being not parallel to the second surface, and the light-emitting elements of the pixels are at least partially formed on the first surface, and the control electronics are formed on the second surface. The first side can include an array of trenches defining a plurality of sub-surfaces each having a (111) orientation, the sub-surfaces including the first surface and being not parallel to the second surface, and the light-emitting elements of the pixels can be at least partially formed on the sub-surfaces of the trenches. The silicon substrate can have a third surface having a (100) orientation on the first side and parallel to the second surface, and the display drivers can be formed on the third surface.

In some implementations, the control electronics includes: one or more digital signal processors including at least one of: a digital signal analyzer, a digital processor, an image processor, a volatile memory, a non-volatile memory, or a touch screen processor; and one or more analog signal processors including at least one of: a light signal sensor, an electrical signal sensor, a sound signal sensor, a sound signal processor, an analog signal amplifier, an analog to digital converter (ADC), a digital to analog converter (DAC), or a touch screen signal processor.

Particular embodiments of the subject matter described in this specification can be implemented so as to realize one or more of the following advantages. Light-emitting pixel arrays, e.g., LED pixel arrays, are placed on one side of a substrate and are integrated with control electronics on the other side of the substrate and conductive interconnects through the substrate couple the control electronics to the pixel arrays. Accordingly, semiconductor based LED arrays are integrated with display control electronics on a silicon substrate, enabling the use of standard semiconductor IC (integrated circuit) manufacturing equipment, facilities, and processes, resulting in reduced cost. Moreover, integrated LED arrays on a silicon substrate enables fabrication of a ultra-high resolution display, e.g., 100 μm per pixel, and/or micro-LED (μ-LED) displays with extremely high efficiency to save energy.

The technology can use one or more quantum well layers of Group III-V compounds (e.g., GaN) as light emissive layers, which makes the LED arrays more energy efficient and more stable than OLED (organic LED) based arrays. The technology can also use phosphor materials or quantum-dot materials deposited on the III-V compound based LED arrays to produce multi-color displays. The technology can also integrate non-volatile memories, e.g., SRAM (static random-access memory), with the LEDs to form active-matrix LED pixels, enabling higher efficiency and faster response time than passive-matrix LED pixels. Furthermore, the technology allows integrating other components e.g., processors, memories, drivers, microcontrollers, sensors, timers, touch screen detectors, and/or amplifiers on the side of the silicon substrate opposite the pixel array, which greatly simplifies processing, achieves seamless integration and reduces cost.

The integrated LED array-based display systems, particularly micro-display systems, can achieve low power consumption (e.g., one order of magnitude lower than current display devices), high resolution (e.g., 1080p), a thin device thickness (e.g., no more than 1 mm), a large view angle (e.g., no less than 160 degrees), a high luminance contrast modulation (e.g., 100%), and/or low cost due to integration on a single substrate. These LED arrays can be widely used in many applications, including portable electronic and communication devices, such as wearable devices (e.g., eyeglasses, watches, clothes, bracelets, rings), virtual reality (VR)/augmented reality (AR) displays, or any lighting applications.

The details of one or more disclosed implementations of the subject matter described in this specification are set forth in the accompanying drawings and the description below. Other features, aspects, and advantages will become apparent from the description, the drawings and the claims.

BRIEF DESCRIPTION OF THE DRAWINGS

FIG. 1C is a schematic diagram of example crystalline planes of a silicon semiconductor substrate.

FIGS. 7A-7J are perspective views at different steps of forming the integrated LED display system of FIGS. 6A-6B.

DETAILED DESCRIPTIONS

The following descriptions are example display devices or systems that include integrated light-emitting diode (LED) arrays and control electronics on silicon substrates. However, the disclosed implementations can be adopted to any suitable system that needs integration of two separate components, e.g., light-emitting pixel arrays and control electronics, on a single substrate. For example, the substrate can be made of any suitable material, e.g., silicon, silicon oxide, silicon carbide, gallium nitride, sapphire, glass, or spinel. The substrate can also be formed by a double-layer structure such as a silicon layer on glass, or a silicon-on-insulator (SOI) substrate. The light-emitting pixels can include any suitable light sources, e.g., semiconductor based LED pixels, OLED pixels, or laser diodes.

Example Display System

Figure 1A:
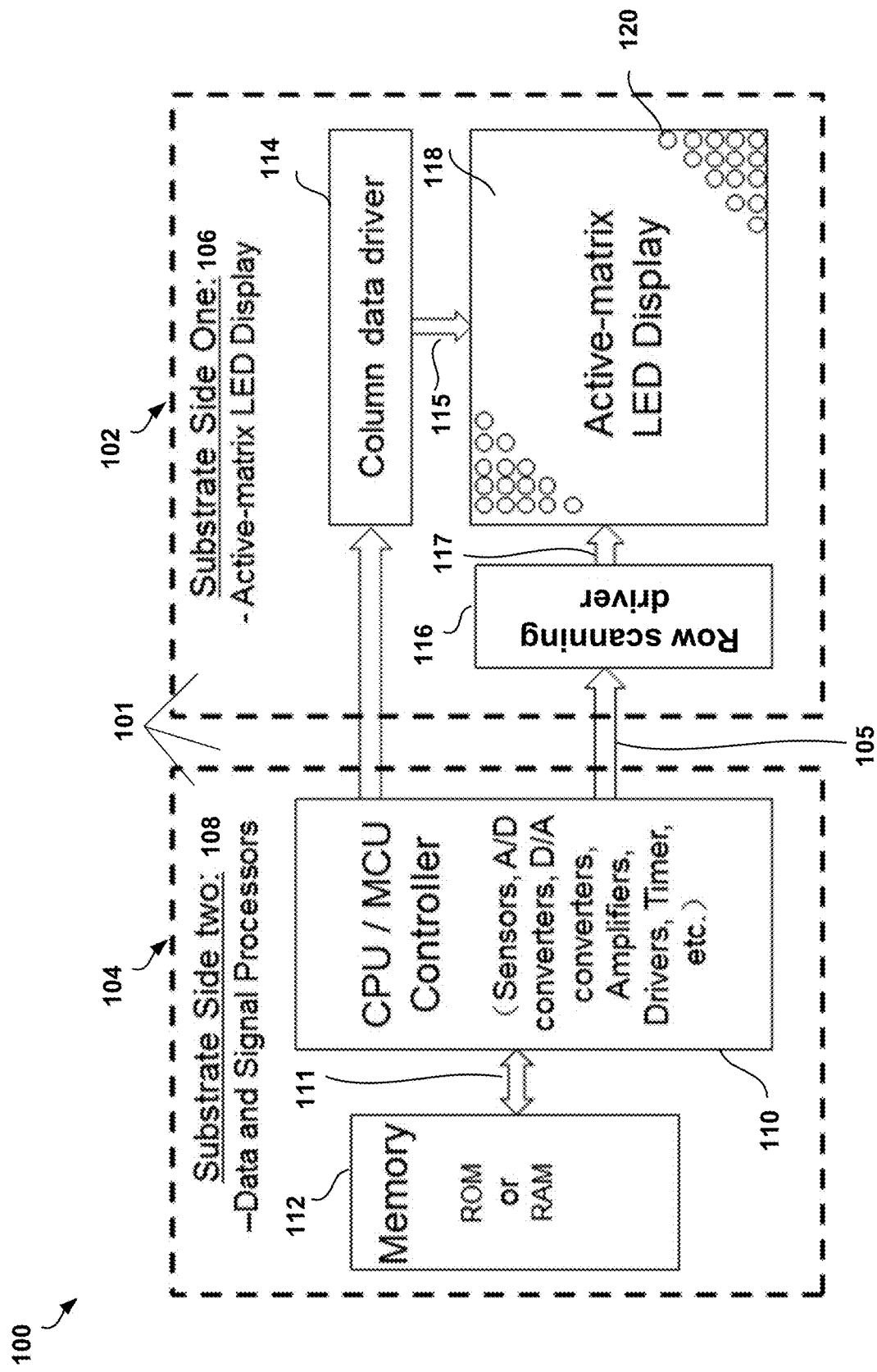
FIG. 1A is a schematic diagram of an example LED display system integrated on two sides of a substrate.

FIG. 1A is a schematic diagram of an example LED display system 100. The system 100 includes an LED display 102 formed on one side 106 of a substrate 101 and control electronics 104 formed on the other side 108 of the substrate 101. The substrate 101 can be a silicon substrate, e.g., a silicon wafer. The LED display 102 is coupled to the control electronics 104 via conductive interconnects 105, e.g., electrodes. The conductive interconnects 105 can penetrate through the substrate, e.g., via through-holes, and conductively couple the LED display 102 on the side 106 to the control electronics 104 on the other side 108.

In some implementations, the control electronics 104 includes one or more processors and/or controllers 110, e.g., a central processing unit (CPU), a microcontroller unit (MCU), and/or integrated circuits (ICs), e.g., sensors, analog/digital converters (ADCs), digital/analog converters (DACs), amplifiers, drivers, and/or timers. The control electronics 104 can also include a memory 112, e.g., a read-only memory (ROM) and/or a random-access memory (RAM). The processors and/or controllers 110 can be coupled to the memory 112 via connections 111, e.g., internal bus, conductive electrodes, wired connections, or wireless connections. The processors and/or controllers 110 are configured to read data from or store data into the memory 112. For example, the processors and/or controllers 110 can receive image or video data to be displayed, e.g., from external network or devices, process the image or video data, and/or store the processed image or video data in the memory 112. The memory 112 can also store instructions to cause the processors and/or controllers 110 to execute operations. Components of the control electronics 104 can be monolithically manufactured on the side 108 of the substrate 101.

The LED display 102 on the side 106 can be an active-matrix LED display including an array 118 of active-matrix LED pixels 120. Each LED pixel is coupled to a data driver 114 via at least one bit line 115 and a scanning driver (or scanning controller) 116 via at least one word line 117. The scanning driver 116 is configured to select an LED pixel through the word line 117 and the data driver 114 transmits a data signal to the selected LED pixel through the bit line 115. The array 118 of LED pixels may be coupled to a plurality of data drivers 114 and a plurality of scanning drivers 116. In some implementations, the data drivers 114 and the scanning drivers 116 are formed on the same side as the array 118 of the LED pixels 120, i.e., the side 106 of the substrate 101, as illustrated in FIG. 1A. The bit lines 115 and the word lines 117 can also be formed on the side 106 of the substrate 101. The data drivers 114 and the scanning drivers 116 are connected to the control electronics 104, e.g., the processors and/or controllers 110, through the conductive interconnects 105, and configured to receive instructions and/or data signals from the control electronics 104. In some examples, as described with further details in FIG. 3, the LED display system 100 can be used to display static or dynamic images/videos. The images/videos can have multiple colors.

In some implementations, the control electronics 104 includes one or more digital signal processors including: a digital signal analyzer, a digital processor, an image processor, a volatile memory, a non-volatile memory, and/or a touch screen processor. The control electronics 104 can also include one or more analog signal processors including a light signal sensor, an electrical signal sensor, a sound signal sensor, a sound signal processor, an analog signal amplifier, an ADC, a DAC, a touch screen signal processor, and/or any other associated electronic components. The analog signal processors are connected to and communicate with the digital signal processors through an ADC and/or a DAC (not shown). The digital signal processors are connected to the data drivers 114 and the scanning drivers 116 through the interconnects 105. In operation, the analog signal processors can receive and process image or video signals from external devices or network or from the internal memory 112. The image or video signals may be analog signals which can be processed and converted into digital signals by an ADC. The digital signals are further processed and analyzed by the digital signal processors. Then the processed digital data can be further transmitted from the digital signal processors to particular data drivers 114 and scanning drivers 116 which then select particular LEDs and control the selected LEDs for display.

Figure 1B:
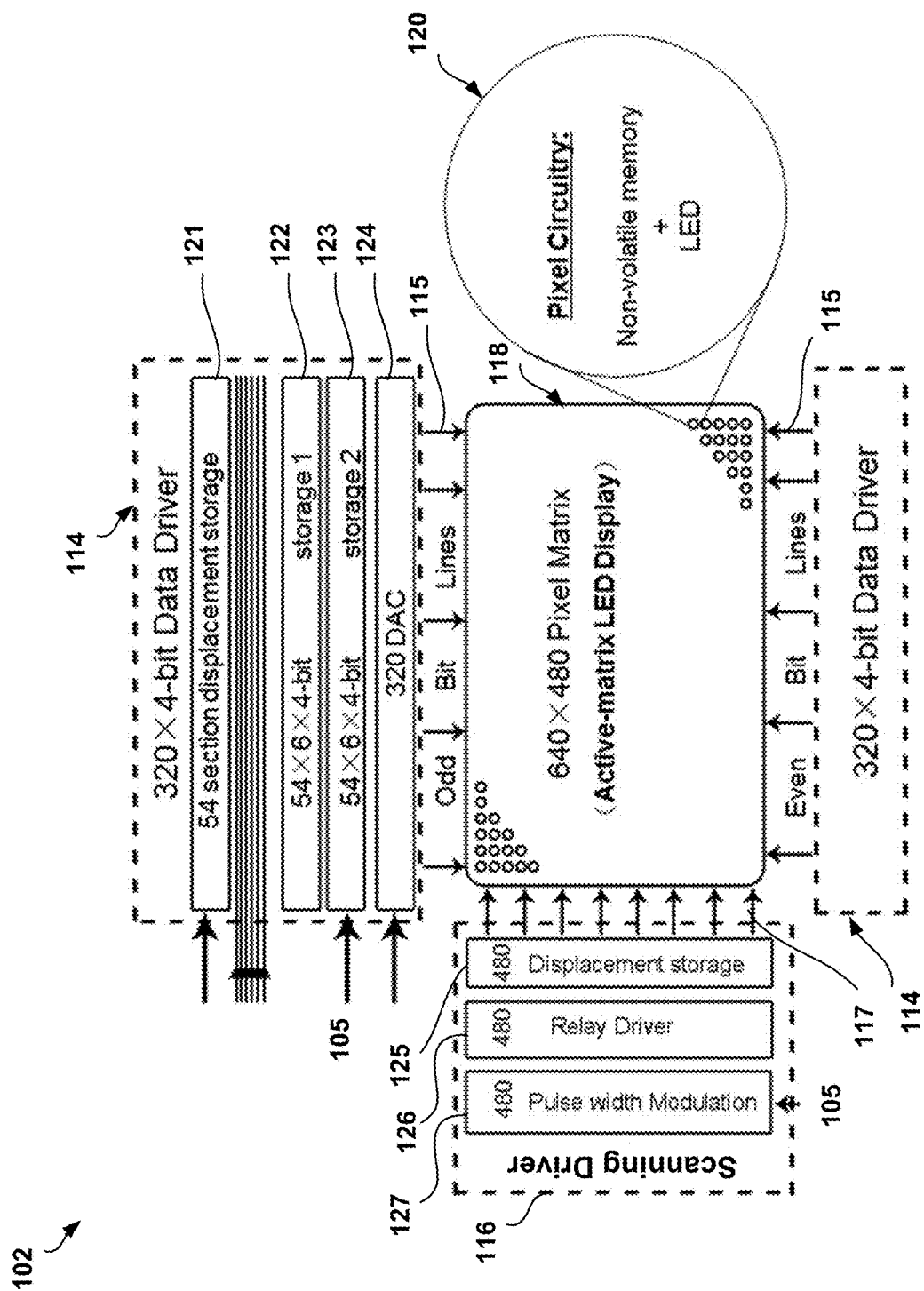
FIG. 1B is a schematic diagram of one side of the substrate of FIG. 1A including active-matrix LED pixel arrays.
Figure 2A:
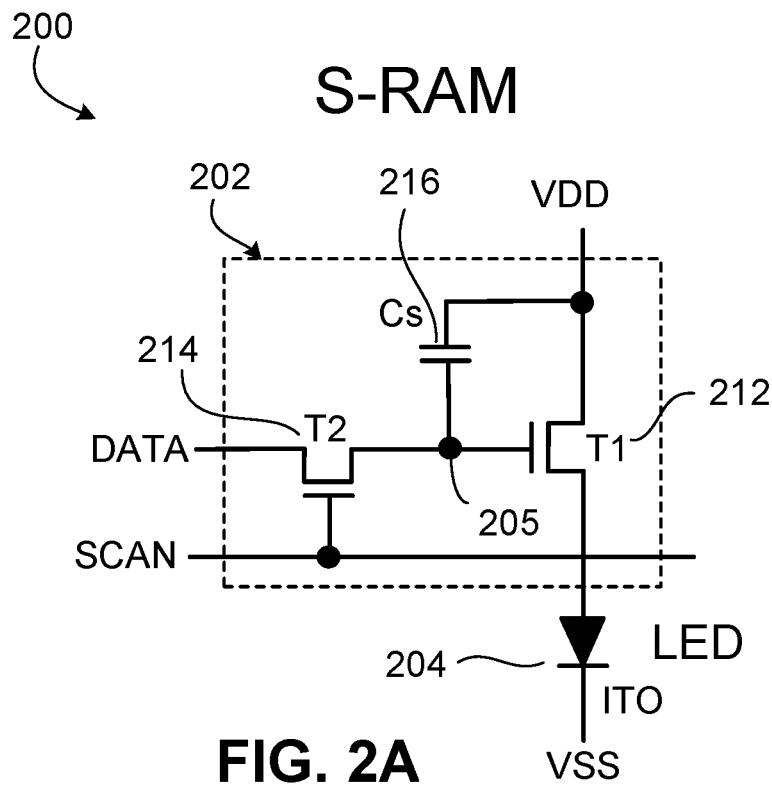
FIGS. 2A-2B are schematic diagrams of example active-matrix LED pixels.
Figure 2B:
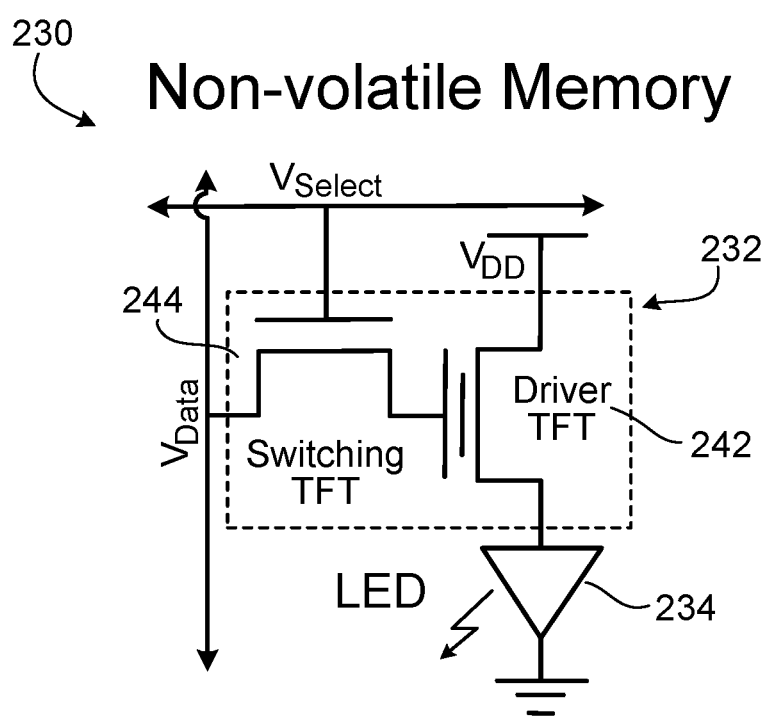

FIG. 1B shows an example implementation of the active-matrix LED display 102 on the side 106 of the substrate 101 of FIG. 1A. The LED pixel array 118 is composed of 640 (columns)×480 (rows) pixel matrix arranged in columns and rows, respectively. Each pixel 120 is an active-matrix LED pixel. As illustrated in FIGS. 2A-2B below, an active-matrix LED pixel includes at least one LED and at least one non-volatile memory coupled to the at least one LED. Upon receiving the data instructions from the scanning driver 116 and/or the data driver 114, the non-voltage memory can enable each pixel to operate continuously and independently without waiting for the next instruction coming after a full scan.

In some examples, an LED pixel includes a plurality of LEDs, e.g., blue, red, and green LEDs, and a plurality of corresponding non-volatile memories. Each LED is coupled to a respective non-volatile memory. In some examples, one LED pixel includes three LEDs and one non-volatile memory coupled to the three LEDs. In some examples, the LED pixel includes a white LED. In some examples, the LED pixel includes four LEDs including three LEDs emitting basic light such as red, blue, and green, and a white LED emitting white light.

The scanning driver 116 can include 480 displacement storages 125, 480 relay drivers 126, and 480 pulse width modulators 127. Each row of LED pixels is coupled to a respective displacement storage 125, a respective relay driver 126, and a respective pulse width modulator 127 through a respective word line (or scanning line) 117. The scanning driver 116 can receive instructions from the control electronics 104, e.g., the processors/controllers 110, through the interconnects 105, and select one or more particular LED pixels based on those instructions.

In some implementations, the data driver is divided into two sub-drivers 114 positioned on top and bottom of the array 118 of LED pixels, respectively. Each sub-driver 114 can be a 320×4-bit data driver and include 54 section displacement storage 121, 54×6×4-bit storages 122 and 123, and/or 320 digital-to-analog converters (DACs) 124. Each sub-driver 114 is coupled to 320 columns of LED pixels through respective column bit lines. Particularly, the top sub-driver 114 is coupled to 320 columns of LED pixels through odd column bit lines, and the bottom sub-driver 114 is coupled to another 320 columns of LED pixels through even column bit lines. An intersection of an individual bit line 115 and an individual word line 117 is coupled to a respective LED pixel. That is, selecting the individual bit line 115 and the individual word line 117 can uniquely select the respective LED pixel. The sub-data driver 114 can receive instructions and/or data from the control electronics 104, e.g., the processors/controllers 110, through the interconnects 105, and select one or more particular LED pixels with the scanning driver 116 based on the instructions and/or data and transmit data to the selected particular LED pixels through respective bit lines 115.

In some implementations, the active-matrix LED display 102, e.g., at least the active-matrix LED pixel array 118, is covered by a protective layer (not shown). The protective layer can be transparent. In some examples, the protective layer is made of glass coated with a conductive material like indium tin oxide (ITO). The protective layer defines an array of spots corresponding to the array of LEDs. Each spot covers an LED underneath and is coupled to a corresponding non-volatile memory coupled to the LED. The spot and the surface of the LED may form a capacitor, and/or one or more additional capacitors may be formed between the spot and the LED. When the spot is touched, e.g., by a fingertip on top of the spot or moving towards the spot, a capacitance of the capacitors can change. The capacitance change can be detected by a touch screen detector/processor in the control electronics 104 and formed on the other side 108 through the non-volatile memory, a corresponding data driver 114/scanning driver 116 coupled to the non-volatile memory, and corresponding interconnects 105. Thus, the protective layer, the LED array, and the corresponding non-volatile memories can form a touch screen position sensor, which, together with the touch screen detector/processor in the control electronics 104, enables the LED display 102 to function as a touch screen display. Additional implementations of the touch screen sensor on the LEDs are also possible, e.g., using other technologies like resistive sensing, surface acoustic wave, infrared grid, infrared acrylic projection acoustic pulse recognition, or dispersive signal technology.

FIG. 1C shows example crystalline planes of a silicon semiconductor substrate, e.g., a silicon wafer. Orientations of the silicon wafer are classified using Miller indices. These indices include such descriptions as (100) and (111), as illustrated in FIG. 1C.

Example Active Matrix LED Pixels

FIG. 2A shows an example active-matrix LED pixel 200 with non-volatile memory. The LED pixel 200 includes an S-RAM (static-random access memory) 202 and an LED 204. The S-RAM 202 includes a driver transistor (T1) 212, a switching transistor (T2) 214, and a storage capacitor (Cs) 216. During display operation, a word line (scanning line or select line) can be pulled high to allow a voltage on a bit line to propagate through the switching transistor 214 to a storage node 205, charging the storage capacitor 216 and setting a high voltage on a gate of the driver transistor 212. This allows a current to pass through the driver transistor 212 and the LED 204 is consequently lighted.

FIG. 2B shows another example active-matrix LED pixel 230 with non-volatile memory 232 and an LED 234. The non-volatile memory 232 includes a driver transistor 242 and a switching transistor 244, that can be thin-film transistors (TFTs). In some implementations, different from the LED pixel 200 in FIG. 2A, the brightness of the LED 234 is not controlled by varying $V_{Data}$ applied to a gate of the driver transistor 242 through the switching transistor 244. Instead, a constant $V_{Data}$ is applied to the gate of the driver transistor 242. The current through the driver transistor that causes the LED 234 to illuminate is controlled by changing a threshold voltage $V_T$ of the driver transistor 242, e.g., through programming. If low brightness is desired, the driver transistor 242 can be set to a high threshold voltage by programming with a large positive gate pulse. If high brightness is desired, the driver transistor 242 can be set to a low threshold voltage by programming with a small positive gate pulse, or not programming at all, the leaving it with the initial threshold voltage. Thus, an image or video can be displayed by controlling the brightness or on/off status of the LEDs of an array.

Figure 2C:
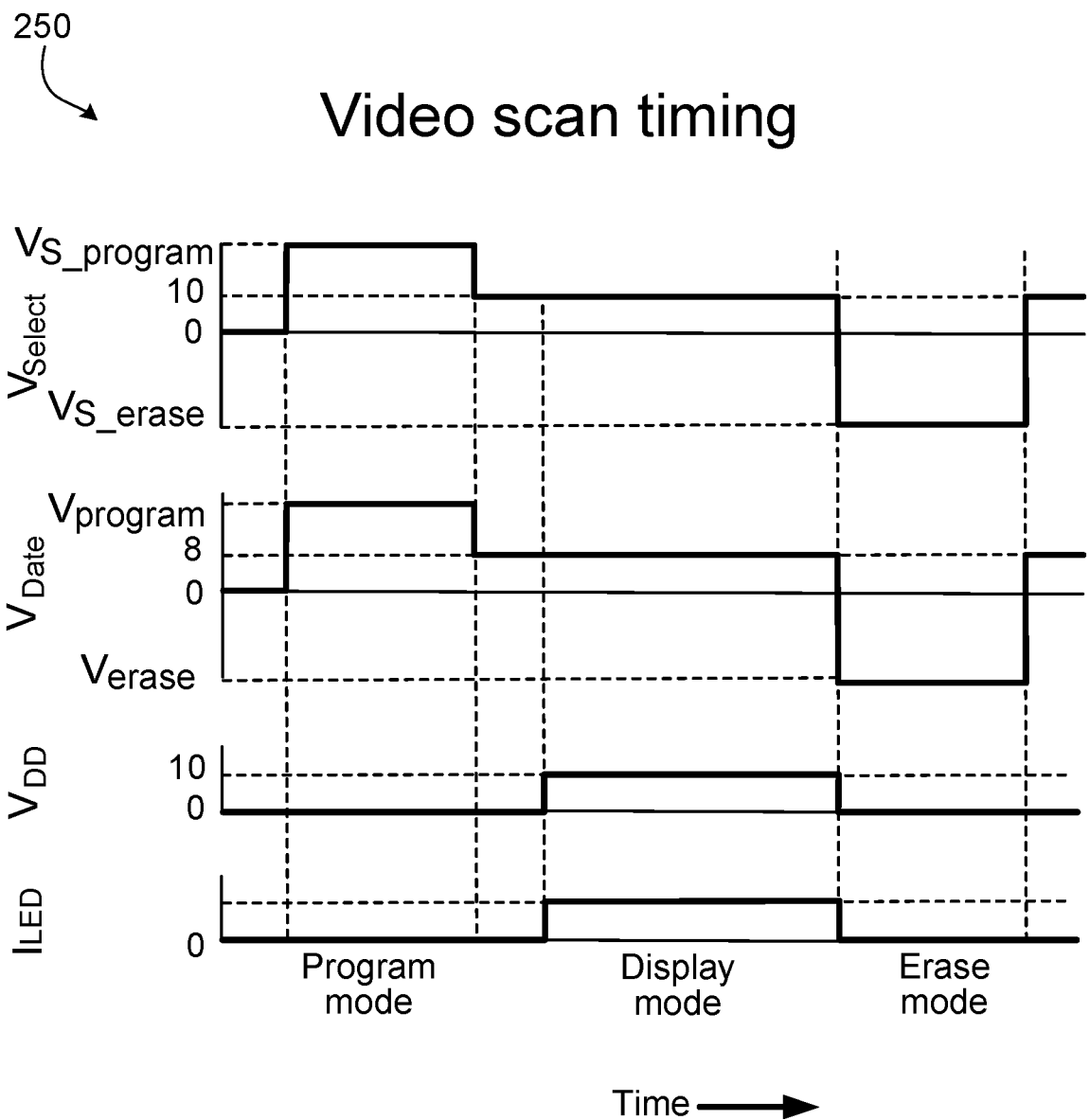
FIG. 2C shows an example timing diagram using active-matrix LED pixels for a video display.

FIG. 2C shows an example video scan timing 250 of a display using the active-matrix LED pixel 230 of FIG. 2B. After programming (i.e., programming mode), the display is activated by setting a supply voltage $V_{DD}$ to 10 V, $V_{Data}$ to 8 V on all the bit lines, and $V_{select}$ to 10 V on all the word lines (select lines). The LED current and therefore brightness of the pixel 230 is determined by the programmed threshold voltage of the driver transistor 242. Both $V_{Data}$ and $V_{select}$ are DC voltages in the display mode because a pixel refresh is not necessary to maintain a static image. The image information remains stored in the threshold voltage of the driver transistor 242 even if the power is turned off. To change the programmed image, the pixels can be first erased and then reprogrammed. Erase mode in FIG. 2C is identical to the program operation. The only difference is that the applied voltage pulse has a larger negative amplitude, instead of a positive one. This negative voltage forces the trapped electrons in the driver transistor 242 to tunnel back out, causing the threshold voltage to shift towards its original un-programmed value. For example, to erase a single pixel in the active matrix (instead of an entire column), all other select lines can be held at −30 V to prevent the erase pulse from propagating to the undesired pixel drivers.

Example Displaying Process

Figure 3:
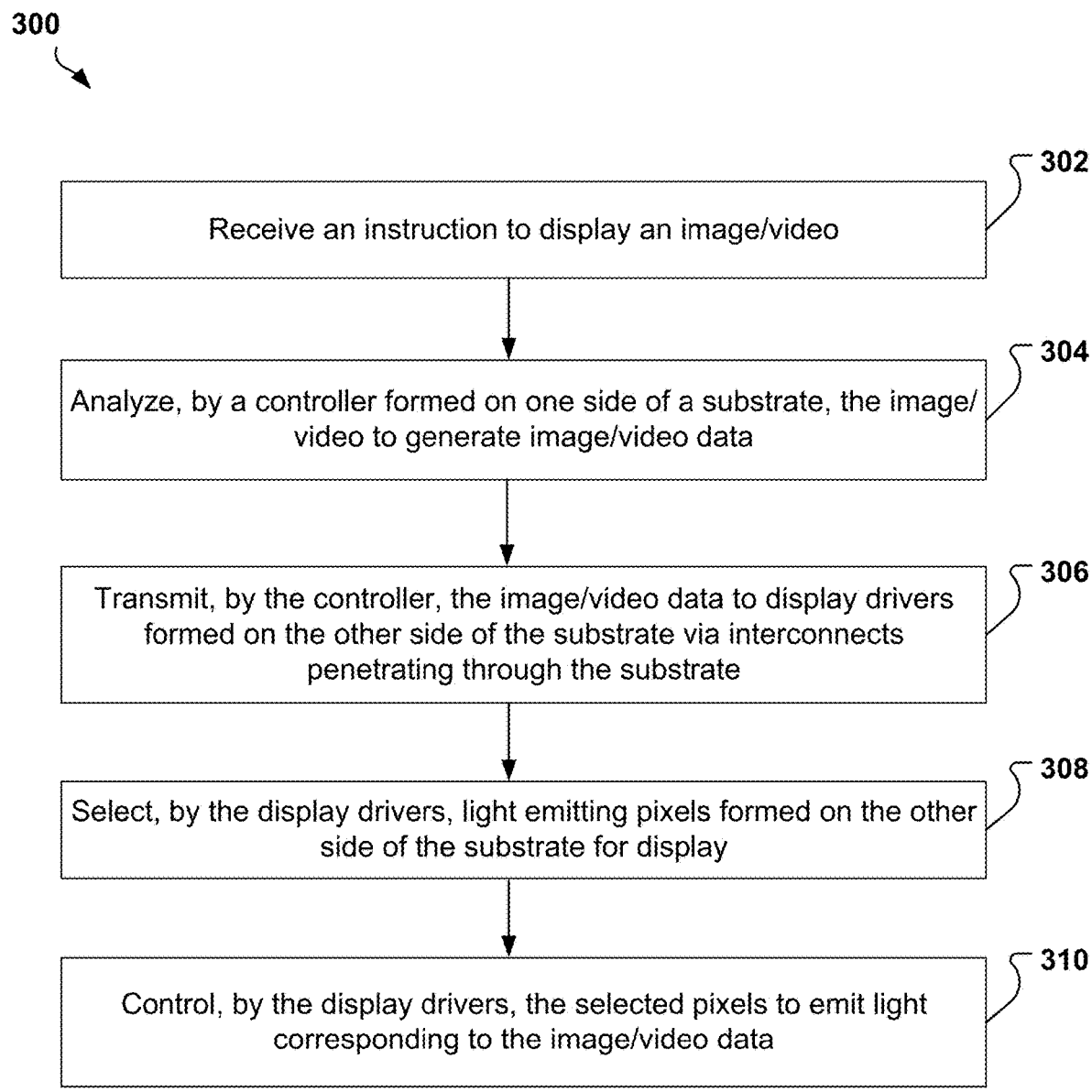
FIG. 3 is a flow diagram of an example process of displaying an image/video on an integrated LED display system.

FIG. 3 shows an example process 300 of displaying an image/video on an integrated display system. The integrated display system can be the integrated display system 100 of FIG. 1A or any other display system according to the present disclosure. Components of the display system are formed on a substrate, e.g., a silicon substrate. The image can be static or dynamic. The video can be considered as a series of sequential images, and pixels of the display systems can be refreshed to display a next image to replace a previous image.

An instruction is received to display an image/video (302). The display system can receive the instruction from an external device or network. In some cases, the image/video is received from the external device or network. In some cases, the image/video is stored in a memory in the display system. The memory can be the memory 112 formed on a first side of the substrate.

The image/video is analyzed by a controller of the display system to obtain image/video data (304). The controller can be the processors/controllers 110 of FIG. 1A. The controller is formed on a side of the substrate, e.g., on the first side with the memory. The controller can analyze the image/video to generate the image/video data. In some cases, the image/video data is stored in the memory. The controller can retrieve the stored image/video data based on the received instruction.

The image/video data is transmitted by the controller to one or more display drivers of the display system (306). The display drivers are formed on a second, different side of the substrate and coupled to the controller via conductive interconnects penetrating through the substrate. The second side can be opposite to the first side. In some examples, the controller selects the display drivers based on a result of analyzing the image/video and transmits the image/video data to the selected display drivers. The display drivers can include at least one scanning driver, e.g., the scanning driver 116 of FIG. 1A, and at least one data driver, e.g., the data driver 114 of FIG. 1A.

One or more light-emitting pixels of an array of light-emitting pixels are selected by the display drivers (308). The array of light-emitting pixels are formed on the second side of the substrate. The light-emitting pixels can be active-matrix pixels including non-volatile memories. Each light-emitting pixel is coupled to a display driver through connection lines. In some examples, each light-emitting pixel is coupled to a scanning driver through at least one word line and a data driver through at least one bit line. The scanning driver is configured to select a light-emitting pixel with the data driver, and the data driver is configured to transmit a data signal to the selected light-emitting pixel.

The selected light-emitting pixels are controlled by the display drivers to emit light corresponding to the image/video data (310). The image/video data can be transmitted to the selected light-emitting pixels by the display drivers, e.g., via a voltage applied on the connection lines such as bit lines. As noted above in FIGS. 2A-2C, by controlling the voltage applied on the connection lines or a threshold voltage of a transistor in an active-matrix pixel, the selected light-emitting pixels can be controlled to emit light with brightness corresponding to the image/video data, thus to display the image/video.

Example Integrated LED Displays and Fabrication Processes

Figure 4A:
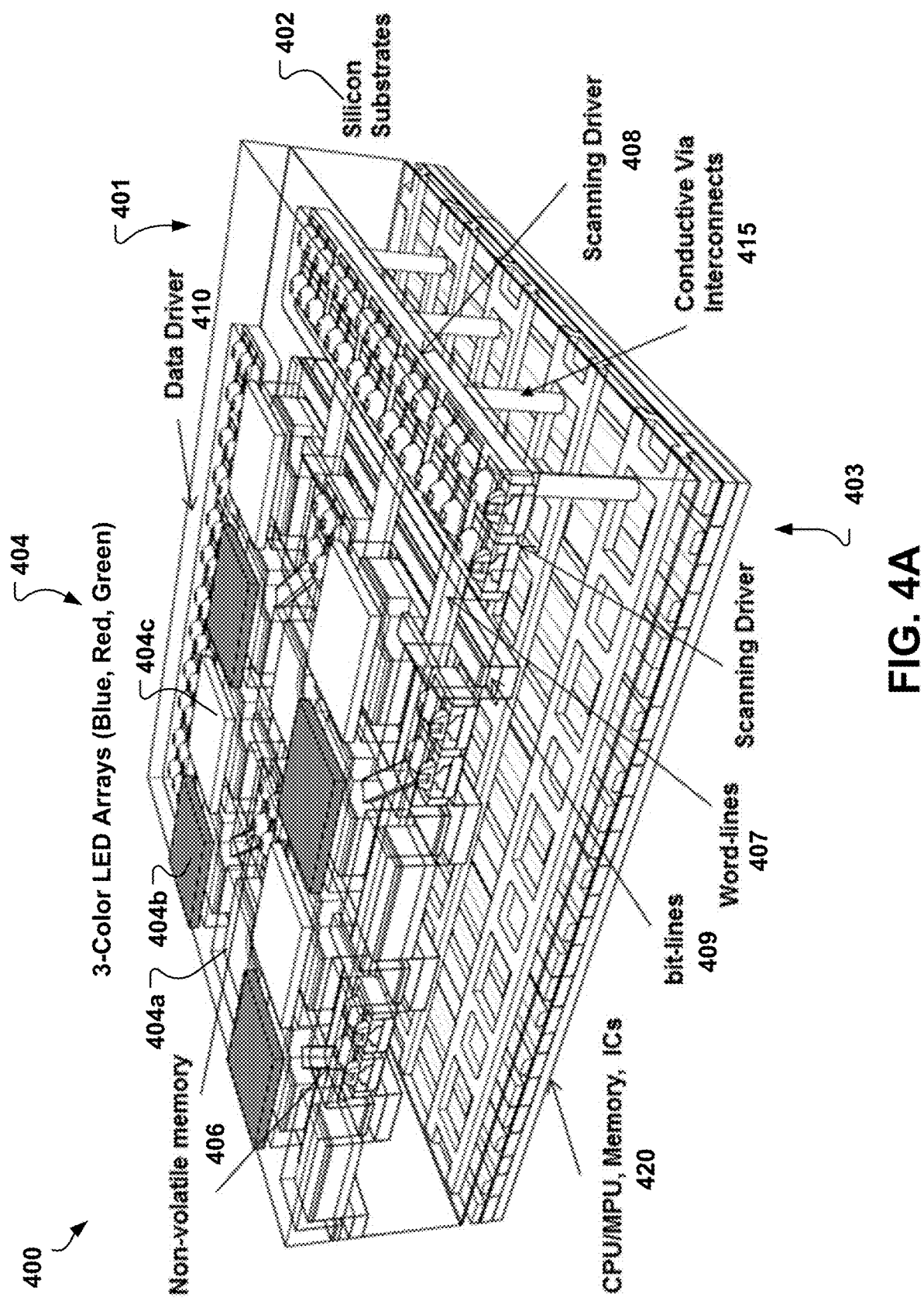
FIG. 4A is a perspective view of an example integrated LED display system with multi-color LED pixel arrays.
Figure 4B:
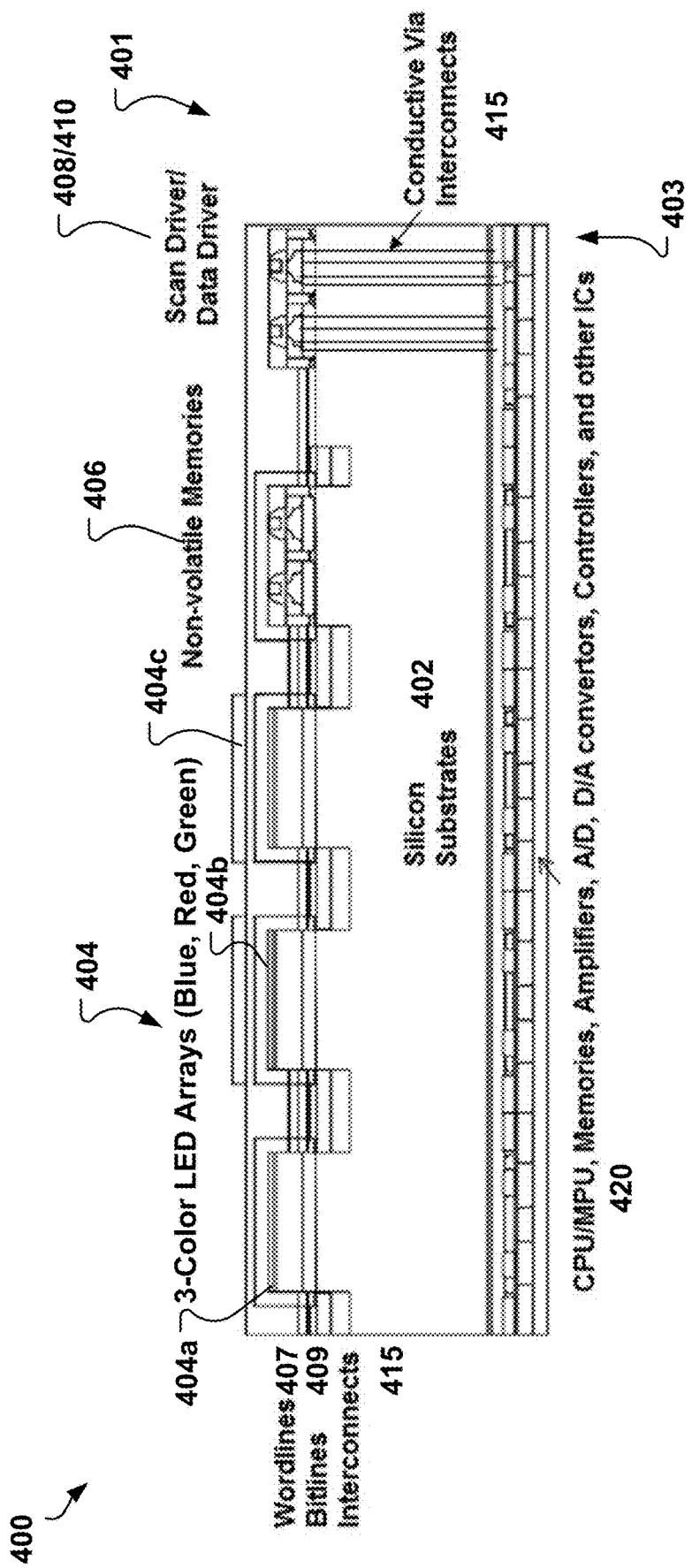
FIG. 4B is a cross-sectional view of the integrated LED display system of FIG. 4A.

FIGS. 4A-4B show an example integrated LED display system 400 with multi-color LED pixel arrays. The LED display system 400 can be the display system 100 of FIG. 1A. This LED display system 400 is formed on a silicon semiconductor substrate 402, e.g., a silicon wafer, with (111) orientation, or a silicon (111) substrate. The silicon substrate 402 can be a 2-inch silicon wafer, 4-inch silicon wafer, 6-inch silicon wafer, or any other size silicon wafer.

The silicon substrate 402 has a first side 401 and a second side 403. The first side 401 can be an upper side and the second side 403 can be a lower side opposite to the upper side. An array of LED pixels 404 is formed on the first side 401 and arranged in rows and columns. As an example, each LED pixel 404 in FIGS. 4A-4B includes a blue color LED 404a, a red color LED 404b, and a green color LED 404c. As discussed with further details in FIG. 5J, the red color LED 404b and the green color LED 404c can be formed based on a blue color LED 404a, e.g., by depositing different color phosphor material or different size quantum dots material on top of the blue color LED 404a. The blue color LED 404a can be directly formed on a surface of the first side 401 of the substrate 402 by depositing multiple semiconductor layers including at least one Group III-V compound layer. In some examples, a Group III-V compound layer includes a group III element and a group V element. The group III element can be gallium. The group V element can be nitride.

The LED pixel 404 also includes a pixel memory system 406 positioned adjacent to the three LEDs. The pixel memory system 406 can include three non-volatile memories each coupled to one of the three LEDs, respectively, as illustrated in FIG. 2A or 2B. The three LEDs 404a, 404b, 404c and the pixel memory system 406 can be arranged in a rectangular shape or a square shape. Each LED can have a size of about 30 μm or less. Each LED pixel can have a size of about 100 μm or less. Note that each LED pixel 404 can also include four LEDs including a white color LED and associated non-volatile memory in the pixel memory system 406.

A plurality of scanning drivers (or scanning drivers) 408 and a plurality of data drivers 410 are formed on the first side 401. For example, the scanning drivers 408 can be formed on a first edge of the substrate 402 along a first direction, e.g., perpendicular to multiple columns. The data drivers 410 can be formed on a second edge of the substrate 402 along a second direction, e.g., perpendicular to multiple rows. The second direction can be perpendicular to the first direction. In some implementations, as illustrated in FIG. 1B, one half of the data drivers 410 is formed on the second edge and configured to driver odd rows of LEDs, and another half of the data drivers is formed on a third edge parallel to the second edge and configured to driver even rows of LEDs.

Each LED 404a (or 404b or 404c) is coupled to a respective non-volatile memory in the pixel memory system 406. The respective non-volatile memory is coupled to a corresponding scanning driver 408 through a word line 407 and a corresponding data driver 410 through a bit line 409. Each scanning driver 408 can be coupled to a column of LEDs through one word line 407, and each data driver 410 can be coupled to a row of LEDs through one bit line 409. Thus, each LED can be individually or independently selected or controlled by a corresponding scanning driver 408 and a corresponding data driver 410. The word lines 407 and the bit lines 409 are also formed on the first side 401 of the substrate 402.

Control electronics 420 is formed on the second side 403 of the substrate 402. The control electronics 420 can be similar to the control electronics 104 of FIG. 1A. In some implementations, the control electronics 420 has CPU/MPU, memories, and ICs including amplifiers, ADCs (analog-to-digital converters), DACs (digital-to-analog converters), controllers, and/or other ICs.

The plurality of scanning drivers 408 and the plurality of data drivers 410 are coupled to the control electronics 420 via conductive interconnects 415. Each scanning driver 408 or each data driver 410 can be individually coupled to (and/or controlled by) the control electronics 420, e.g., a controller or a processor, through at least one conductive interconnects 415. The conductive interconnects 415 penetrate through the substrate 402 from the first side 401 to the second side 403. The number of the interconnects 415 can be smaller than a sum of the number of scanning drivers 408 and the number of data drivers 410.

FIGS. 5A-5J are perspective views at different steps of forming the integrated LED display system 400 of FIGS. 4A-4B on a silicon (111) substrate 500, e.g., a silicon (111) wafer. The silicon (111) substrate 500 has an upper side 501 including a top surface 502 and a lower side 503 including a bottom surface 504. The top surface 502 and the bottom surface 504 can be parallel to a (111) crystalline plane. The integrated LED display system 400 can be formed by the following steps.

First, the silicon (111) substrate 500 is prepared. The substrate 500 can be pre-treated, e.g., by cleaning the surfaces 502 and 504. In some cases, wet chemical treatment, e.g., an RCA clean procedure based on solutions, can be used to remove any organic or inorganic contaminations present on the surfaces 502 and 504. The solutions can include hydrogen peroxide, trichloroethylene, acetone, or methanol.

Second, the silicon substrate 500 is patterned. In some implementations, a hard mask layer, e.g., SiNx such as $Si_3N_4$, is used as a protective layer for patterning. The patterning of the silicon substrate 500 can include: 1) patterning a hard mask layer on the silicon substrate 500. This patterning can be formed by putting a mold with the desired pattern over the silicon substrate 500 and then depositing the hard mask layer. The hard mask layer can be deposited on the silicon substrate by Metal-Organic Chemical Vapor Deposition (MOCVD), molecular beam epitaxy (MBE), atomic layer deposition (ALD), physical vapor deposition (PVD), Chemical Vapor Deposition (CVD), or any other deposition methods in a vacuum chamber; 2) dry etching silicon of the silicon substrate, e.g., using reactive ion etching (ME) or plasma etching; 3) removing the remaining hard mask layer.

Figure 5A:
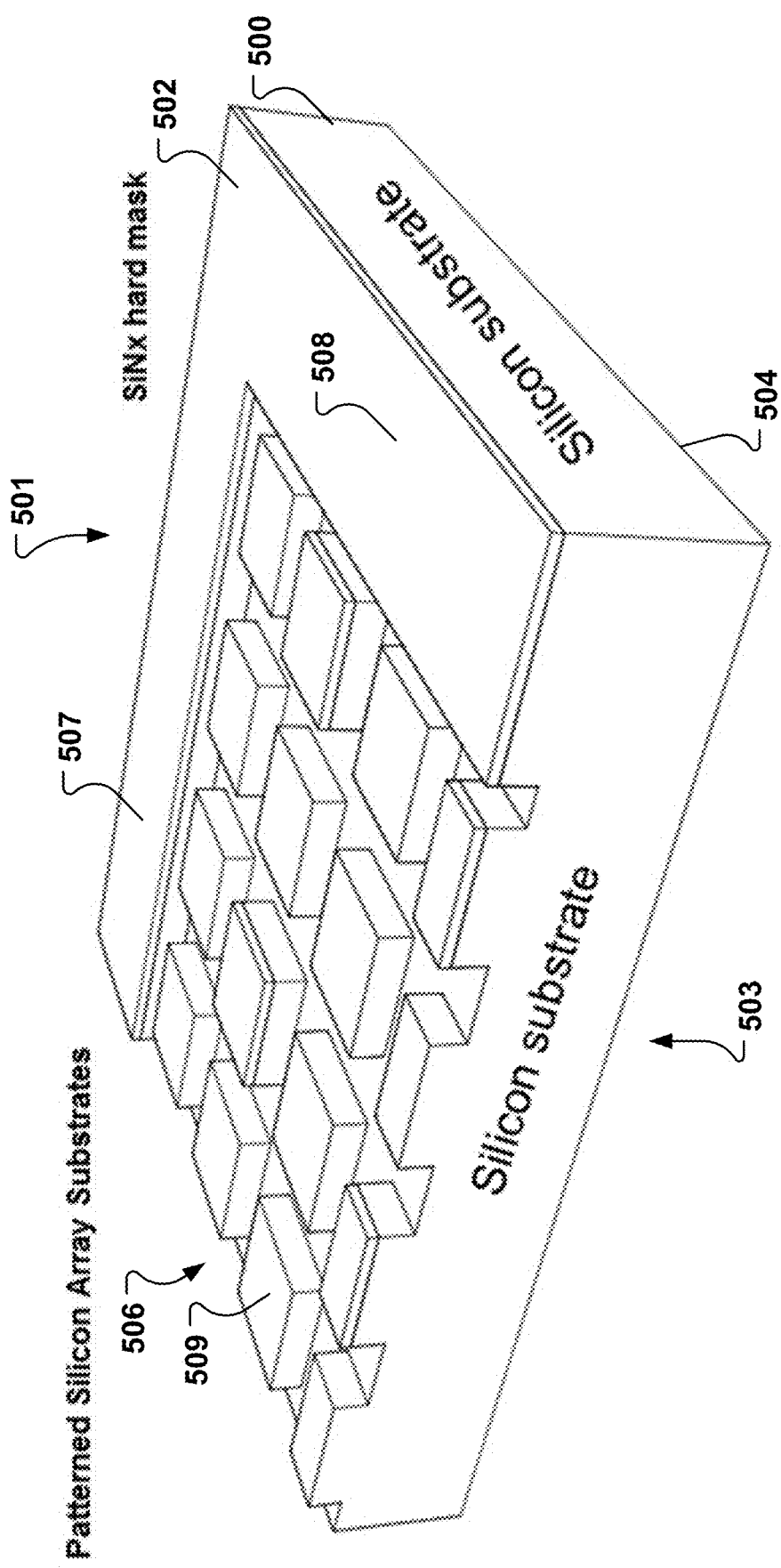
FIGS. 5A-5J are perspective views at different steps of forming the integrated LED display system of FIGS. 4A-4B.

In some cases, the patterning of the silicon substrate occurs in an area 506 for forming an array of LED pixels like the LED pixels 404 of FIGS. 4A-4B, while edges 507 and 508 of the silicon substrate to form data drivers and scanning drivers remain unchanged after depositing the hard mask layer. FIG. 5A illustrates the substrate 500 patterned by using the hard mask layer SiNx. The patterned silicon substrate includes an array of etched sub-substrates 509 arranged in columns and rows for forming the array of LED pixels.

In some implementations, photoresist is used as a protective material for patterning. The patterning of the silicon substrate 500 can include: 1) patterning a photoresist layer on the silicon substrate 500, e.g., by photolithography; 2) etching silicon with plasma. In some cases, edges (e.g., 507 and 508) of the silicon substrate for forming data drivers and scanning drivers can also be protected from etching; 3) removing the remaining photoresist layer from the silicon substrate.

Third, an array 512 of LEDs 510 are formed on the upper side 501 of the patterned silicon substrate. The LEDs 510 can be formed by depositing multiple layers on surfaces of the silicon substrate parallel to (111) crystalline plane. The multiple layers can be deposited by MOCVD, MBE, ALD, PVD, CVD, or any other suitable deposition methods in a vacuum chamber with a certain temperature. The multiple layers can include light-emitting layers, e.g., a quantum well layer, for emitting light with a specified wavelength. The quantum-well layer can include a uniform layer or a plurality of quantum wells. For example, a quantum-well layer can include a substantially uniform layer made of InN, GaN, InGaN, AlGaN, InAlN, or AlInGaN. A quantum-well layer can also include a multi-layer structure defining one or more quantum wells. A quantum well can for example be formed by an InGaN, an AlGaN, an InAlN, or an InCaAlN layer sandwiched in between two GaN layers. A quantum well can also be formed by an InCaM layer sandwiched in between GaN or AlGaN layers. The quantum-well layer can include one or a stack of such layered structure each defining a quantum well as described above.

Figure 5B:
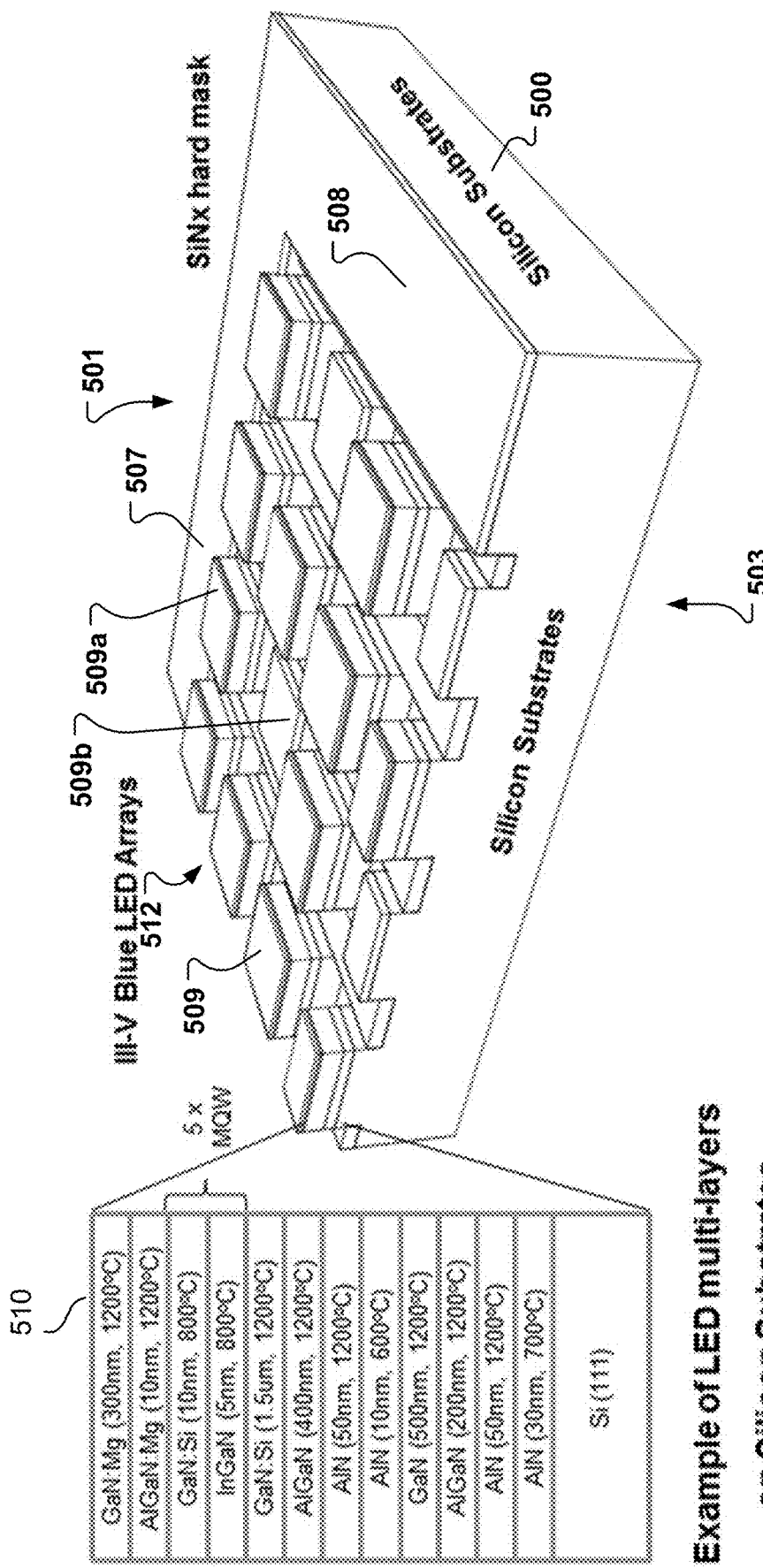

As an example illustrated in FIG. 5B, III-V blue light LEDs 510 are formed on the silicon (111) surfaces by using pairs of InGaN and GaN:Si as the quantum well (MQW) layer. The LEDs 510 can include one or more buffer layers deposited on the silicon (111) surface, one or more lower Group III-V compound layers on the buffer layers, one or more MQW layers on the lower Group III-V compound layers, and one or more upper Group III-V compound layers. In a particular example, the blue light LEDs are formed by sequentially epitaxially growing with MOCVD (or MBE or ALD): 30 nm-AlN layer under 700° C., 50 nm-AlN layer under 1200° C., 200 nm-AlGaN layer under 1200° C., 500 nm-GaN layer under 1200° C., 10 nm-AlN layer under 600° C., 50 nm-AlN layer under 1200° C., 400 nm-AlGaN layer under 1200° C., 1.5 μm-GaN:Si layer under 1200° C., 5 pairs of 5-nm InGaN layer and 10 nm-GaN:Si layer under 800°

C., 10 nm-AlGaN:Mg layer under 1200° C., and 300 nm-GaN:Mg layer under 1200° C.

In some implementations, the LEDs 510 are selectively formed on a number of etched sub-substrates 509a. The other etched sub-substrates 509b can be protected, e.g., by depositing a protective resist layer, from depositing the LED multiple layers and reserved for forming non-volatile memories for the LEDs, e.g., the pixel memory system 406 of FIGS. 4A-4B. Each sub-substrate 509b can be configured adjacent to three or four sub-substrates 509a. The etched sub-substrates 509a and 509b can be configured for forming LED pixels each with a minimized size or a specified size. Other areas on the silicon substrate, e.g., the edges 507 and 508, can also be protected from depositing the LED multiple layers and reserved for forming data drivers, scanning drivers, and bit lines and word lines. FIG. 5B shows the substrate 500 with the array 512 of LEDs 510 formed in selective areas 509a.

Figure 5C:
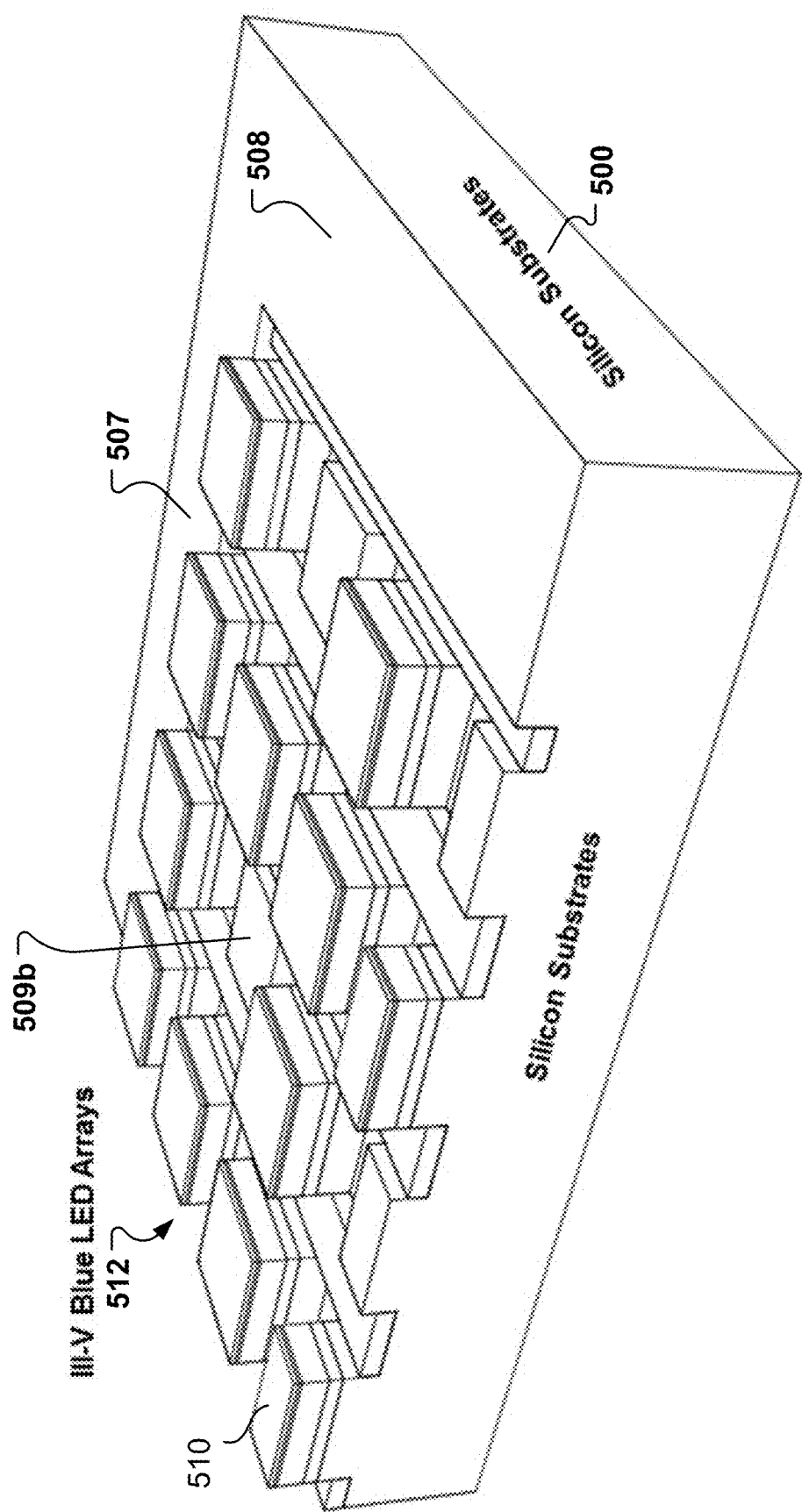

In some implementations, the areas for forming other components like non-volatile memories, data drivers, scanning drivers, bit lines, and/or word lines can be selectively opened, e.g., by etching, and/or cleaned to prepare for forming the other components. As illustrated in FIG. 5C, the areas including the edges 507 and 508 and the sub-substrates 509b are selectively etched and cleaned. The previously remained hard mask layer SiNx can also be removed.

Figure 5D:
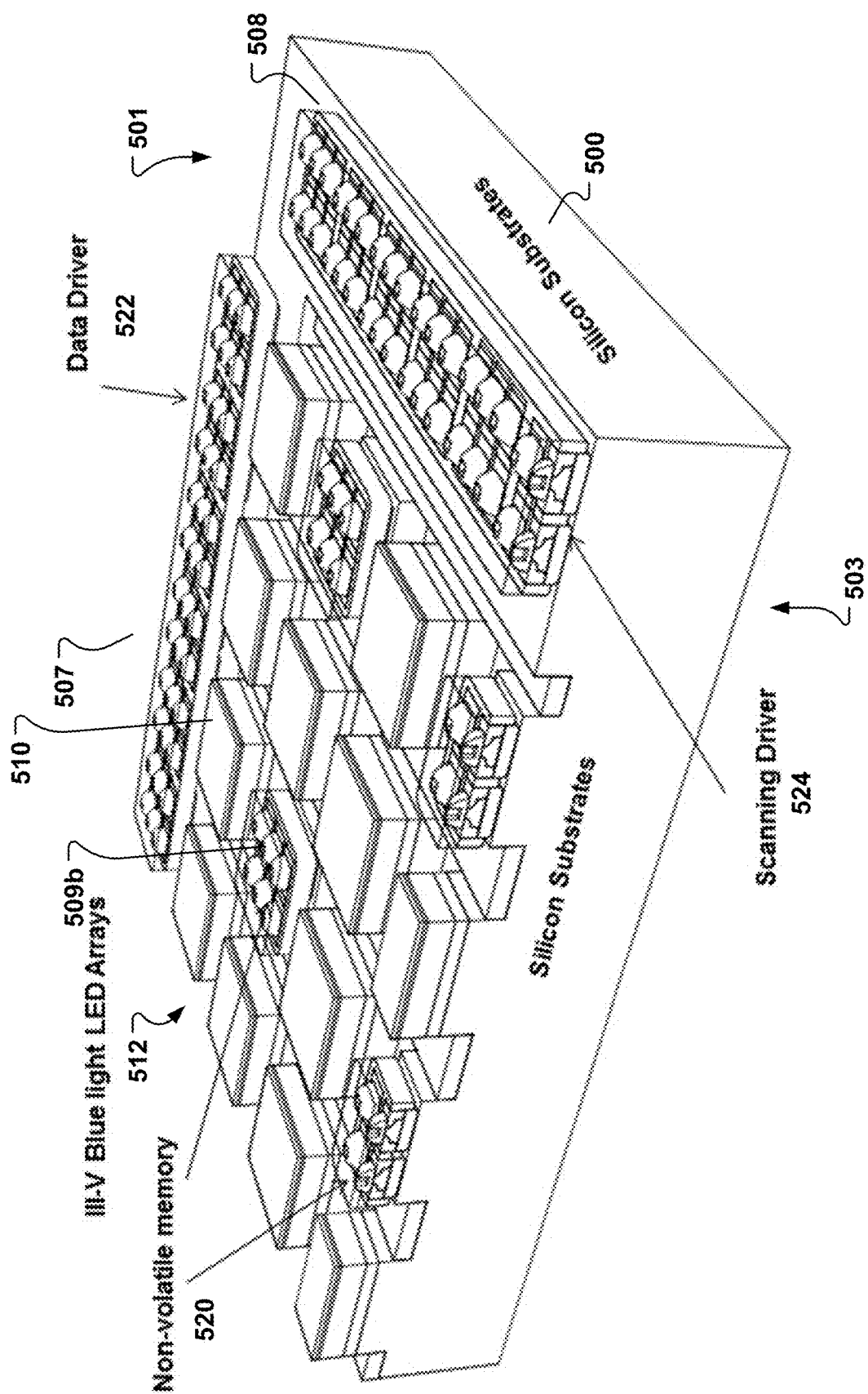

Fourth, as illustrated in FIG. 5D, non-volatile memories 520 are formed on the upper side 501 of the silicon substrate. The non-volatile memories 520 can be formed on the etched sub-substrates 509b. As noted above in FIG. 4A, each non-volatile memory can be coupled to a respective LED or multiple LEDs to form an active-matrix LED pixel. A plurality of data drivers 522 and a plurality of scanning drivers 524 can be also formed on the upper side 501 of the silicon substrate, e.g., on the edges 507 and 508. In some implementations, as illustrated in FIG. 1B, the data drivers 522 can also be divided into two parts formed on the edge 507 and another parallel edge on the upper side 501 for driving odd rows of bit lines and even rows of bit lines, respectively.

Figure 5E:
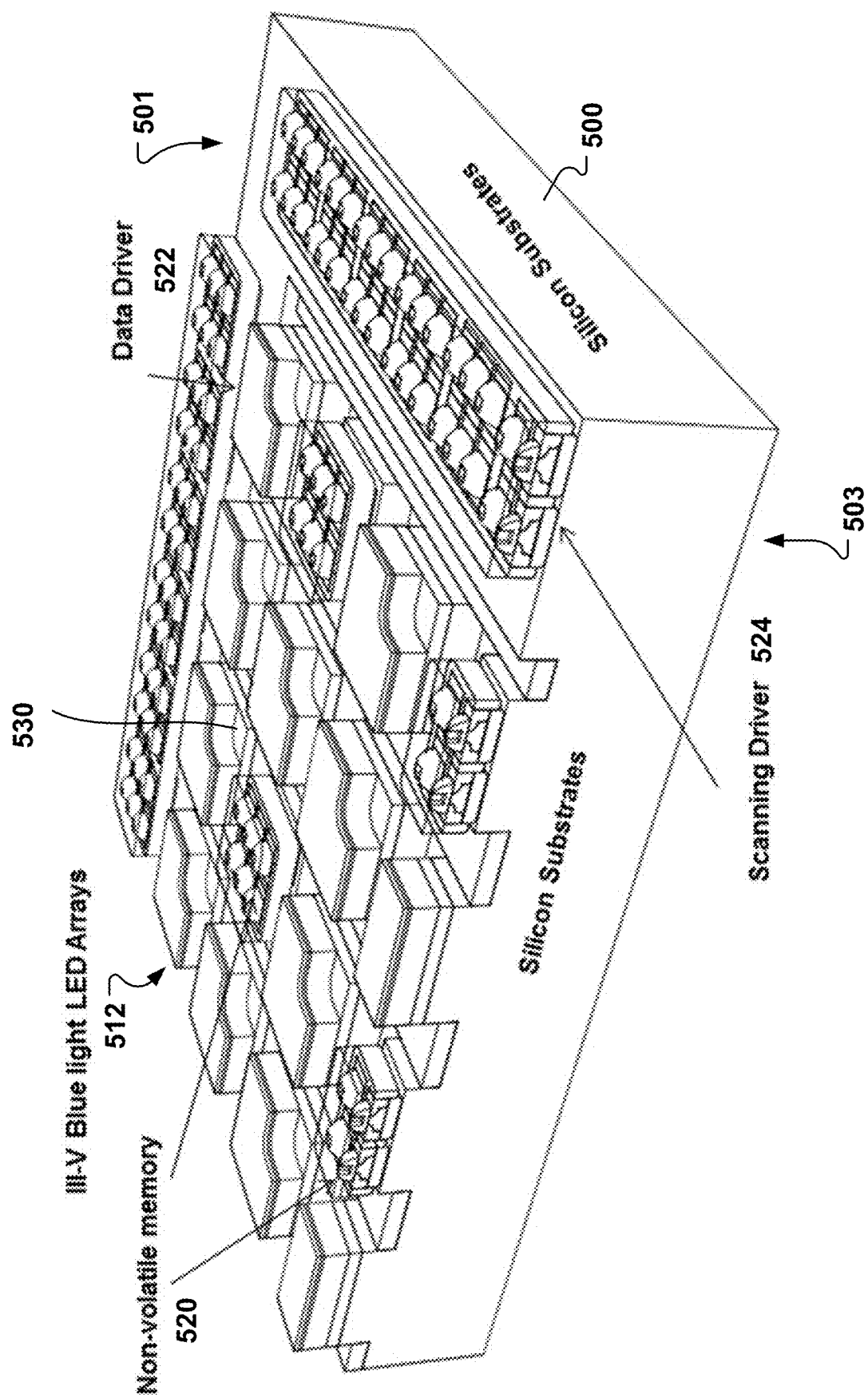

Fifth, as illustrated in FIG. 5E, the LEDs 510 are selectively etched to open for depositing ohmic Ohmic contacts 530 of the LEDs 510. For example, the LEDs 510 can be etched to a lower Group III-V compound layer under the quantum well layer. The lower Group III-V compound layer can be p-doped, e.g., p-GaN, and an n-type electrode (cathode) can be formed on the p-doped Group III-V compound layer as the ohmic contacts 530. A top layer of the LEDs 510 can be an n-doped Group III-V compound layer, and a p-type electrode (anode), e.g., a passivation ITO layer, can be formed on the n-doped Group III-V compound layer. In another example, the lower Group III-V compound layer can be n-doped, e.g., n-GaN, and a p-type electrode (anode) can be formed on the n-doped Group III-V compound layer as the Ohmic contacts 530; the top layer of the LEDs can be p-doped Group III-V compound layer, e.g., p-GaN, and a n-type electrode (cathode) can be formed on the p-doped Group III-V compound layer.

Figure 5F:
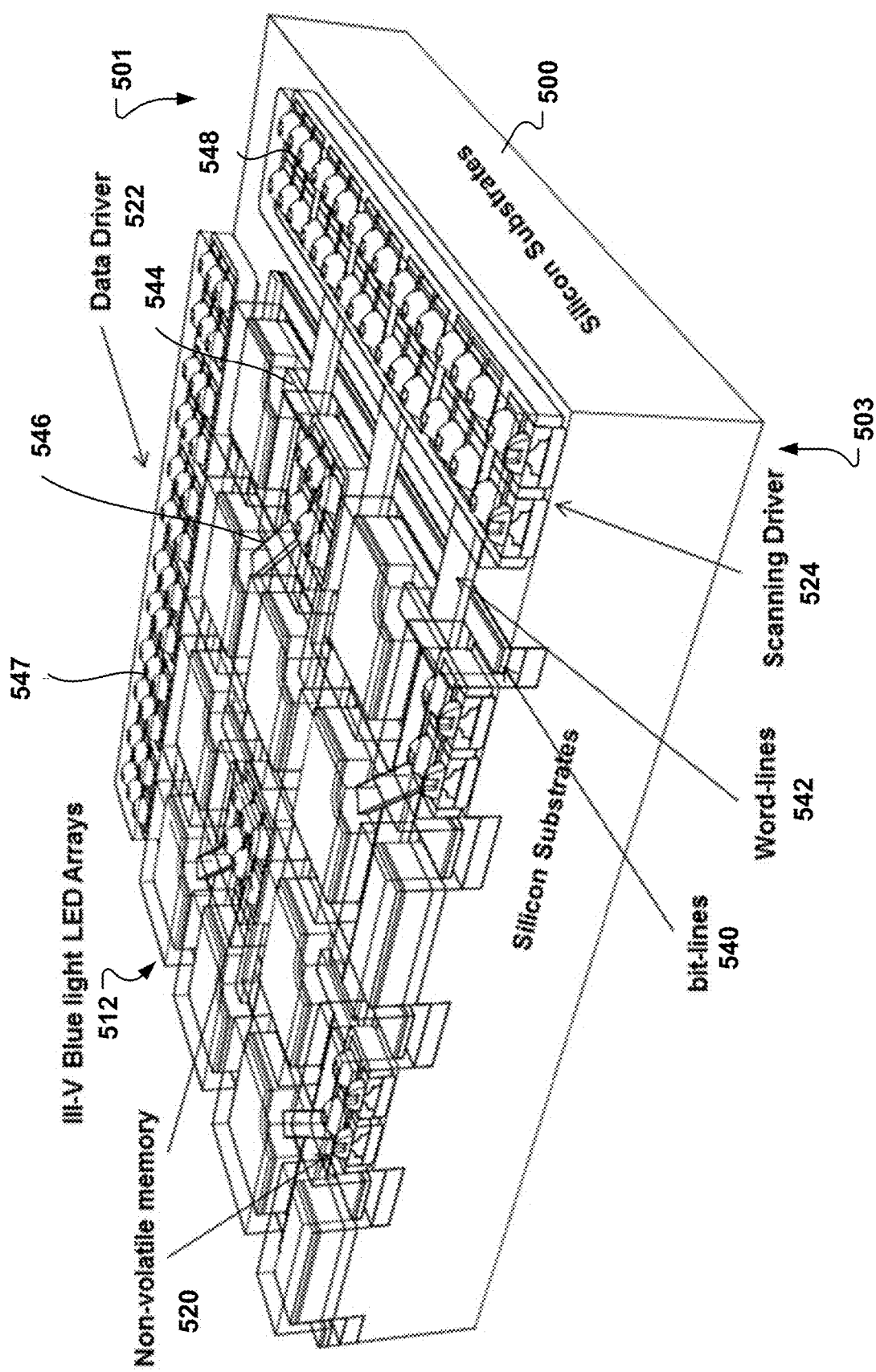

Sixth, as illustrated in FIG. 5F, bit lines 540 and word lines 542 are formed, e.g., in multiple rows and columns, respectively. The bit lines 540 and word lines 542 are conductively connected to the data drivers 522 and the scanning drivers 524, respectively. Particularly, each data driver 522 is connected to a respective row bit line 540, and each scanning driver 524 is connected to a respective column word line 542.

Interconnects 544 between the Ohmic contacts 530 of the LEDs 510 and the non-volatile memories 520 and interconnects 546 between the non-volatile memories 520 and the bit lines 540 and the word lines 542 are also formed. In such a way, each LED 510 is conductively coupled to a non-volatile memory 520 that is further coupled to a corresponding data driver 522 through a corresponding bit line 540 and to a corresponding scanning driver 524 through a corresponding word line 542. Each data driver 522 can be connected to a row of non-volatile memories 520 (thus a row of corresponding LEDs 510) through a corresponding bit line 540. Each scanning driver 524 can be connected to a column of non-volatile memories 520 (thus a column of corresponding LEDs 510) through a corresponding word line 542. In some examples, interconnects 547 among data drivers 522 and/or interconnects 548 among scanning drivers 544 are also formed.

Figure 5G:
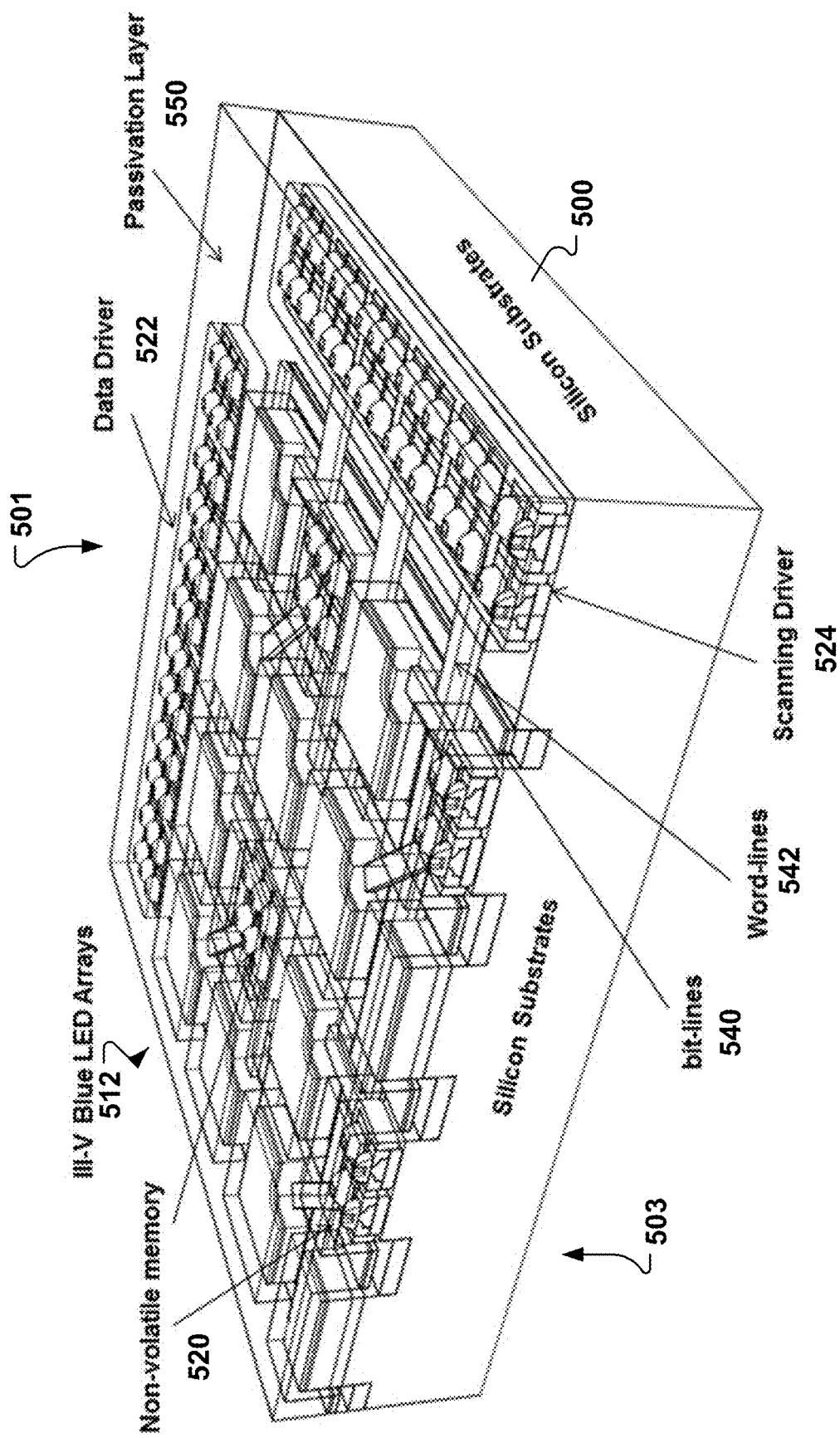

Seventh, as illustrated in FIG. 5G, a passivation layer 550, e.g., a transparent SiOx layer or ITO layer, is formed to cover surfaces of the silicon substrate, including the LED arrays 512. The passivation layer 550 can be deposited on the surfaces by MOCVD, ALD, PVD, CVD, or any suitable deposition methods. The passivation layer 550 can act as anodes or cathodes for the LEDs under the passivation layer 550. The passivation layer 550 can be connected to the ground or a supply voltage.

All the above steps are performed on the upper side 501 of the silicon substrate 500. In the following eighth step, the silicon substrate 500 is flipped from the upper side 501 to the lower side 503, and a plurality of deep trenches (or through-holes) are formed from the lower side 503, through the substrate 500, and towards the upper side 501. The deep trenches can be formed by deep etching, e.g., deep RIE or plasma etch. Then conductive electrodes are formed inside the deep trenches to form interconnects 560. In some cases, inner surfaces of the deep trenches are insulated and then metals are filled inside the deep trenches to form the conductive electrodes.

Figure 5H:
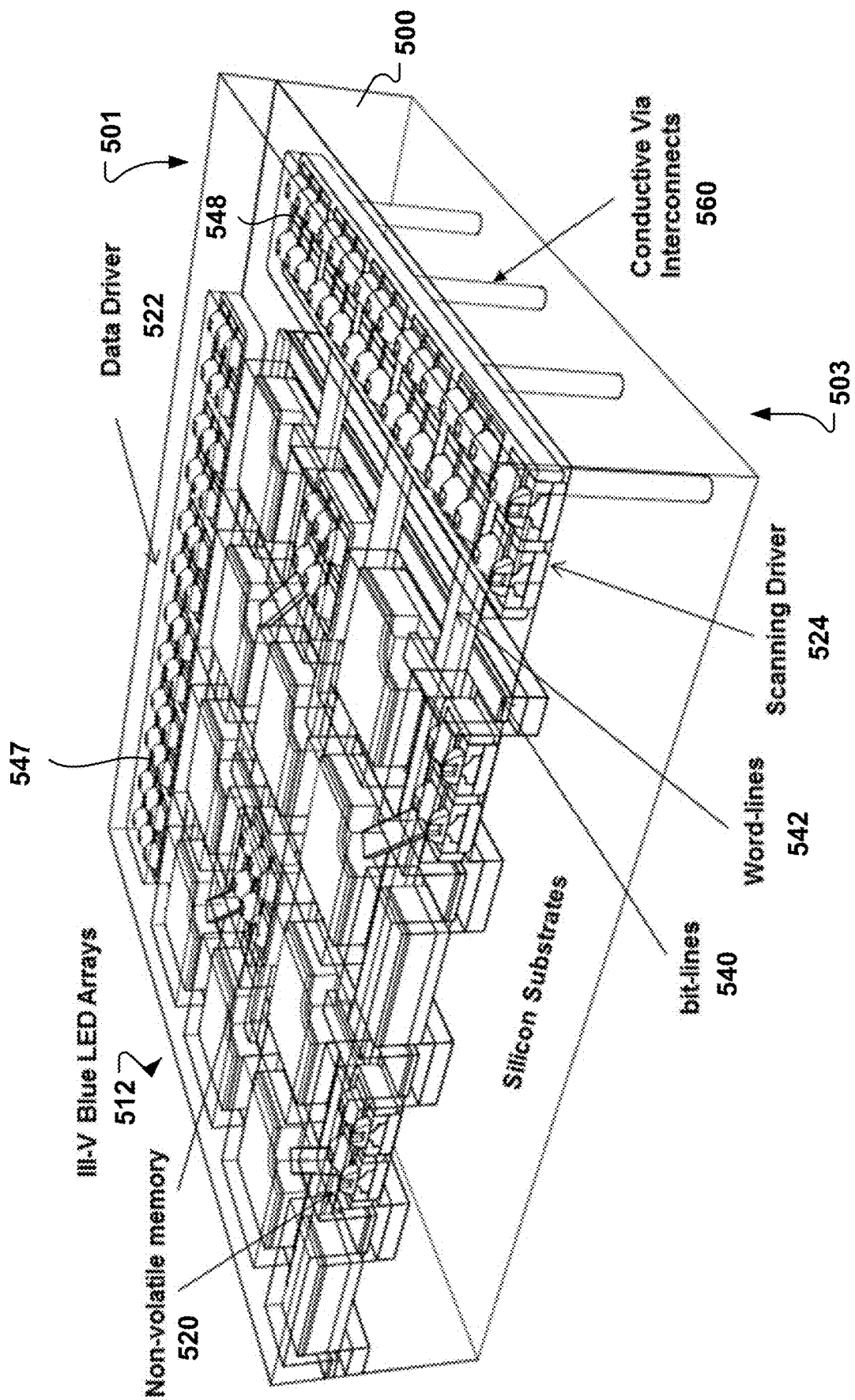

The interconnects 560 are configured to connect the plurality of data drivers 522 and the plurality of scanning drivers 524 to control electronics to be formed on the lower side 503. As the plurality of data drivers 522 can be connected together by interconnects 547 and the plurality of scanning drivers 524 can be connected together by interconnects 548, the number of interconnects 560 can be smaller than a sum of the number of data drivers 522 and the number of scanning drivers 524. As illustrated in FIG. 5H, the interconnects 560 can be distributed, e.g., evenly, among the scanning drivers 524 and the data drivers 522.

Figure 5I:
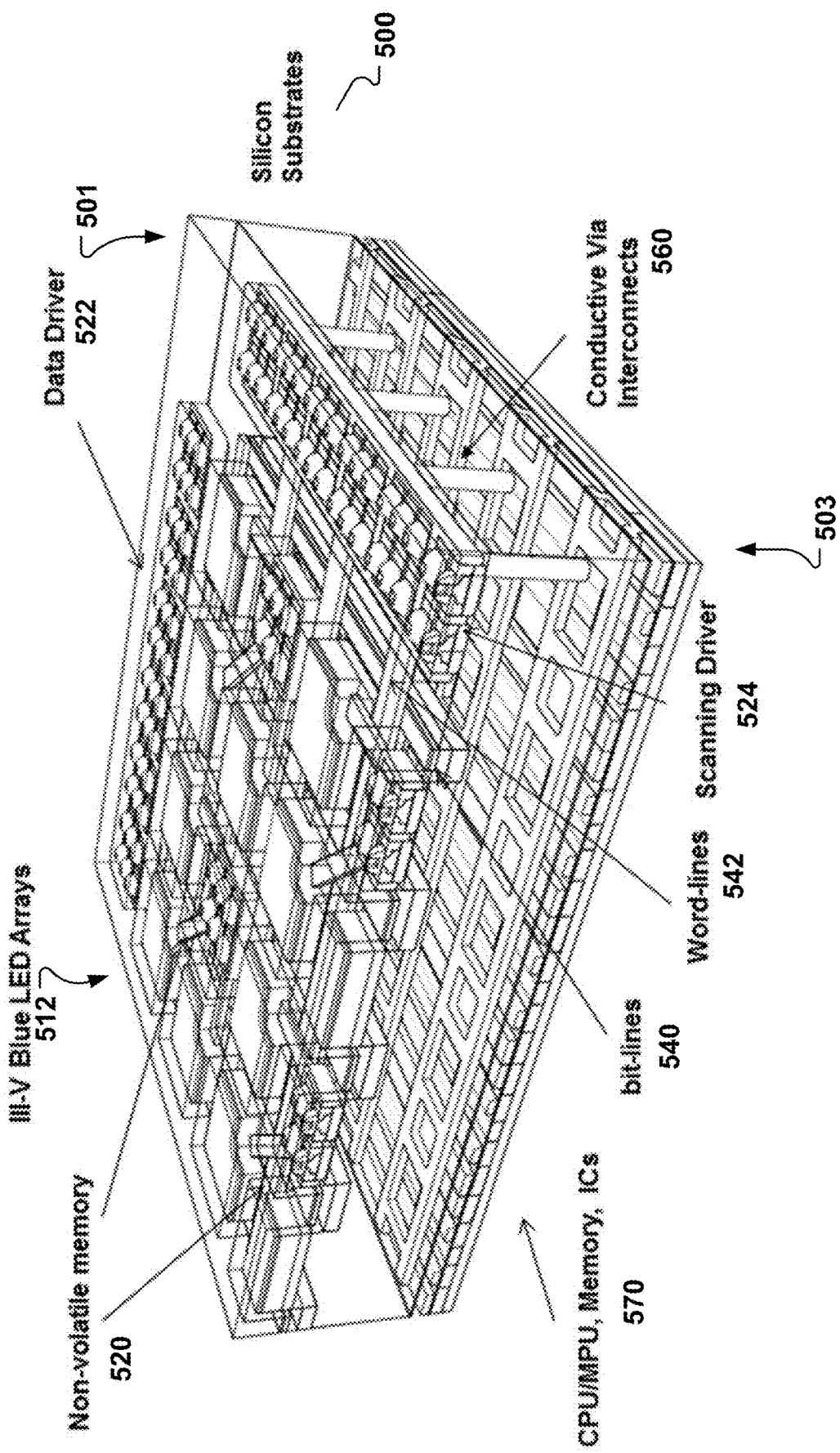

Ninth, as illustrated in FIG. 5I, control electronics 570 is formed on the bottom surface 504 of the lower side 503 of the silicon substrate 500. The control electronics 570 can be the control electronics 420 of FIGS. 4A-4B. In some implementations, the control electronics 570 has CPU/MPU, memories, and ICs including amplifiers, ADCs (analog-to-digital converters), DACs (digital-to-analog converters), controllers, and/or other ICs. Components in the control electronics 570 can be connected to each other, e.g., via internal bus. The control electronics 570 is coupled to the data drivers 522 and the scanning drivers 524 through the conductive interconnects 560.

Tenth, the silicon substrate 500 is flipped back from the lower side 503 to the upper side 501. Secondary color LEDs, e.g., red color LEDs 592 and green color LEDs 594, can be formed based on the previously-formed LEDs 510, e.g., blue color LED 510. The different color LEDs can form a multi-color LED pixel 590, e.g., the LED pixel 404 of FIGS. 4A-4B.

Secondary color LEDs can be formed on surface of the LEDs 510 by using different color phosphor materials or different size quantum-dot (QD) materials. For example, potassium fluorosilicate (PFS)/$K_2SiF_6$ (KSF) phosphors can be used to make red color LEDs with an emission wavelength of about 630 nm. Aluminate, or silicate, or green garnet (GNYAG) phosphors can be used to make green color LEDs with an emission wavelength of about 530 nm. Cerium(III)-doped YAG phosphors can be used to make white color LEDs.

In some implementations, an array of the multi-color LED pixels 590 is formed by the following processes: 1) patterning using photoresist for specific color LEDs, e.g., red LEDs 592; 2) depositing, e.g., by ink-jet printing, specific color phosphor films or specific size QD thin-films for the specific color, e.g., red phosphor films or red QD thin-films; 3) lifting off to remove the photoresist to form specific color phosphors/Quantum-dot arrays thus to form the specific color LED arrays, e.g., red LED arrays; 4) repeating the same processes above to form another specific color LED arrays, e.g., green LED arrays 594, but with another specific color phosphor films or another specific size QD thin-films, e.g., green phosphor films or green QD thin-films. In a particular example, a white LED is also formed to be included in each pixel to increase a sharpness of displayed images/pictures.

Figure 5J:
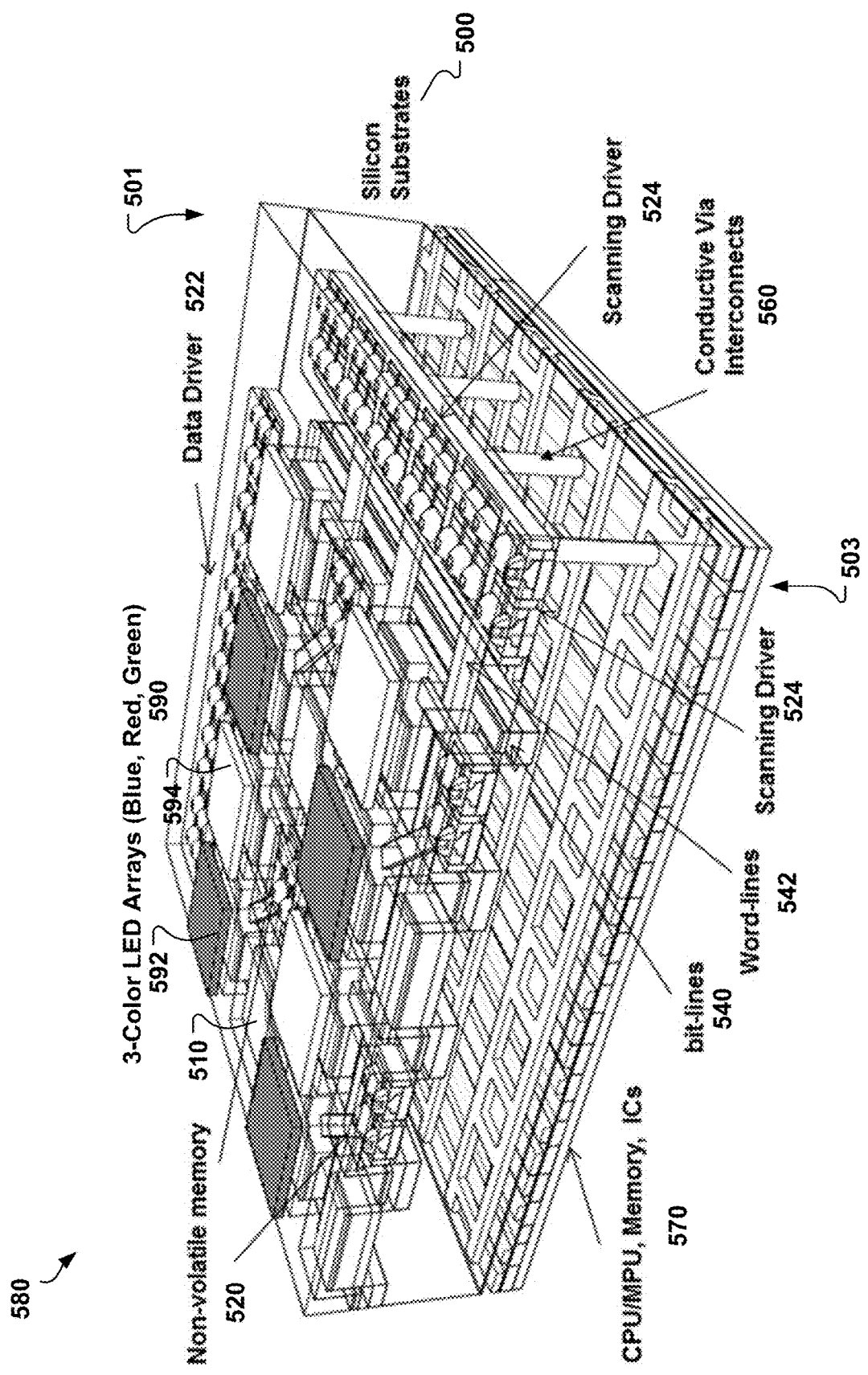

FIG. 5J shows the formed integrated LED display system 580, which can be the LED display system 400 of FIGS. 4A-4B. In the LED display system 580, blue LEDs 510 are first formed using Group III-V compound layers, e.g., In(0.3)Ga(0.7)N layer, as quantum well layers. Then other color LEDs, e.g., red LEDs, green LEDs, or white LEDs, are formed by depositing corresponding color phosphor films or corresponding size QD thin-films on the blue LEDs.

In some other implementations, red LEDs are first formed using Group III-V compound layers, e.g., InN layer, as quantum well layers. Then other color LEDs, e.g., blue LEDs, green LEDs, or white LEDs, are formed by depositing corresponding color phosphor films or QD thin-films on the red LEDs. In some other implementations, green LEDs are first formed using Group III-V compound layers, e.g., In(0.5)Ga(0.5)N layer, as quantum well layers. Then other color LEDs, e.g., blue LEDs, red LEDs, or white LEDs, are formed by depositing corresponding color phosphor films or QD thin-films on the red LEDs.

In some implementations, instead of using color phosphor films or QD thin-films on one primary color LEDs to generate the other two or more secondary color LEDs, all the color LEDs, e.g., blue LEDs, red LEDs, and green LEDs, can be formed using Group III-V compound layers as quantum well layers. For example, after the second step where the silicon substrate 500 is patterned, blue LED arrays can be first selectively formed on a first plurality of sub-substrates 509a by using Group III-V compound layers, e.g., In(0.3)Ga(0.7)N layer, as quantum well layers; then red LED arrays can be selectively formed on a second plurality of sub-substrates 509a by using Group III-V compound layers, e.g., InN layer, as quantum well layers; and then green LED arrays can be selectively formed on a third plurality of sub-substrate 509a by using Group III-V compound layers, e.g., In(0.5)Ga(0.5)N layer, as quantum well layers. The formation of the three color LED arrays can be arranged in any desired order. Each LED pixel can include a blue LED, a red LED, and a green LED. The number of the first plurality of sub-substrates 509a is identical to the number of the second plurality of sub-substrates 509a and to the number of the third plurality of sub-substrates 509a.

After forming the multi-color LED pixel display 580 as illustrated in FIG. 5J, a protective layer can be further formed on surfaces of the array of LED pixels, including the LEDs 510, 592, and 594. The protective layer can be made of transparent material, e.g., glass or plastic, coated with a conductive material, e.g., indium tin oxide (ITO). The protective layer is coupled to non-volatile memories 520 in the LED pixels under the protective layer and forms, with the non-volatile memories 520a, a touch screen position sensor. The touch screen position sensor can use capacitive sensing. As noted above, a touch on the protective layer can be converted to a capacitance change which is detected by a touch screen detector/analyzer in the control electronics 570 through conductive connections between the non-volatile memories 520 and the data drivers 522/scanning drivers 524, and interconnects 560.

Figure 6A:
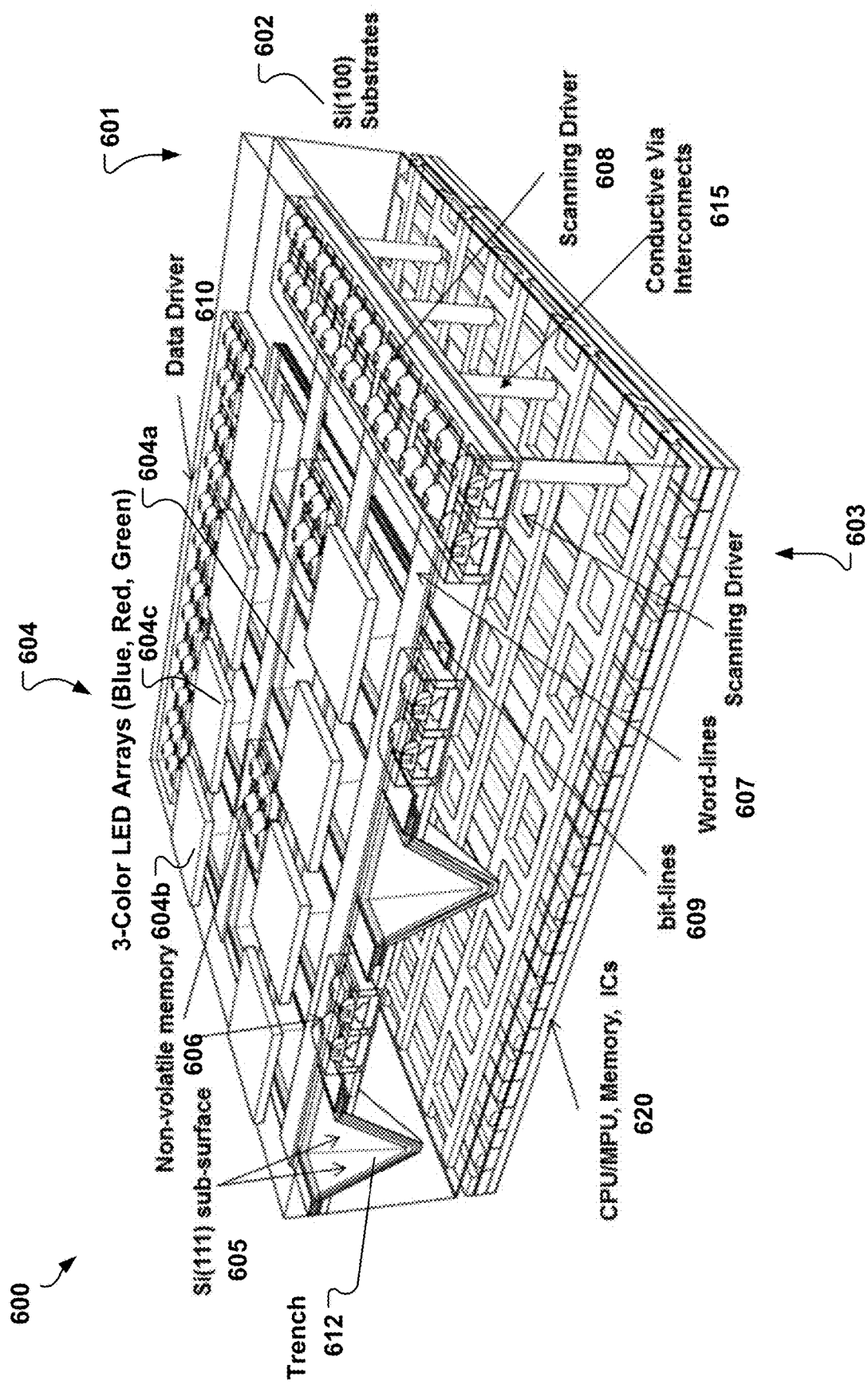
FIG. 6A is a perspective view of another example of an integrated LED display system with multi-color LED pixel arrays.
Figure 6B:
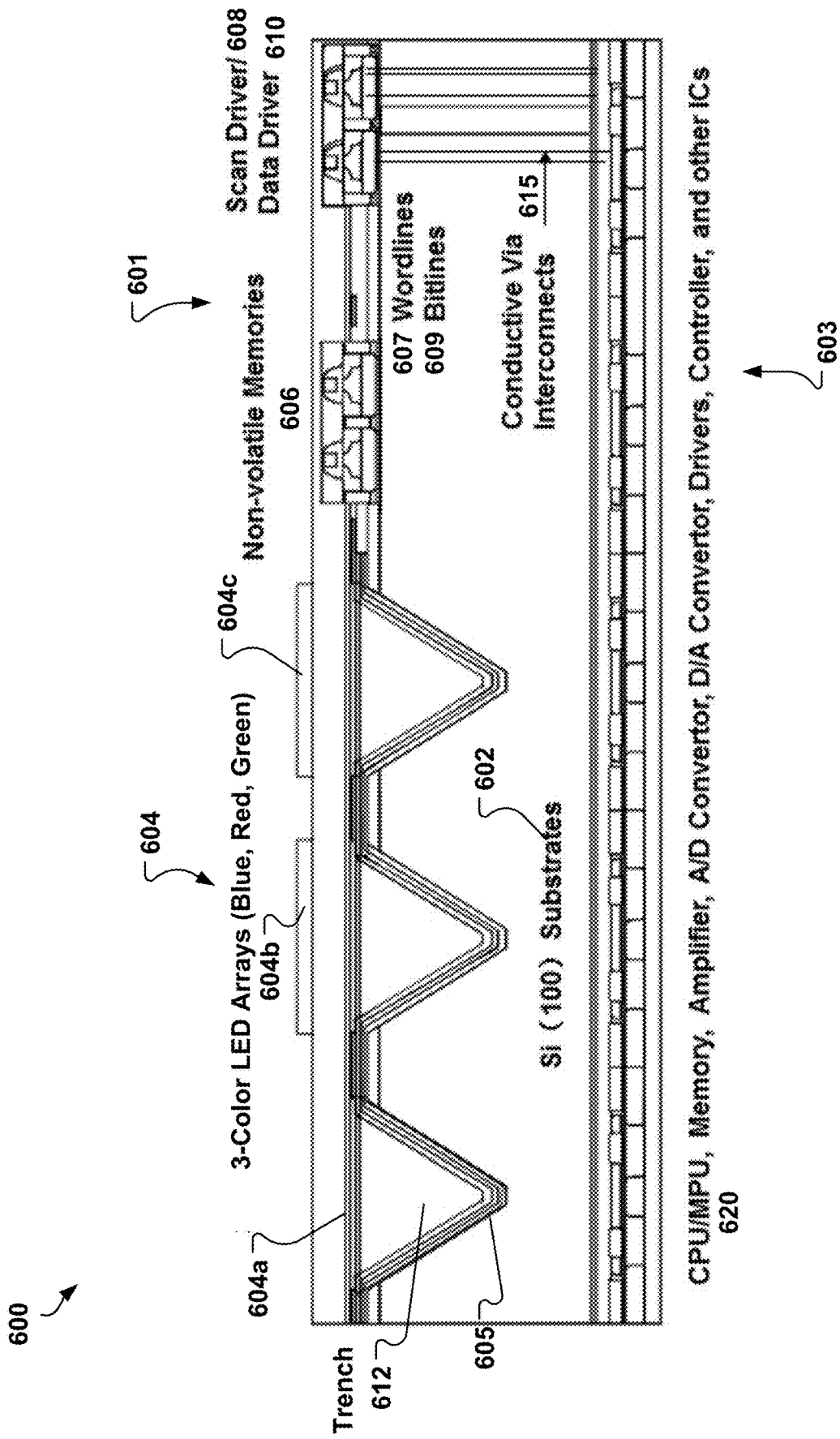
FIG. 6B is a cross-sectional view of the integrated LED display system of FIG. 6A.

FIGS. 6A-6B show another example integrated LED display system 600 with multi-color LED pixel arrays. Different from the integrated LED display system 400 described in FIGS. 4A-4B formed on a silicon semiconductor substrate with (111) orientation, the LED display system 600 is formed on a silicon semiconductor substrate 602 with (100) orientation. That is, the silicon substrate 602 has planar surfaces, e.g., an upper planar surface and a lower planar surface, parallel to (100) crystalline plane. LEDs in the LED display system 600 are formed on surfaces parallel to (111) crystalline plane, which is not parallel to the planar surfaces. As discussed in further details in FIG. 7A, the silicon (111) sub-surfaces 605 can be inner surfaces of trenches 612 formed by wet etching the silicon (100) substrate 602.

The silicon substrate 602 has a first side 601 and a second side 603. The first side 601 can be an upper side and the second side 603 can be a lower side opposite to the upper side. An array of LED pixels 604 is formed on the first side 601 and arranged in rows and columns. As an example, each LED pixel 604 in FIGS. 6A-6B includes a blue color LED 404a, a red color LED 404b, and a green color LED 404c. As discussed below in FIG. 7B, a blue color LED 404a can be directly formed on one or more silicon (111) sub-surfaces 605 of a trench 612 by depositing multiple semiconductor layers including at least one Group III-V compound layer. In a particular example, light emission surfaces of the blue LED 404a are at a 54.7° angle relative to the upper planar surface of the silicon substrate 602. For a same footprint on the upper surface, the sum of the areas of the emission surfaces on the light emission surfaces is approximately 1.73 times the area of the upper surface under the trench 612. As discussed in further details below in FIG. 7J, the red color LED 604b and/or the green color LED 604c can be formed based on light emission surfaces of a blue color LED 604a in a trench 612, e.g., by depositing different color phosphor material or different size quantum dots material in the trench 612.

The LED pixel 604 also includes a pixel memory system 606 positioned adjacent to the three LEDs. The pixel memory system 606 can be similar to the pixel memory system 406 of FIGS. 4A-4B. The pixel memory system 606 can include three non-volatile memories each coupled to one of the three LEDs, respectively. The three LEDs 604a, 604b, 604c and the pixel memory system 606 can be arranged in a rectangular shape or a square shape. Each LED can have a size of about 30 μm or less. Each LED pixel can have a size of about 100 μm or less. Note that each LED pixel 604 can also include four LEDs including a white color LED and associated non-volatile memory in the pixel memory system 606.

A plurality of scanning drivers 608 and a plurality of data drivers 610 are formed on the first side 601. For example, the scanning drivers 608 can be formed on a first edge of the substrate 602 along a first direction, e.g., perpendicular to multiple columns. The data drivers 610 can be formed on a second edge of the substrate 602 along a second direction, e.g., perpendicular to multiple rows. The second direction can be perpendicular to the first direction. In some implementations, one half of the data drivers 610 is formed on the second edge and configured to driver odd rows of LEDs, and another half of the data drivers is formed on a third edge parallel to the second edge and configured to driver even rows of LEDs.

Each LED 604a (or 604b or 604c) is coupled to a respective non-volatile memory in the pixel memory system 606. The respective non-volatile memory is coupled to a corresponding scanning driver 608 through at least one word line 607 and a corresponding data driver 610 through at least one bit line 609. Each scanning driver 608 can be coupled to a column of LEDs through one word line 607, and each data driver 610 can be coupled to a row of LEDs through one bit line 609. Thus, each LED can be individually or independently selected or controlled by a corresponding scanning driver 608 and a corresponding data driver 610. The word lines 607 and the bit lines 609 can be conductive metal lines and be formed on the first side 601 of the substrate 602.

Control electronics 620 is formed on the second side 603 of the substrate 602. The control electronics 620 can be similar to the control electronics 104 of FIG. 1A. In some implementations, the control electronics 620 has CPU/MPU, memories, and ICs including amplifiers, ADCs (analog-to-digital converters), DACs (digital-to-analog converters), controllers, and/or other ICs.

The plurality of scanning drivers 608 and the plurality of data drivers 610 are coupled to the control electronics 620 via conductive interconnects 615. Each scanning driver 608 or each data driver 610 can be individually coupled to (and controlled by) the control electronics 620, e.g., a controller or a processor, through at least one conductive interconnects 615. The conductive interconnects 615 penetrate through the substrate 602 from the first side 601 to the second side 603. The number of interconnects 615 can be smaller than a sum of the number of scanning drivers 608 and the number of data drivers 610.

FIGS. 7A-7J are perspective views at different steps of forming the integrated LED display system 600 of FIGS. 6A-6B. As noted above, the integrated LED display system 600 is formed on a silicon (100) substrate 700, e.g., a silicon (100) wafer. The silicon (100) substrate 700 has an upper side 701 including a top planar surface 702 and a lower side 703 including a bottom planar surface 704. The top planar surface 702 and the bottom planar surface 704 can be parallel to a (100) crystalline plane. The integrated LED display system 600 can be formed by the following steps, which are similar to the steps for forming the integrate LED display system 400, as illustrated in FIGS. 5A-5J except the second step for patterning the silicon substrate 700 to form trenches having silicon (111) sub-surfaces below the top planar surface 702.

First, the silicon (100) substrate 700 is prepared. The substrate 700 can be pre-treated, e.g., by cleaning the surfaces 702 and 704. In some cases, wet chemical treatment, e.g., an RCA clean procedure based on solutions, can be used to remove any organic or inorganic contaminations present on the surfaces 702 and 704. The solutions can include hydrogen peroxide, trichloroethylene, acetone, or methanol.

Figure 7A:
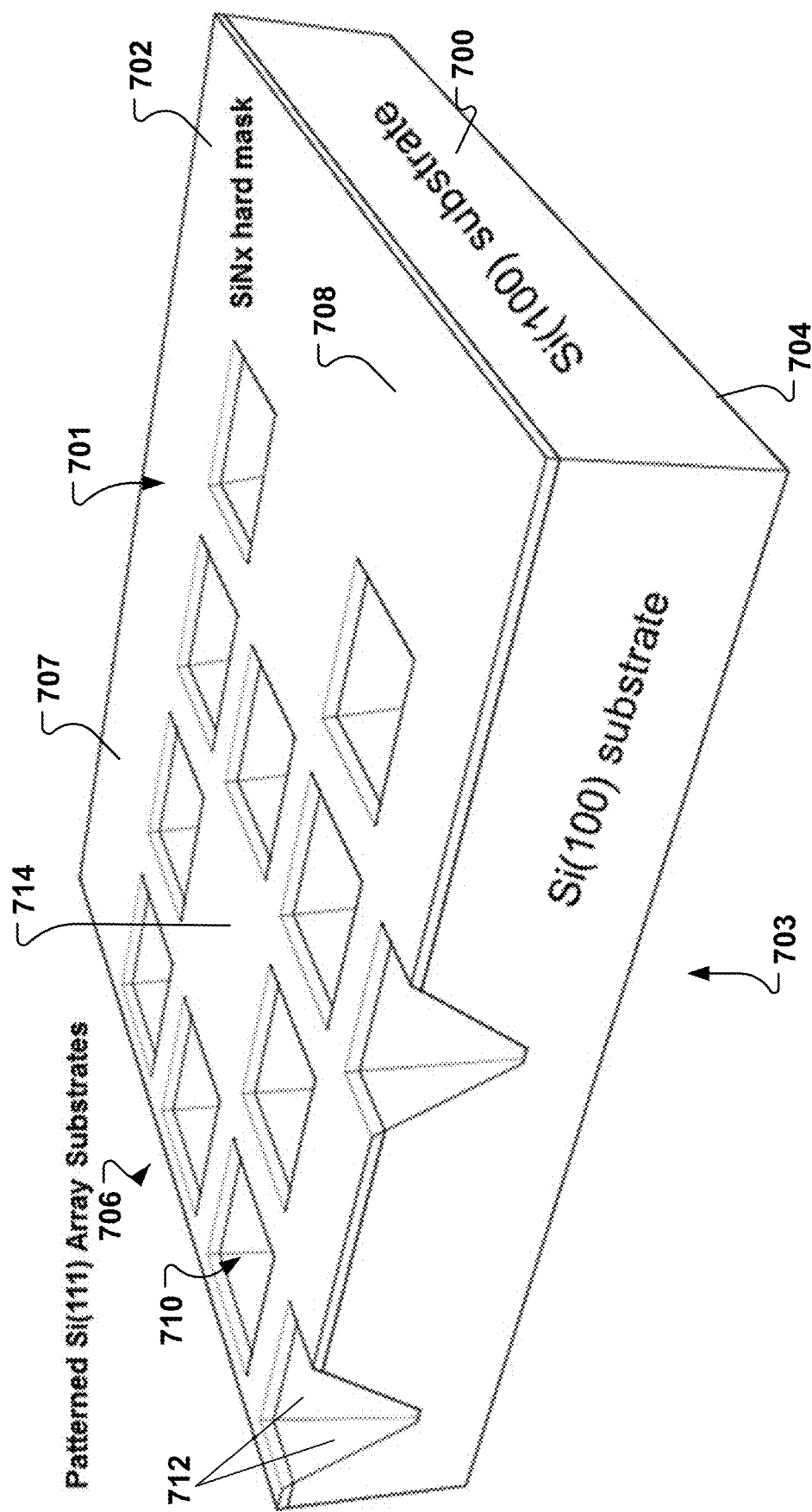

Second, the silicon substrate 700 is patterned. The patterning of the silicon substrate 700 can include: 1) patterning a hard mask layer, e.g., SiNx, on the silicon substrate 700; 2) performing a crystal direction selective wet etch, e.g., using KOH acid solution, on the patterned top surface 702 of the silicon (100) substrate to form an array of trenches 710 having multiple Si (111) sub-surfaces 712. Each trench 710 can have four Si (111) titled sub-surfaces 712 below the top surface 702 and with an angle of 54.7° relative to the top surface 702. FIG. 7A illustrates the patterned Si (111) array substrates 706 in the trenches 710 that have multiple Si (111) sub-surfaces 712. In some cases, the patterning of the silicon substrate 700 includes removing the remaining hard mask layer and/or cleaning the silicon substrate 700.

Areas 714 are protected from etching and left for forming non-volatile memories in the LED pixels for adjacent LEDs to be formed in the trenches 710. In some cases, edges 707 and 708 of the silicon (100) substrate 700 to form data drivers and scanning drivers remain unchanged after depositing the hard mask layer.

Third, an array 716 of LEDs 718 is formed on the upper side 701 of the patterned silicon substrate. The LEDs 718 can be formed by depositing multiple layers on surfaces of the silicon (111) sub-surfaces 712 in the trenches 710. The LEDs 718 can be similar to the LEDs 510 of FIG. 5B. The multiple layers can be deposited by MOCVD, MBE, ALD, PVD, CVD, or any other suitable deposition methods in a vacuum chamber with a certain temperature. The multiple layers can include light-emitting layers, e.g., a quantum well layer including Group III-V compound, for emitting light with a specified wavelength.

Figure 7B:
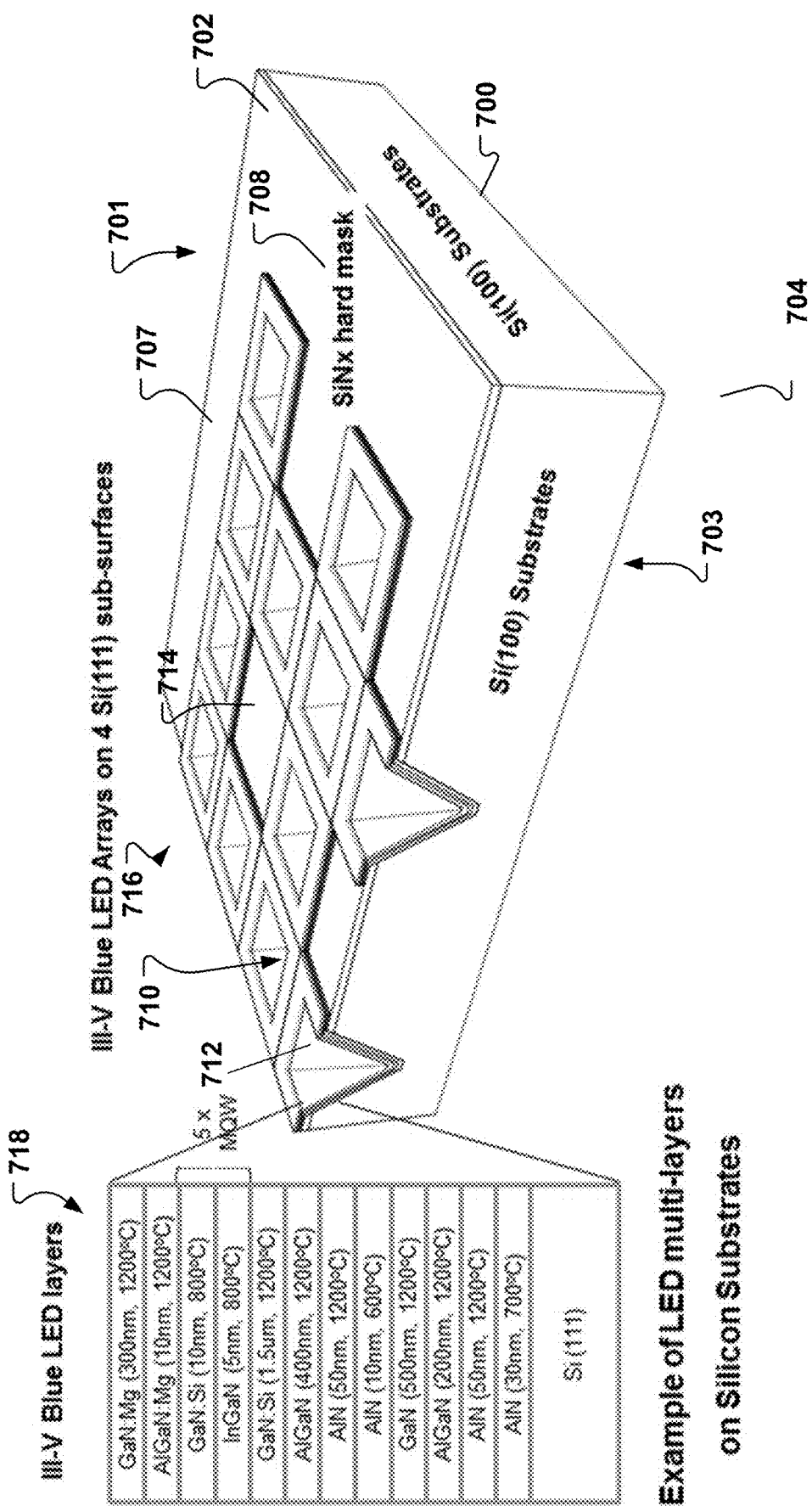

As an example illustrated in FIG. 7B, III-V blue light LEDs 718 are formed on the silicon (111) sub-surfaces 712 in the trenches 710 by using pairs of InGaN and GaN:Si as the quantum well (MQW) layer. The LEDs 718 can include one or more buffer layers deposited on the silicon (111) surfaces 712, one or more lower Group III-V compound layers on the buffer layers, one or more MQW layers on the lower Group III-V compound layers, and one or more upper Group III-V compound layers. In a particular example, the blue light LEDs are formed by sequentially epitaxially growing with MOCVD: 30 nm-AlN layer under 700° C., 50 nm-AlN layer under 1200° C., 200 nm-AlGaN layer under 1200° C., 500 nm-GaN layer under 1200° C., 10 nm-AlN layer under 600° C., 50 nm-AlN layer under 1200° C., 400 nm-AlGaN layer under 1200° C., 1.5 μm-GaN:Si layer under 1200° C., 5 pairs of 5-nm InGaN layer and 10 nm-GaN:Si layer under 800° C., 10 nm-AlGaN:Mg layer under 1200° C., and 300 nm-GaN:Mg layer under 1200° C.

In some implementations, the LEDs 718 are selectively formed in the trenches 710. The areas 714 can be protected, e.g., by depositing a protective resist layer, from depositing the LED multiple layers and reserved for forming non-volatile memories for the LEDs. Each area 714 can be configured adjacent to three or four trenches 710. The trenches 710 and the areas 714 can be configured for forming LED pixels each with a minimized size or a specified size. Other areas on the silicon substrate, e.g., the edges 707 and 708, can also be protected from depositing the LED multiple layers and reserved for forming data drivers, scanning drivers, and bit lines and word lines. FIG. 7B shows the substrate 700 with the array 716 of LEDs 718 formed in the trenches 710.

Figure 7C:
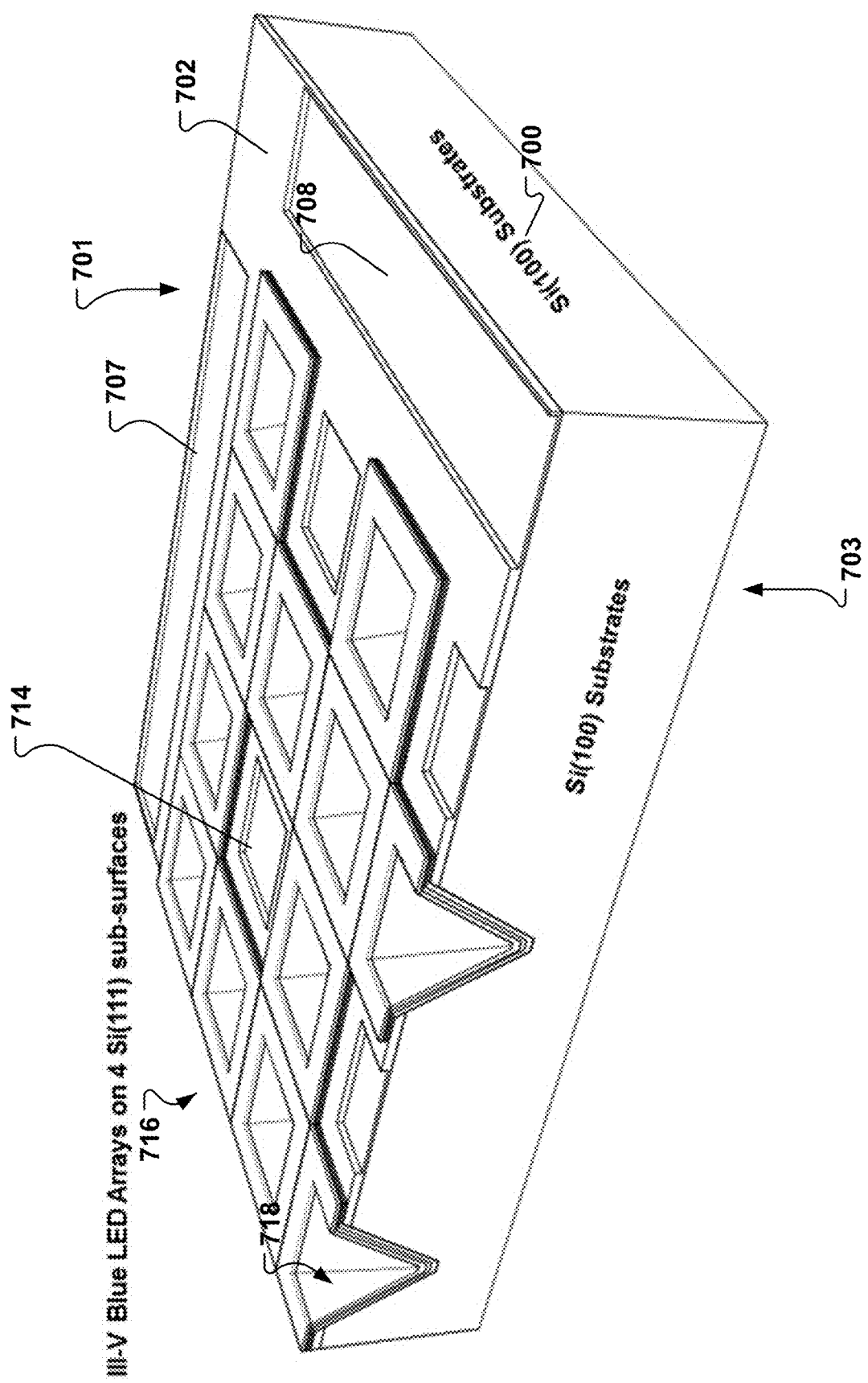

In some implementations, as illustrated in FIG. 7C, the silicon substrate 700 is selectively opened, e.g., by etching, and/or cleaned to prepare for forming the other components. For example, the areas including the edges 707 and 708 and the areas 714 and/or other areas for interconnects are selectively etched and cleaned. The previously remained hard mask layer, e.g., SiNx, can also be removed.

Figure 7D:
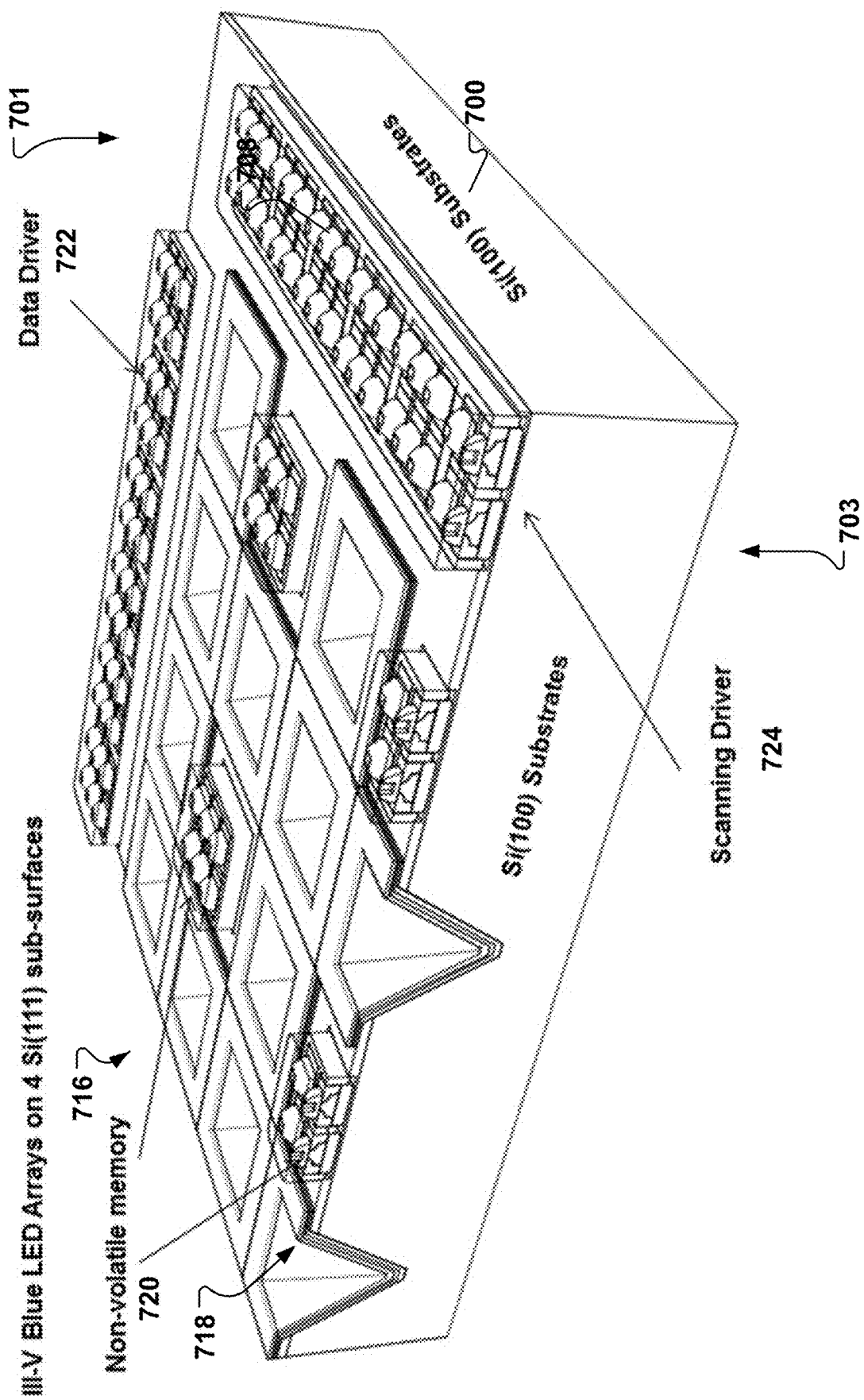

Fourth, as illustrated in FIG. 7D, non-volatile memories 720 are formed on the upper side 701 of the silicon substrate. The non-volatile memories 720 can be formed on the areas 714. As noted above in FIG. 6A, each non-volatile memory can be coupled to a respective LED or multiple LEDs to form an active-matrix LED pixel. A plurality of data drivers 722 and a plurality of scanning drivers 724 can be also formed on the upper side 701 of the silicon substrate, e.g., on the edges 707 and 708. In some implementations, as illustrated in FIG. 1B, the data drivers 722 can also be divided into two parts formed on the edge 707 and another parallel edge on the upper side 701 for driving odd rows of bit lines and even rows of bit lines, respectively.

Figure 7E:
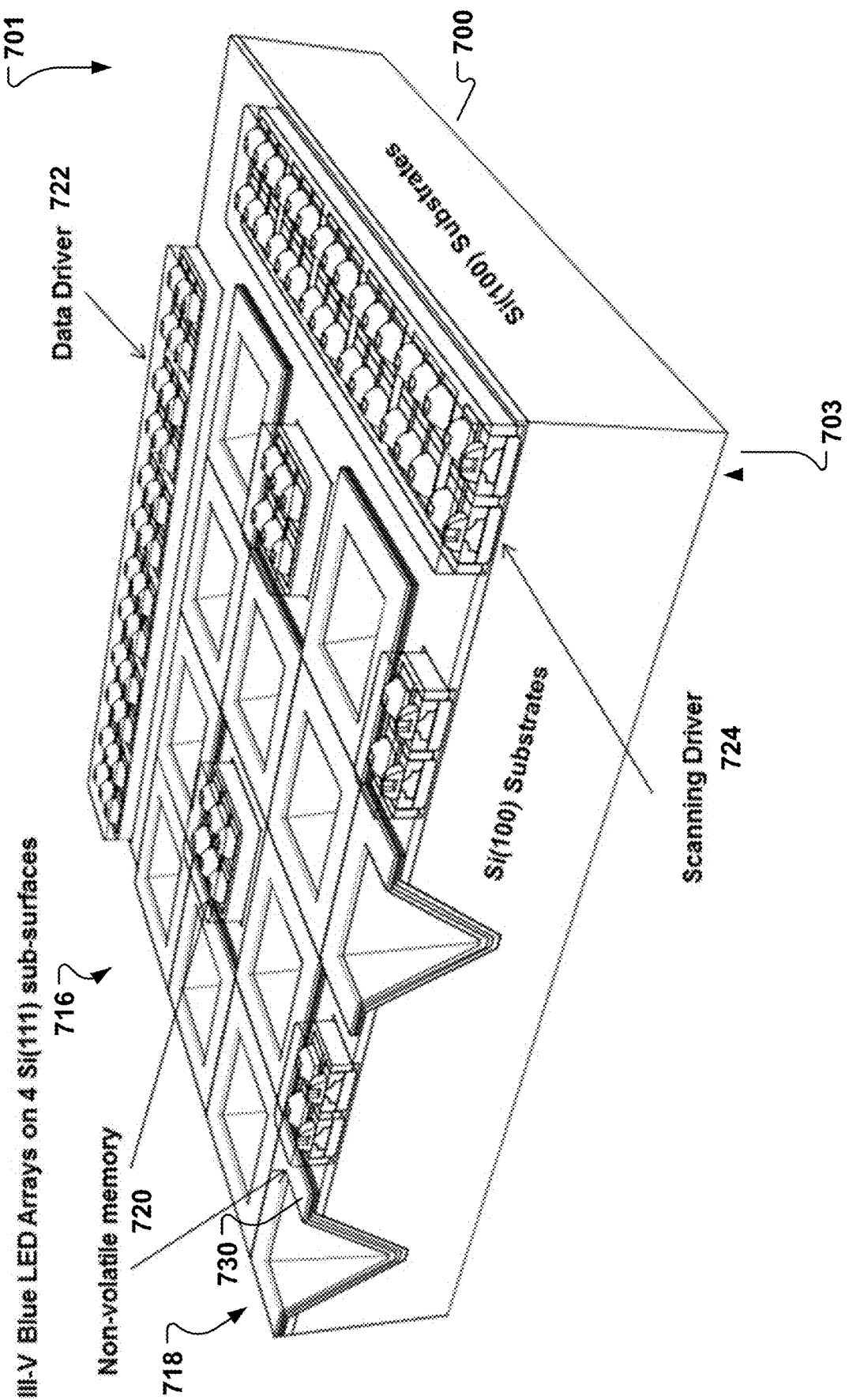

Fifth, as illustrated in FIG. 7E, the LEDs 718 formed on the titled Si (111) surfaces 712 in the trenches 710 are selectively etched to open for depositing Ohmic contacts 730 of the LEDs 718. For example, the LEDs 718 can be etched to a lower Group III-V compound layer under the quantum well layer. The lower Group III-V compound layer can be p-doped, e.g., p-GaN, and an n-type electrode (cathode) can be formed on the p-doped Group III-V compound layer as the Ohmic contacts 730. A top layer of the LEDs 718 can be an n-doped Group III-V compound layer, and a p-type electrode (anode) can be formed on the n-doped Group III-V compound layer. In another example, the lower Group III-V compound layer can be n-doped, e.g., n-GaN, and a p-type electrode (anode) can be formed on the n-doped Group III-V compound layer as the Ohmic contacts 730; the top layer of the LEDs can be p-doped Group III-V compound layer, e.g., p-GaN, and a n-type electrode (cathode) can be formed on the p-doped Group III-V compound layer.

Figure 7F:
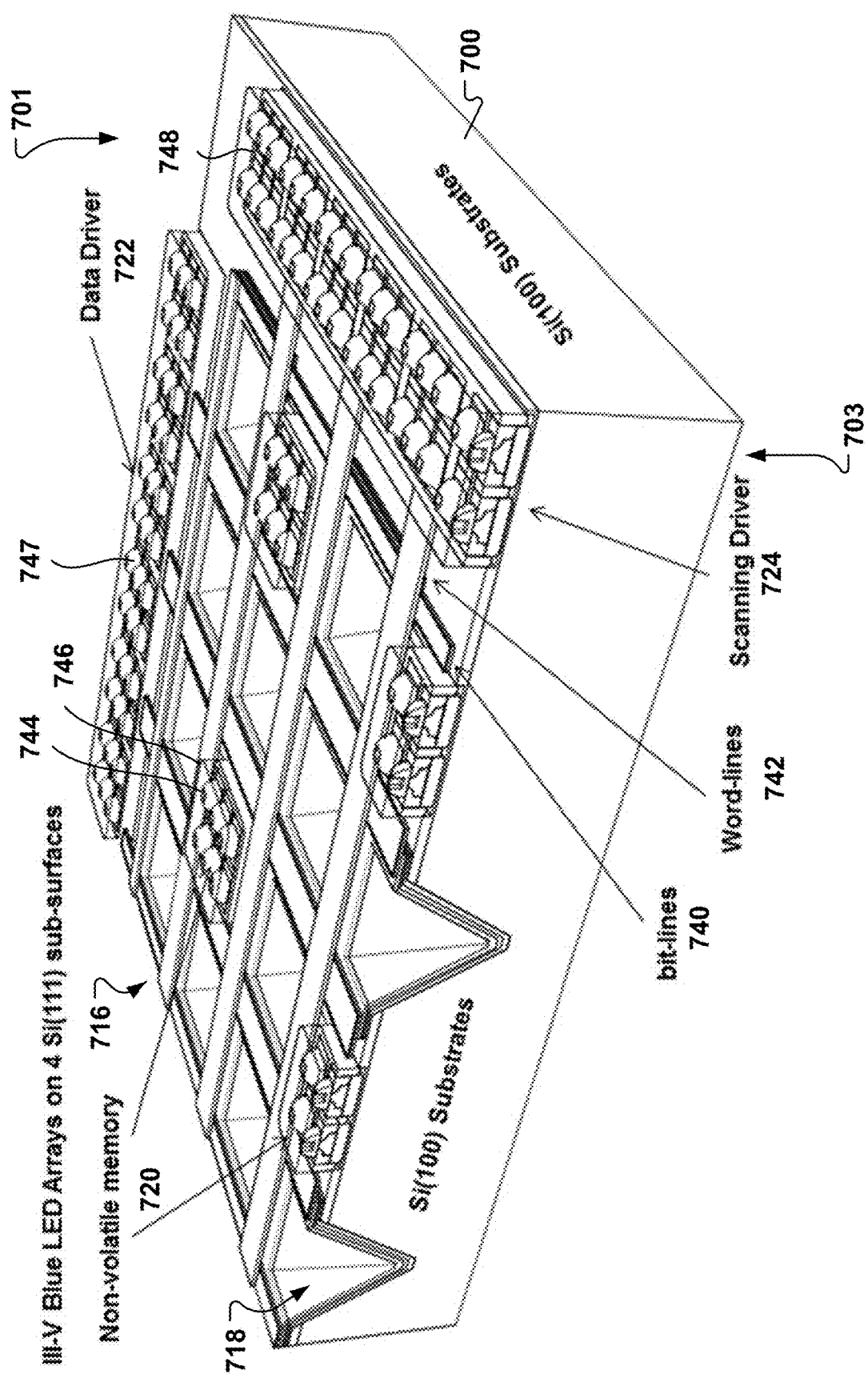

Sixth, as illustrated in FIG. 7F, bit lines 740 and word lines 742 are formed, e.g., in multiple rows and columns, respectively. The bit lines 740 and word lines 742 are conductively connected to the data drivers 722 and the scanning drivers 724, respectively. Particularly, each data driver 722 is connected to a respective row bit line 740, and each scanning driver 724 is connected to a respective column word line 742.

Interconnects 744 between the Ohmic contacts 730 of the LEDs 718 and the non-volatile memories 720 and interconnects 746 between the non-volatile memories 720 and the bit lines 740 and the word lines 742 are also formed. In such a way, each LED 718 is conductively coupled to a non-volatile memory 720 that is further coupled to a corresponding data driver 722 through a corresponding bit line 740 and to a corresponding scanning driver 724 through a corresponding word line 742. Each data driver 722 can be connected to a row of non-volatile memories 720 (thus a row of corresponding LEDs 718) through a corresponding bit line 740. Each scanning driver 724 can be connected to a column of non-volatile memories 720 (thus a column of corresponding LEDs 718) through a corresponding word line 742. In some examples, interconnects 747 among data drivers 722 and/or interconnects 748 among scanning drivers 744 are also formed.

Figure 7G:
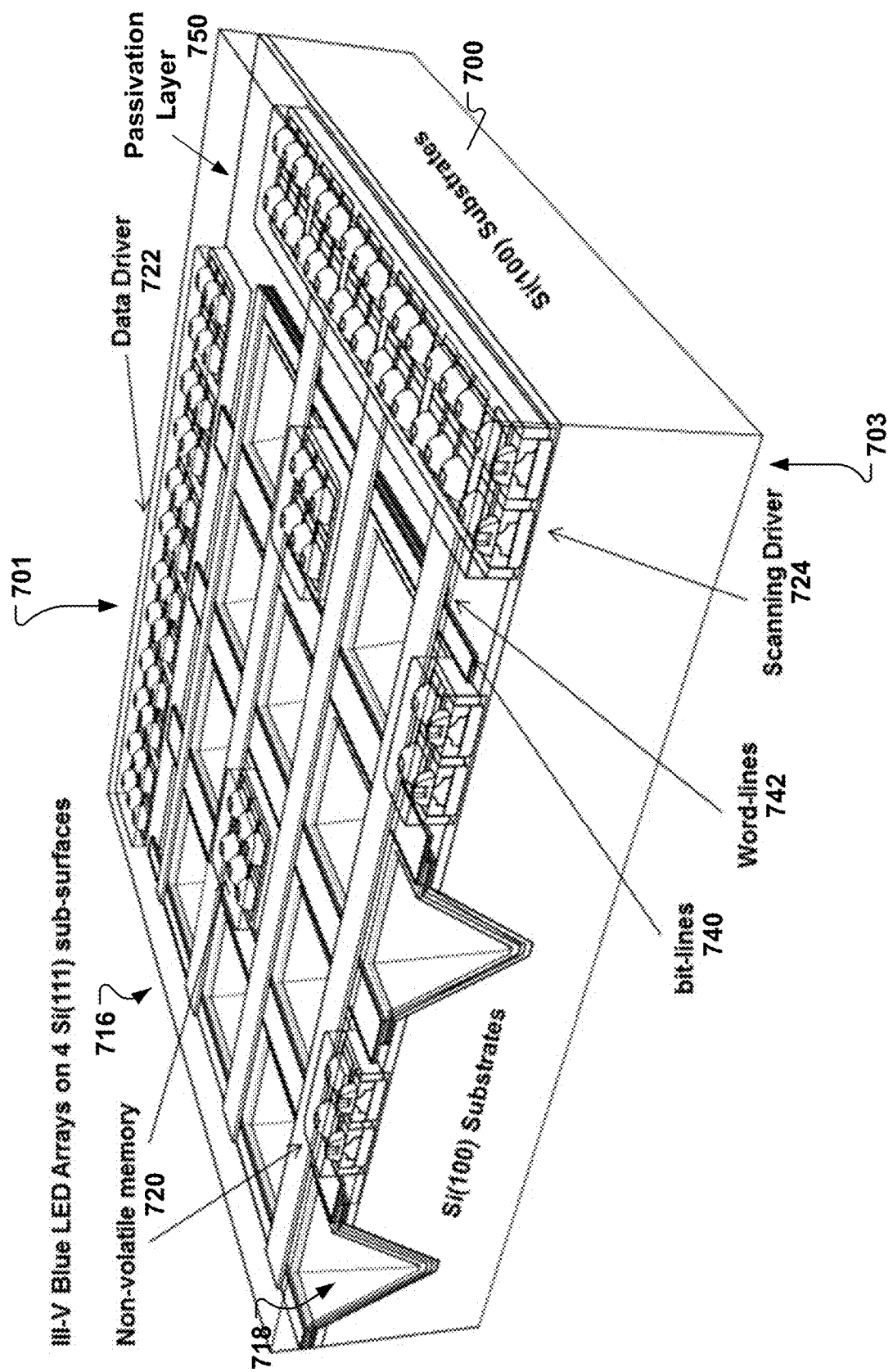

Seventh, as illustrated in FIG. 7G, a passivation layer 750, e.g., a transparent SiOx layer or ITO layer, is formed to cover surfaces of the silicon substrate. The passivation layer 750 can be deposited on the surfaces by MOCVD, ALD, PVD, CVD, or any suitable deposition methods. The passivation layer 750 can also act as an anode or cathode for the LEDs 718. The passivation layer 750 can be connected to the ground or a supply voltage.

All the above steps are performed on the upper side 701 of the silicon substrate 700. In the following eighth step, the silicon substrate 700 is flipped from the upper side 701 to the lower side 703, and a plurality of deep trenches (or through-holes) are formed from the lower side 703, through the substrate 700, and towards the upper side 701. The deep trenches can be formed by deep etching, e.g., deep RIE or plasma etching. Then conductive electrodes are formed inside the deep trenches to form interconnects 760. In some cases, inner surfaces of the deep trenches are insulated and then metals are filled inside the deep trenches to form the conductive electrodes.

Figure 7H:
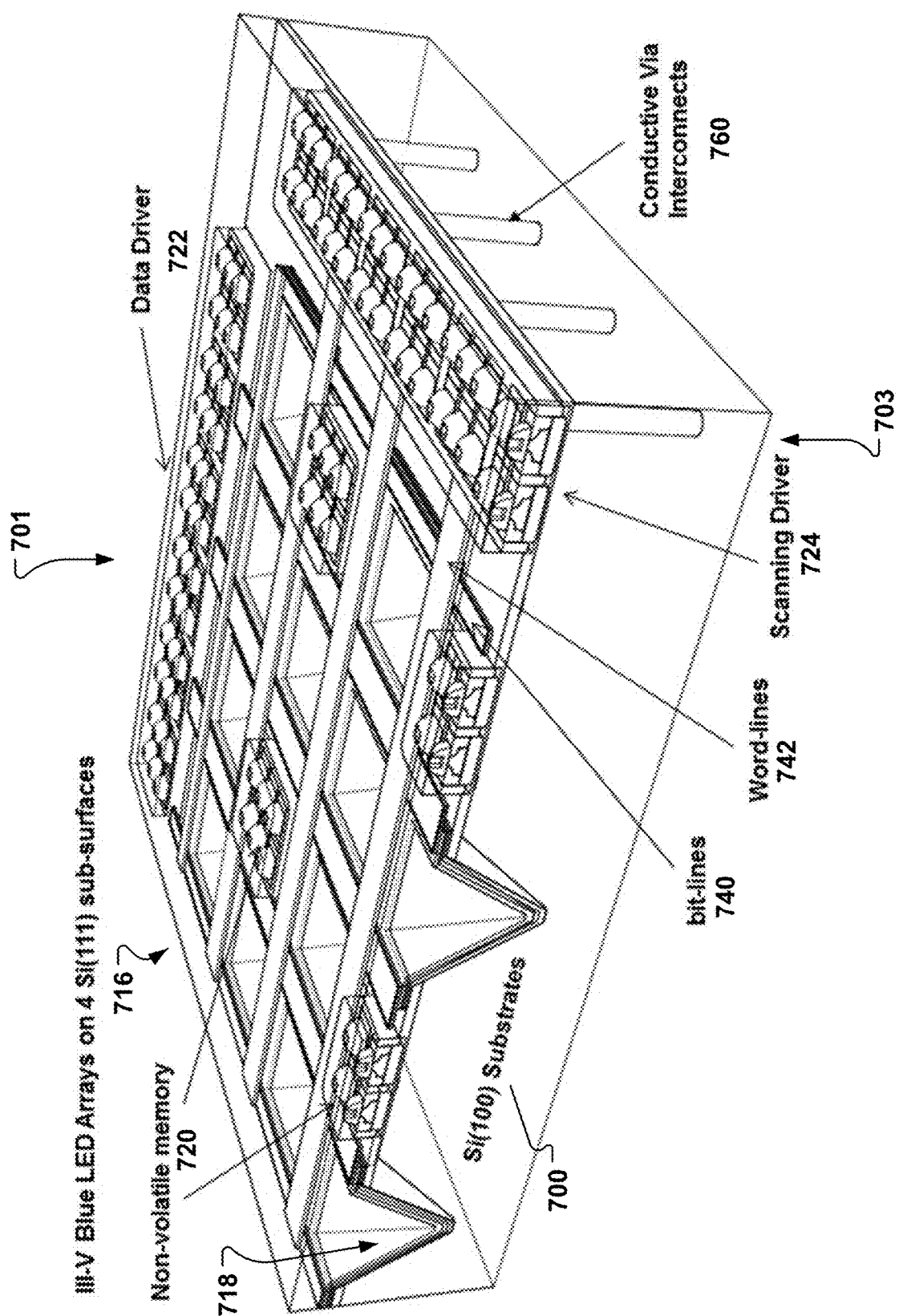
Figure 71:
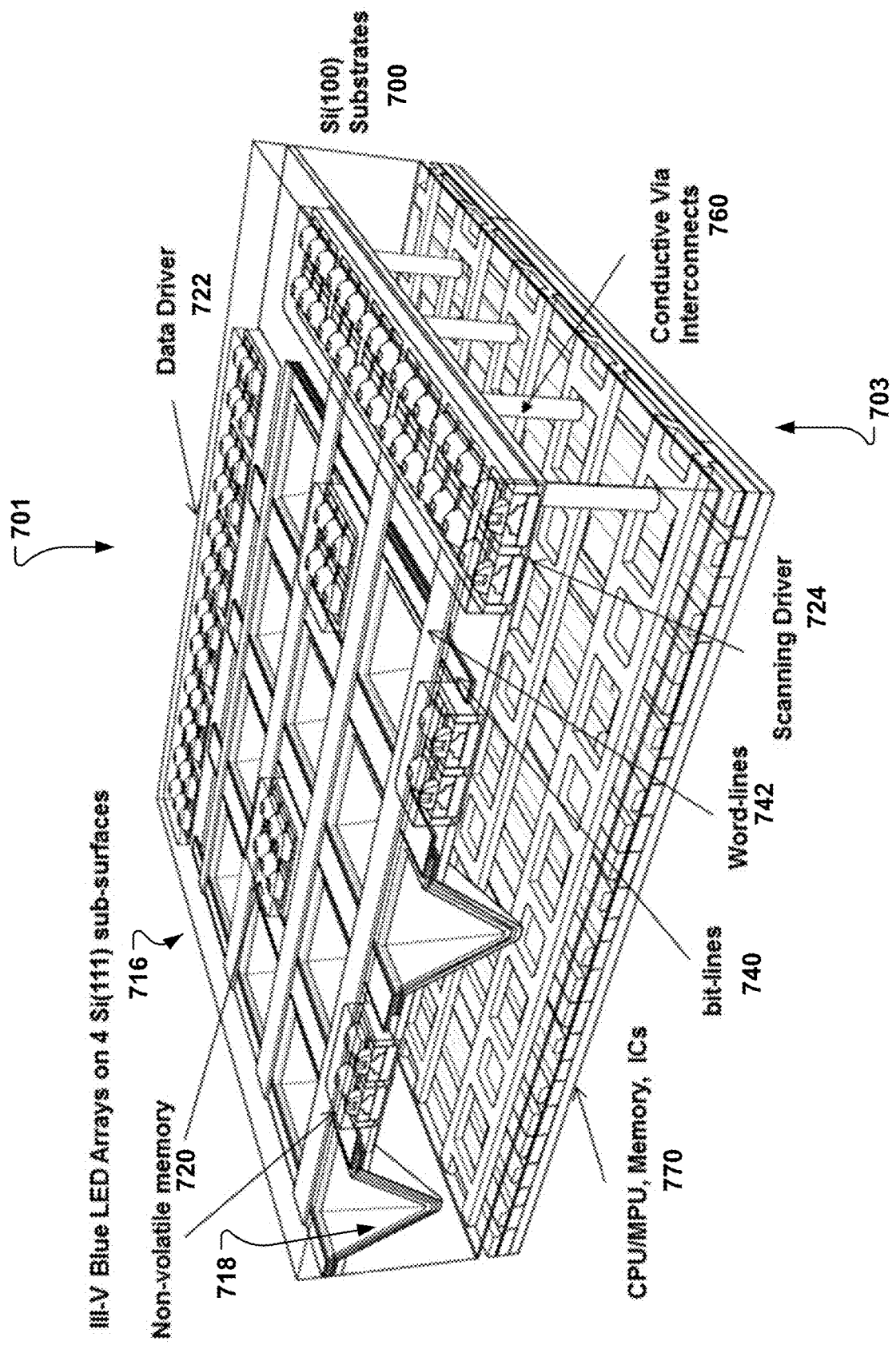

The interconnects 760 are configured to connect the plurality of data drivers 722 and the plurality of scanning drivers 724 to control electronics to be formed on the lower side 703. As the plurality of data drivers 722 can be connected together by interconnects 747 and the plurality of scanning drivers 724 can be connected together by interconnects 748, the number of interconnects 760 can be smaller than a sum of the number of data drivers 722 and the number of scanning drivers 724. As illustrated in FIG. 7H, the interconnects 760 can be distributed, e.g., evenly, among the scanning drivers 724 and the data drivers 722.

Ninth, as illustrated in FIG. 7I, control electronics 770 is formed on the bottom surface 704 of the lower side 703 of the silicon substrate 700. The control electronics 770 can be the control electronics 720 of FIGS. 6A-6B. In some implementations, the control electronics 770 has CPU/MPU, memories, and ICs including amplifiers, ADCs (analog-to-digital converters), DACs (digital-to-analog converters), controllers, and/or other ICs. Components in the control electronics 770 can be connected to each other, e.g., via internal bus. The control electronics 770, e.g., one or more digital signal processors, is coupled to the data drivers 722 and the scanning drivers 724 through the conductive interconnects 760.

Tenth, the silicon substrate 700 is flipped back from the lower side 703 to the upper side 701. Secondary color LEDs, e.g., red color LEDs 792 and green color LEDs 794, can be formed based on the previously-formed LEDs 718, e.g., blue color LED 718. The different color LEDs can form a multi-color LED pixel 790, e.g., the LED pixel 604 of FIGS. 6A-6B.

Secondary color LEDs are formed on surface of the LEDs 718 by using different color phosphor materials or different size quantum-dot (QD) materials. In some implementations, an array of the multi-color LED pixels 790 is formed by the following processes: 1) patterning using photoresist for specific color LEDs, e.g., red LEDs 792; 2) depositing, e.g., ink-jet printing, specific color phosphor films or specific size QD thin-films for the specific color, e.g., red phosphor films or red QD thin-films; 3) lifting off to remove the photoresist to form specific color phosphors/Quantum-dot arrays thus to form the specific color LED arrays, e.g., red LED arrays; 4) repeating the same processes above to form another specific color LED arrays, e.g., green LED arrays 794, but with another specific color phosphor films or another specific size QD thin-films, e.g., green phosphor films or green QD thin-films. In a particular example, a white LED is also formed to be included in each pixel to increase a sharpness of displayed images/pictures.

Figure 7J:
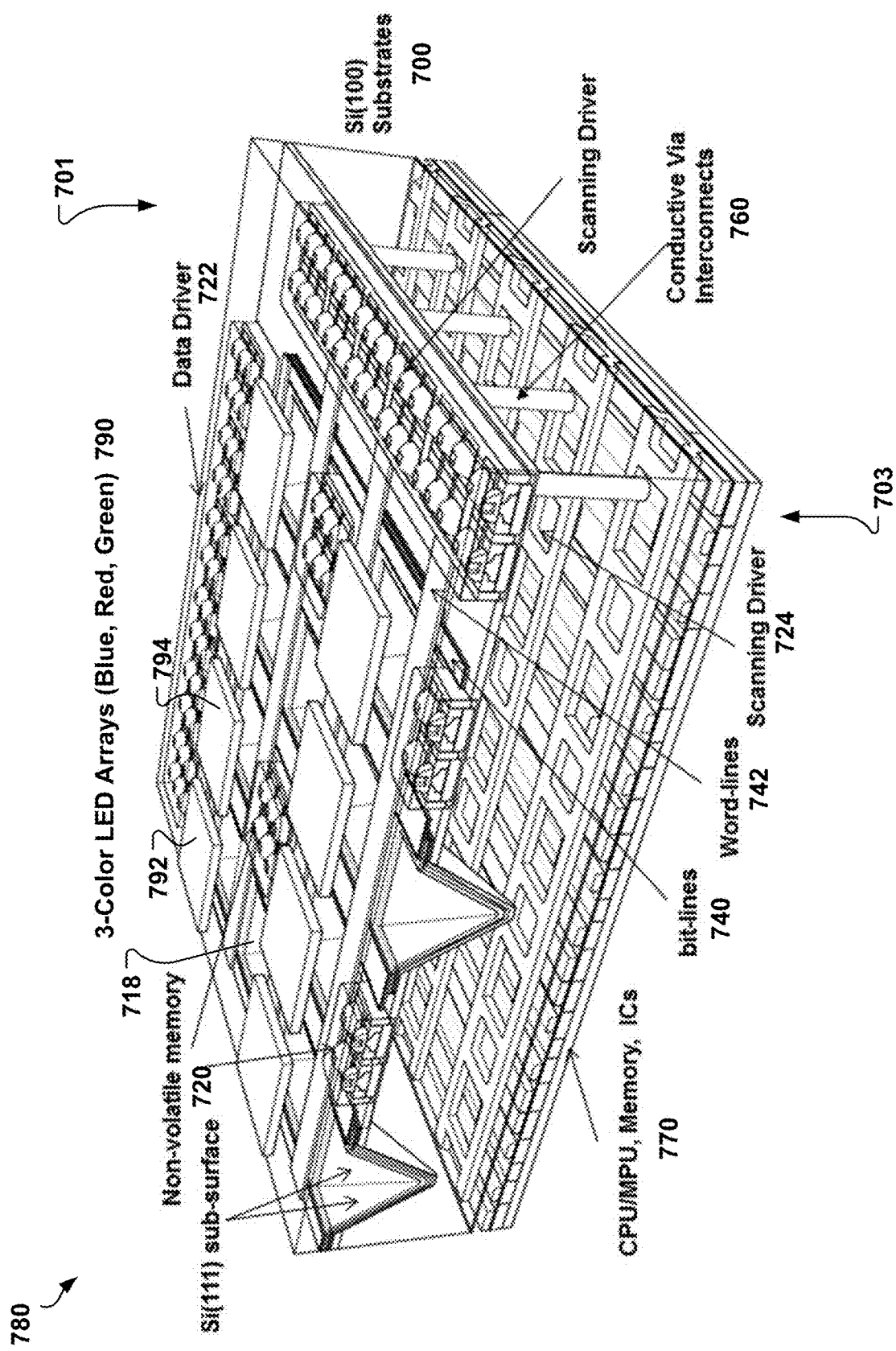

FIG. 7J shows the formed integrated LED display system 780, which can be the LED display system 600 of FIGS.

6A-6B. In the LED display system 580, blue LEDs 510 are first formed using Group III-V compound layers, e.g., In(0.3)Ga(0.7)N layer, as quantum well layers. Then other color LEDs, e.g., red LEDs, green LEDs, or white LEDs, are formed by depositing corresponding color phosphor films or corresponding size QD thin-films on the blue LEDs.

In some other implementations, red LEDs are first formed using Group III-V compound layers, e.g., InN layer, as quantum well layers. Then other color LEDs, e.g., blue LEDs, green LEDs, or white LEDs, are formed by depositing corresponding color phosphor films or QD thin-films on the red LEDs. In some other implementations, green LEDs are first formed using Group III-V compound layers, e.g., In(0.5)Ga(0.5)N layer, as quantum well layers. Then other color LEDs, e.g., blue LEDs, red LEDs, or white LEDs, are formed by depositing corresponding color phosphor films or QD thin-films on the red LEDs.

In some implementations, instead of using color phosphor films or QD thin-films on one color LEDs to generate the other two or more color LEDs, all the color LEDs, e.g., blue LEDs, red LEDs, and green LEDs, can be formed using Group III-V compound layers as quantum well layers. For example, after the second step where the silicon substrate 700 is patterned, blue LED arrays can be first selectively formed on Si (111) sub-surfaces of a first plurality of trenches by using Group III-V compound layers, e.g., In(0.3)Ga(0.7)N layer, as quantum well layers; then red LED arrays can be selectively formed on Si (111) sub-surfaces of a second plurality of trenches by using Group III-V compound layers, e.g., InN layer, as quantum well layers; and then green LED arrays can be selectively formed on Si (111) sub-surfaces of a third plurality of trenches by using Group III-V compound layers, e.g., In(0.5)Ga(0.5)N layer, as quantum well layers. The formation of the three color LED arrays can be arranged in any desired order. Each LED pixel can include a blue LED, a red LED, and a green LED. The number of the first plurality of trenches is identical to the number of the second plurality of trenches and to the number of the third plurality of trenches.

After forming the multi-color LED pixel display 780 as illustrated in FIG. 7J, a protective layer can be further formed on surfaces of the array of LED pixels, including the LEDs 718, 792, and 794. The protective layer can be made of transparent material, e.g., glass or plastic, coated with a conductive material, e.g., indium tin oxide (ITO). The protective layer is coupled to non-volatile memories 720 in the LED pixels under the protective layer and forms a touch screen position sensor with the non-volatile memories 720. The touch screen position sensor can use capacitive sensing. As noted above, a touch on the protective layer can be converted to a capacitance change which is detected by a touch screen detector/analyzer in the control electronics 770 through conductive connections between the non-volatile memories 720 and the data drivers 722/scanning drivers 724 and interconnects 760.

Figure 8A:
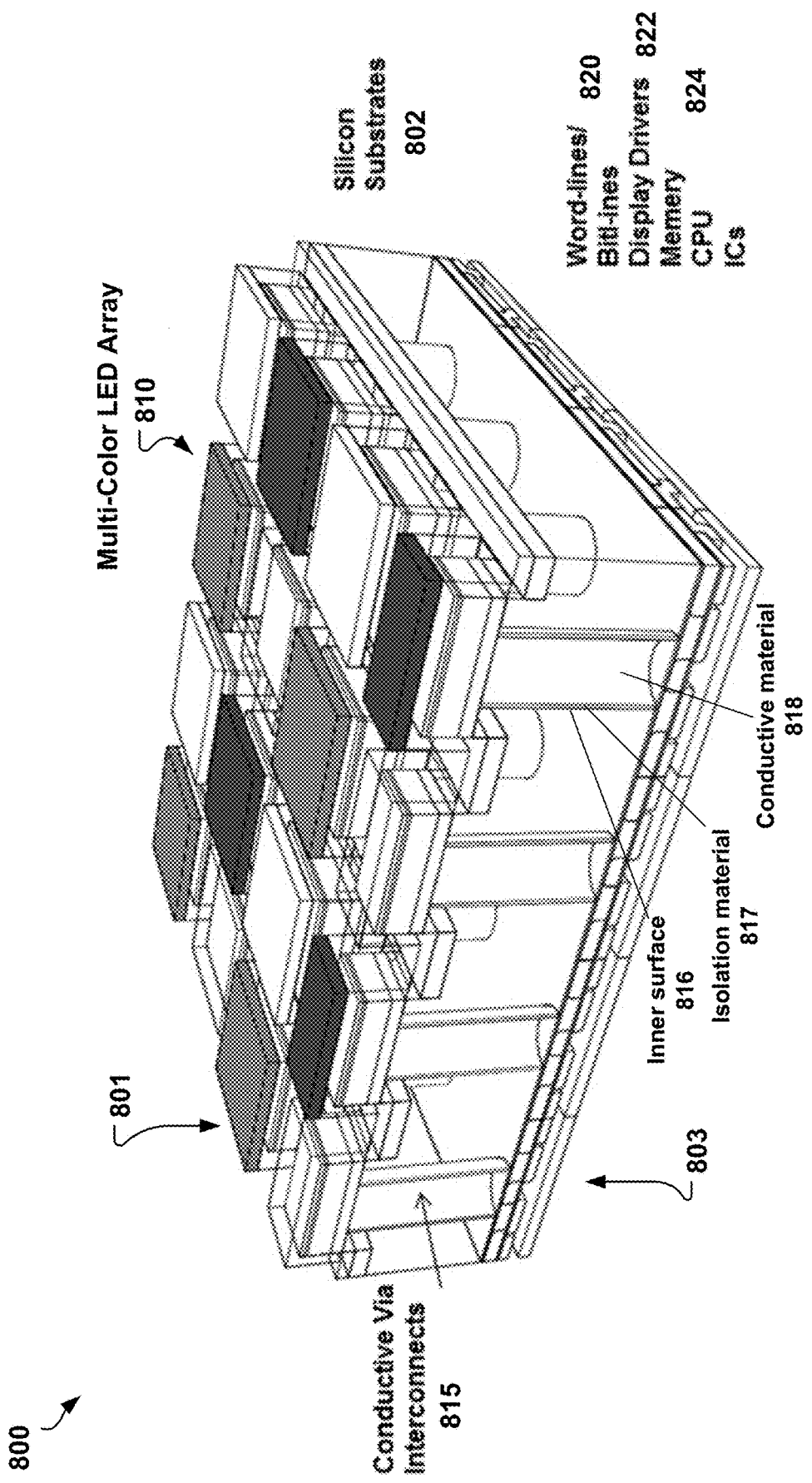
FIG. 8A is a perspective view of a third example of an integrated LED display system with multi-color LED pixel arrays.

FIG. 8A is a perspective view of another example integrated LED display system 800 formed on a silicon (111) substrate 802. The silicon substrate 802 has an upper side 801 and a lower side 803. The display system 800 includes multi-color LED arrays 810 formed on the upper side 803. Word lines/bit lines 820, display drivers 822 (e.g., scanning drivers/data drivers), and control electronics 824 (including CPU, MCU, memory, and/or other ICs) are formed on the lower side 803 of the substrate 802. The word lines/bit lines 820 are connected to the display driver 822. The display driver 822 is connected to the control electronics 824 on the lower side 803. Conductive interconnects 815 are formed in through-holes of the substrate and penetrate through the substrate from the upper side 801 to the lower side 803. The conductive interconnects 815 can be formed by insulating inner surfaces 816 of the through-holes with isolation materials 817 and filling conductive materials 818 in the through-holes.

Each LED pixel can include three LEDs (e.g., blue, red, green) or four LEDs (e.g., blue, red, green, and white). In some implementations, each LED pixel is a passive-matrix LED pixel and driven by at least one display driver 822 through a corresponding interconnect 815 and at least one corresponding word line/bit line 820. In some implementations, each LED pixel is an active-matrix LED pixel that includes at least one LED and at least one non-volatile memory. In some examples, the non-volatile memory is formed on the lower side 803 and coupled to the LED through the conductive interconnect 815. The non-volatile memory can be coupled to at least one display driver 822 through at least one word line/bit line 820 on the lower side 803.

Figure 8B:
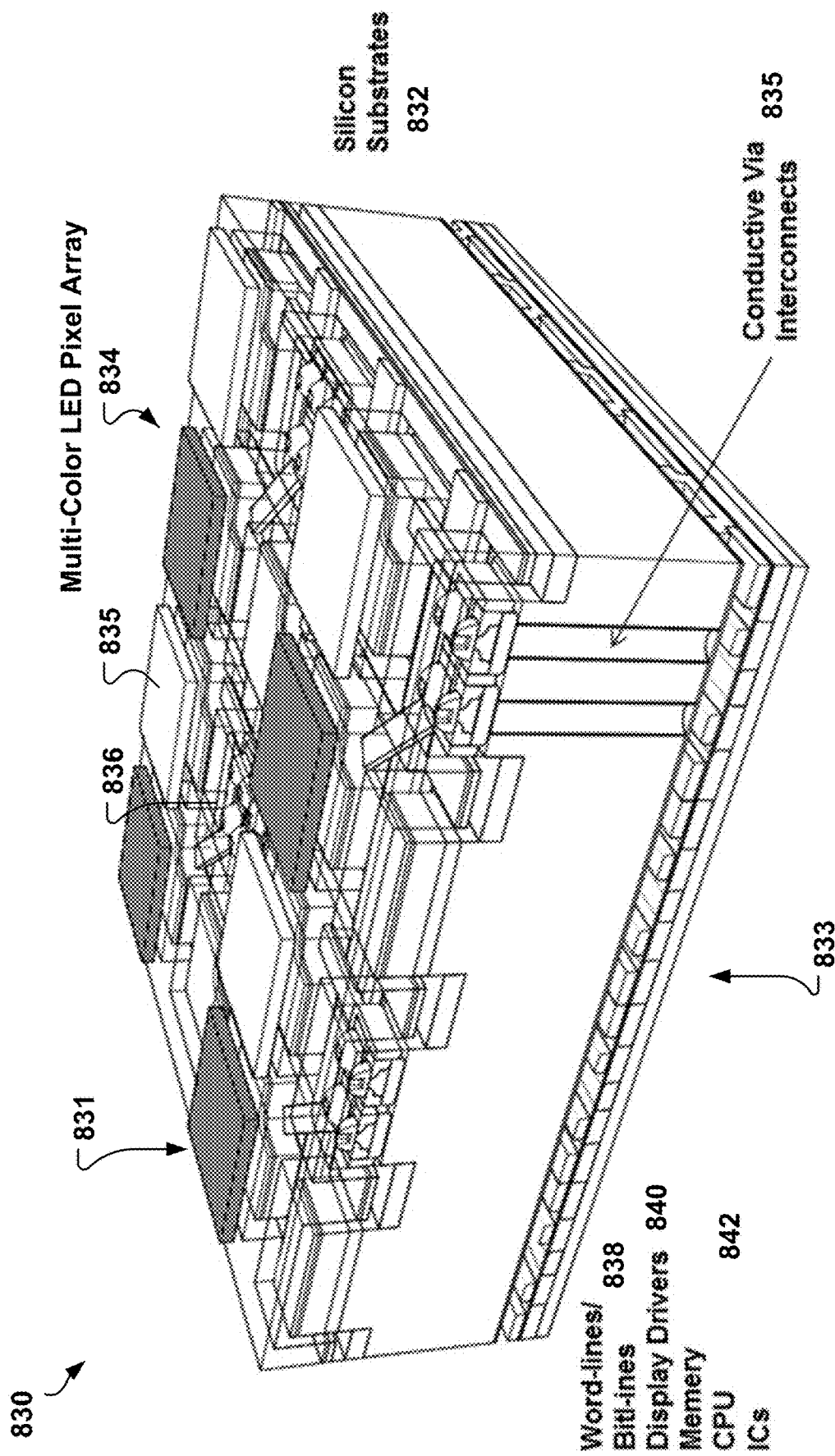
FIG. 8B is a perspective view of a fourth example integrated LED display system with multi-color LED pixel arrays.

FIG. 8B shows another example integrated LED display system 830 formed on a silicon (111) substrate 832. The silicon substrate 832 has an upper side 831 and a lower side 833. The LED display system 830 includes an array of multi-color LED pixels 834. Each LED pixel 834 is an active-matrix LED pixel, e.g., the LED pixel 200 of FIG. 2A or 230 of FIG. 2B. Each LED pixel 834 includes at least one LED 835 and at least one non-volatile memory 836 coupled to the at least one LED 835. The at least one LED 835 and the at least one non-volatile memory 836 are formed on the same side, i.e., the upper side 831. Particularly, the at least on LED 835 and the at least one-volatile memory 836 are positioned adjacent to each other.

Word lines/bit lines 838, display drivers 840 (e.g., scanning drivers/data drivers), and control electronics 842 (e.g., CPU, MCU, memory, or other ICs) are formed on the lower side 833 of the substrate 832. The word lines/bit lines 838 are connected to the display driver 840. The display driver 840 is connected to the control electronics 842 on the lower side 833. Conductive interconnects 835 are formed in through-holes of the substrate and penetrate through the substrate from the upper side 831 to the lower side 833. Each LED pixel 834, e.g., the at least one non-volatile memory 836, is coupled to at least one display driver 840 through a corresponding interconnect 815 and at least one corresponding word line/bit line 820.

Figure 8C:
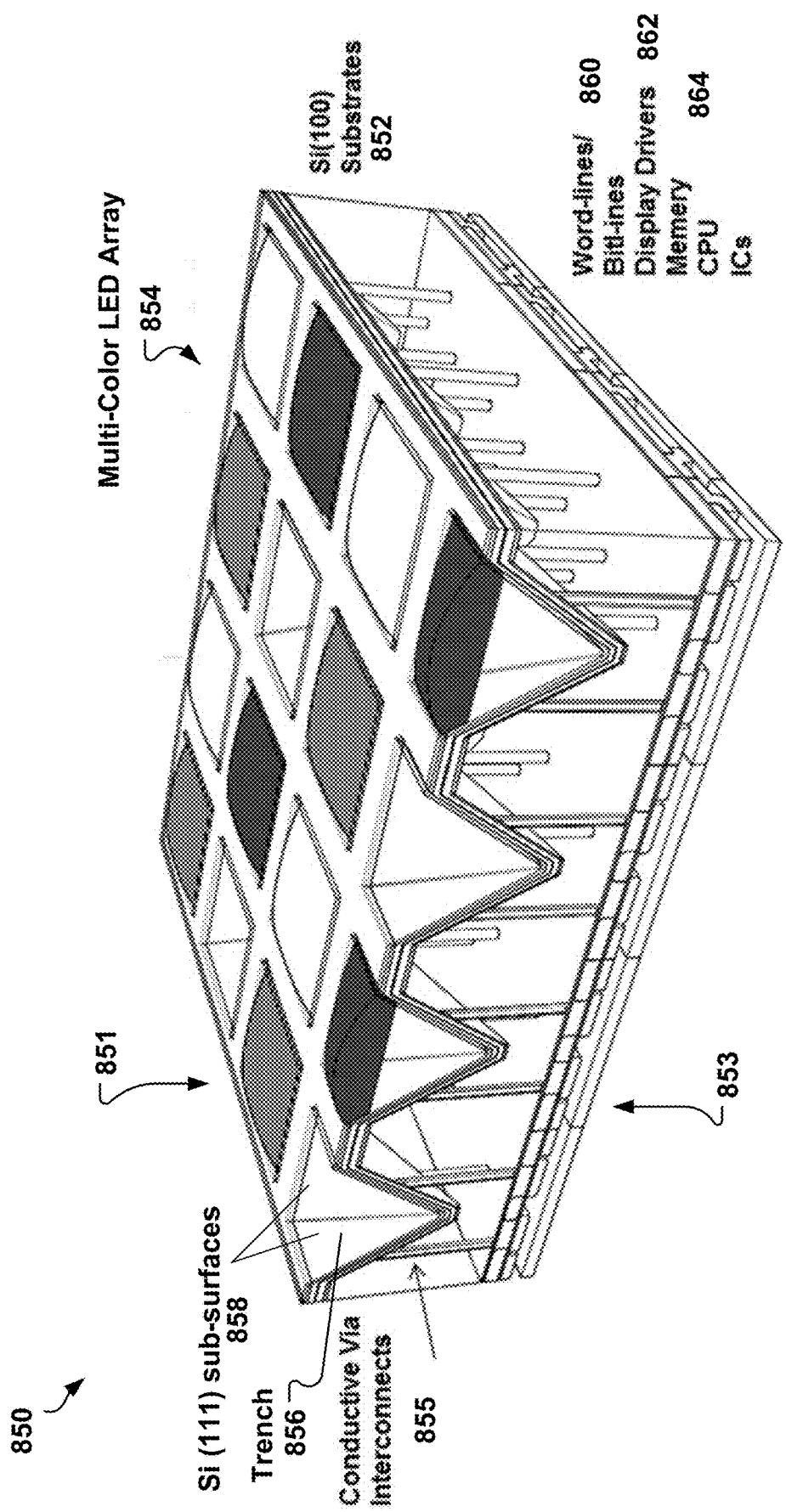
FIG. 8C is a perspective view of a fifth example of an integrated LED display system with multi-color LED pixel arrays.

FIG. 8C is a perspective view of another example integrated LED display system 850 formed on a silicon (100) substrate 852. The silicon (100) substrate 852 has an upper side 851 and a lower side 853. Different from the multi-color LED arrays 810 of FIG. 8A, a multi-color LED array 854 of the LED display system 850 is formed in trenches 856 that have multiple Si (111) sub-surfaces 858 on the upper side 851. As discussed in FIG. 7J, the multi-color LEDs can be formed by first growing primary color LEDs, e.g., Group III-V based blue LEDs, on the Si (111) sub-surface 858, then forming secondary color LEDs, e.g., red LEDs and/or green LEDs, with different color phosphor materials or different size quantum dot materials deposited/printed in the trenches 856.

Word lines/bit lines 860, display drivers 862 (e.g., scanning drivers/data drivers), and control electronics 864 (including CPU, memory, or other ICs) are formed on the lower side 853 of the substrate 852. The word lines/bit lines 860 are connected to the display driver 862. The display driver 862 is connected to the control electronics 864 on the lower side 853. Conductive interconnects 855 are formed in through-holes of the substrate and penetrate through the substrate from the upper side 851 to the lower side 853.

In some implementations, each LED pixel including at least one LED is a passive-matrix LED pixel and driven by at least one display driver 862 through a corresponding interconnect 855 and at least one corresponding word line/bit line 860. In some implementations, each LED pixel including at least one LED is an active-matrix LED pixel that includes at least one LED and at least one non-volatile memory. In some examples, the non-volatile memory is formed on the lower side 853 and coupled to the LED through the conductive interconnect 855. The non-volatile memory can be coupled to at least one display driver 862 through at least one word line/bit line 860 on the lower side 853. In some examples, the non-volatile memory is formed on the upper side 851 and coupled to the LED through conductive connections. The non-volatile memory can be coupled to at least one display driver 862 through the interconnect 855 and at least one word line/bit line 860.

A number of example integrated LED display systems with multi-color LED pixel arrays have been described above in the present disclosure. Other implementations are also possible. In some implementations, an array of passive-matrix LEDs is formed on a first side of a substrate. Display divers (e.g., scanning drivers and data drivers) and connections lines (e.g., word lines and bit lines) are also formed on the first side and coupled to the passive-matrix LEDs. For example, each LED can be coupled to a corresponding scanning driver through at least one word line and to a corresponding data driver through at least one bit line. Control electronics are formed on a second side of the substrate and coupled to the display drivers on the first side through conductive interconnects that penetrate through the substrate from the second side to the first side. The substrate can be a Si (111) substrate or a Si (100) substrate, as discussed above.

In some implementations, an array of LED pixels, e.g., passive-matrix LEDs or active-matrix LED pixels, is formed on a first side of a primary substrate, and display drivers are formed on a second side of the primary substrate and coupled to the LED pixels through interconnects penetrating through the primary substrate. Control electronics, including CPU, memory, controller, or other ICs, is formed or assembled on a secondary substrate and communicates, e.g., wired or wireless, to the display drivers on the primary substrate.

In some implementations, a first part of control electronics for the LED pixel array is integrated (formed or assembled) on the primary substrate, while a second part of the control electronics is on a secondary substrate and communicates with the first part of the control electronics. In one example, the control electronics includes one or more analog signal processors and one or more digital signal processors. The one or more analog signal processors can be on the secondary substrate and the one or more digital signal processors can be integrated on the primary substrate and communicate with the one or more analog signal processors. The digital signal processors are configured to control the LED pixel array. In another example, a controller is integrated on the primary substrate and configured to control the LED pixel array via display drivers, and other components including CPU, memory, and/or ICs, are on the secondary substrate. In some examples, part of the control electronics is formed/fabricated on the substrate, and the other part of the control electronics are external components and assembled, e.g., by bonding, on the substrate.

Example Fabrication Process

Figure 9:
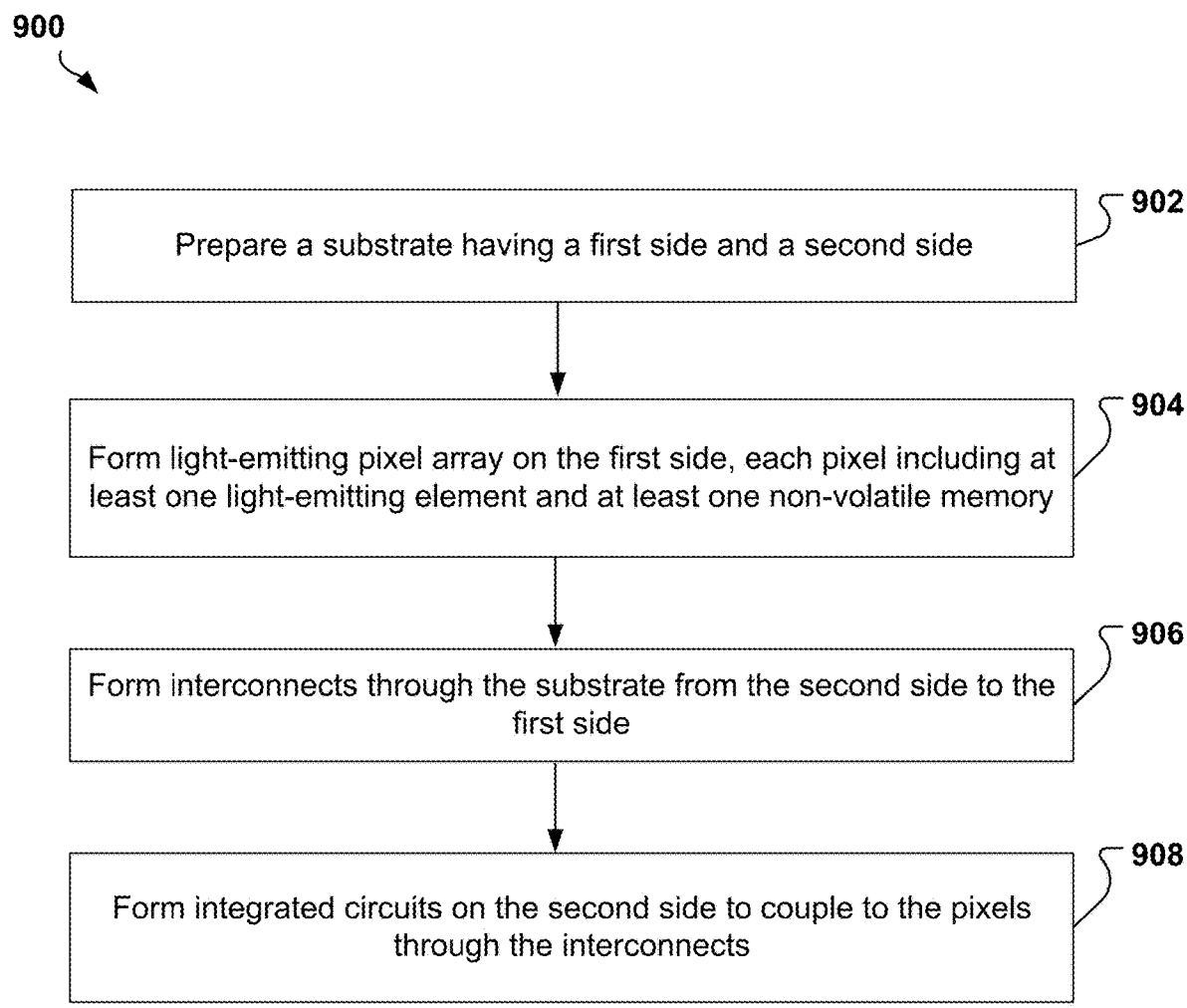
FIG. 9 is a flow diagram of an example process of forming an integrated active-matrix light-emitting pixel display system on a substrate.

FIG. 9 is a flow diagram of an example process 900 of forming an integrated active-matrix light-emitting pixel display system on a substrate. The light-emitting pixel display system can be the LED pixel display system 100 of FIG. 1A, 400 of 4A-4B, 600 of 6A-6B, or 830 of FIG. 8B. The example process 900 can be similar to the processes described according to FIGS. 5A-5J or the processes described according to FIGS. 7A-7J. The substrate can be a Si (111) substrate or a Si (100) substrate.

The substrate is prepared (902). The substrate can be pre-treated, e.g., by cleaning surfaces of the substrate. The substrate can include a first side, e.g., an upper side, and a second side, e.g., a lower side opposite to the upper side.

A light-emitting pixel array is formed on the first side of the substrate (904). Each pixel includes at least one light-emitting element and at least one non-volatile memory coupled to the at least one light-emitting element. The at least one non-volatile memory can be arranged adjacent to the at least one light-emitting element. Each light-emitting element can be connected to one respective non-volatile memory in one pixel.

In some implementations, the substrate is a (111) silicon semiconductor substrate having a first surface on the first side and a second surface on the second side and opposite to the first surface, and the light-emitting elements and the non-volatile memories are formed on the first surface. In some implementations, the substrate is a (100) silicon semiconductor substrate having a first surface along a (100) crystalline plane direction on the first side and a second surface along the (100) crystal plane direction on the second side, the second surface being parallel to the first surface. Preparing the substrate could include etching the first side of the substrate to form a third surface having along a (111) crystalline plane, e.g., a Si (111) sub-surface, the third surface being not parallel to the first surface. Forming light-emitting pixel arrays on the first side can include forming the light-emitting elements of the pixels on the third surface; and forming the non-volatile memories on the first surface.

The light-emitting elements can be light-emitting diodes (LEDs) having one or more quantum well layers including Group III-V compounds, e.g., InGaN. The LEDs can be epitaxially grown (e.g., by MOCVD, MBE, or ALD) on Si (111) surfaces. In some implementations, the light-emitting pixel array is a multi-color pixel array, e.g., including blue, red, green, and/or white colors. As noted above, an array of primary LEDs emitting a first color, e.g., blue, is first formed on the substrate. Secondary color LEDs, e.g., red or green, can be formed by depositing different color phosphor materials or different size quantum dot materials, on surfaces of the primary LED.

Conductive interconnects are formed from the second side to the first side (906). The substrate can be first deep etched from the second side, e.g., by dry reaction ion etching (ME) or plasma etching, to form through-holes or deep trenches in the substrate. Then inner surfaces of the through-holes or deep trenches are insulated, and metals or other conductive materials are filled in the through-holes or deep trenches to form the conductive interconnects.

One or more integrated circuits are formed on the second side to be coupled to the pixels through the interconnects (908). The one or more integrated circuits can include a controller, a processor, and/or other ICs. The integrated circuits are configured to control the pixels through the interconnects.

In some implementations, display drivers including scanning drivers and data drivers are formed on the first side. Connection lines including word lines and bit lines are also formed on the first side. Each pixel is coupled to one of the scanning drivers through at least one word line and to one of the data drivers through at least one bit line. The scanning drivers and the data drivers are coupled to the one or more integrated circuits through the interconnects.

In some implementations, scanning drivers and data drivers are formed on the second side. The scanning drivers and the data drivers are conductively coupled to the one or more integrated circuits on the second side. Word lines and bit lines are formed on the second side, and the pixels are coupled to the word lines and bit lines through the interconnects, such that each pixel is coupled to one of the scanning drivers through at least one word line and to one of the data drivers through at least one bit line.

In some implementations, a protective layer is formed to cover the light emitting pixel array on the first side. The protective layer is coupled to the non-volatile memories in the light emitting pixels to form a touch screen position sensor. The one or more integrated circuits can include a touch screen detector configured to detect a change of the touch screen position sensor, such that the integrated LED pixel display system can function as a touch screen display.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing can be advantageous.

What is claimed is:
1. A device comprising:
  a semiconductor substrate having a first side and a second side, the first and second sides being opposite sides of the semiconductor substrate;
  an array of light-emitting pixels monolithically formed on the first side, each of the light-emitting pixels including at least one light-emitting element and at least one non-volatile memory coupled to the at least one light-emitting element, the at least one non-volatile memory including at least one transistor, the at least one light-emitting element comprising multiple layers epitaxially grown on a semiconductor surface of the semiconductor substrate on the first side;
control electronics formed on the second side; and
interconnects penetrating through the semiconductor substrate and conductively coupling the array of pixels on the first side to the control electronics on the second side, such that the pixels are controllable by the control electronics.

2. The device of claim 1, wherein the non-volatile memory includes at least two transistors.

3. The device of claim 1, further comprising scanning drivers and data drivers, wherein each pixel is coupled to one of the scanning drivers through at least one word line and to one of the data drivers through at least one bit line.

4. The device of claim 3, wherein the word lines and the bit lines are formed on the first side.

5. The device of claim 4, wherein the scanning drivers and the data drivers are formed on the first side and coupled to the control electronics through the interconnects.

6. The device of claim 5, wherein a number of the interconnects is smaller than a sum of a number of the scanning drivers and a number of the data drivers.

7. The device of claim 4, wherein the scanning drivers and the data drivers are formed on the second side and coupled to the word lines and the bit lines through the interconnects, and
wherein the scanning drivers and the data drivers are conductively coupled to the control electronics on the second side.

8. The device of claim 3, wherein the word lines and the bit lines are formed on the second side and coupled to the pixels through the interconnects, and
wherein the scanning drivers and the data drivers are formed on the second side and conductively coupled to the control electronics on the second side.

9. The device of claim 3, wherein each pixel includes at least three light-emitting elements operable to emit at least three different colors.

10. The device of claim 9, wherein each of the at least three light-emitting elements is coupled to a respective non-volatile memory in the pixel, and
wherein the respective non-volatile memory is coupled to the one of the scanning drivers through a respective word line and the one of the data drivers through a respective bit line.

11. The device of claim 9, wherein the at least three light-emitting elements comprise red, blue, and green light-emitting diodes (LEDs).

12. The device of claim 11, wherein the at least three light-emitting elements comprise a white LED.

13. The device of claim 9, wherein the at least three light-emitting elements comprise one or more quantum well layers formed by Group III-V compounds.

14. The device of claim 13, wherein the at least three light-emitting elements have the same quantum well layers configured to emit light with a first color, and
wherein at least one of the at least three light-emitting elements comprises a phosphor material or a quantum-dot material configured to emit a second light having a color different from the first color.

15. The device of claim 3, wherein the control electronics comprises a controller configured to transmit a data signal to one or more particular data drivers and one or more particular scanning drivers,
wherein the one or more particular scanning drivers are configured to select one or more light-emitting pixels through corresponding word lines, and
wherein the one or more particular data drivers are configured to transmit a power signal based on the data signal through corresponding bit lines to the selected light-emitting pixels such that the selected light-emitting pixels emit light based on the power signal.

16. The device of claim 15, wherein the control electronics comprises a processor configured to process an image for display, the data signal being based on a result of processing the image.

17. The device of claim 1, wherein the substrate is a silicon semiconductor substrate.

18. The device of claim 17, wherein the silicon substrate has a first surface having a (111) orientation on the first side and a second surface having a (111) orientation on the second side and opposite to the first surface, and
wherein the light-emitting pixels are formed on the first surface, and the control electronics are formed on the second surface.

19. The device of claim 17, wherein the silicon substrate has a first surface having a (111) orientation on the first side and a second surface having a (100) orientation on the second side, the first surface being not parallel to the second surface, and
wherein the light-emitting elements of the pixels are at least partially formed on the first surface, and the control electronics are formed on the second surface.

20. The device of claim 19, wherein the first side comprises an array of trenches defining a plurality of sub-surfaces each having a (111) orientation, the sub-surfaces including the first surface and being not parallel to the second surface, and
wherein the light-emitting elements of the pixels are at least partially formed on the sub-surfaces of the trenches.

21. The device of claim 19, wherein the silicon substrate has a third surface having a (100) orientation on the first side and parallel to the second surface, and
wherein the non-volatile memories of the pixels are formed on the third surface.

22. The device of claim 1, further comprising a protective layer covering the array of light-emitting pixels on the first side and coupled to the non-volatile memories in the light-emitting pixels,
wherein the protective layer and the non-volatile memories form a touch screen position sensor operable to generate an electrical change in response to a touch on a spot of the protective layer.

23. The device of claim 22, wherein the control electronics comprises a touch screen signal processor coupled to the non-volatile memories through the interconnects.

24. The device of claim 1, wherein the control electronics comprises one or more digital signal processors including at least one of: a digital signal analyzer, a digital processor, an image processor, a volatile memory, a non-volatile memory, or a touch screen processor.

25. The device of claim 1, wherein the control electronics comprises one or more analog signal processors including at least one of: a light signal sensor, an electrical signal sensor, a sound signal sensor, a sound signal processor, an analog signal amplifier, an analog to digital converter (ADC), a digital to analog converter (DAC), or a touch screen signal processor.

26. An integrated active-matrix light-emitting diode (LED) pixel display, comprising:
a silicon semiconductor substrate having a first side and a second side, the first and second sides being opposite sides of the silicon semiconductor substrate;

an array of active-matrix LED pixels monolithically formed on the first side, each LED pixel including at least one LED and at least one non-volatile memory coupled to the at least one LED, the at least one non-volatile memory including at least one transistor, the at least one LED comprising multiple layers epitaxially grown on a single crystal silicon semiconductor surface of the silicon semiconductor substrate on the first side;

a plurality of display drivers formed on the first side and coupled to the LED pixels;

one or more integrated circuits formed on the second side; and a plurality of conductive electrodes penetrating through the silicon semiconductor substrate and coupling the display drivers on the first side to the one or more integrated circuits on the second side, wherein the one or more integrated circuits are operable to transmit image or video data to the display drivers via the conductive electrodes, and the display drivers are operable to select one or more particular LED pixels and control the particular LED pixels to emit light based on the image or video data.

27. The integrated active-matrix LED display of claim 26, wherein the plurality of display drivers comprise scanning drivers and data drivers formed on the first side, and
wherein each of the LED pixels is coupled to one of the scanning drivers through at least one word line and to one of the data drivers through at least one bit line, the word lines and the bit lines being formed on the first side.

28. The integrated active-matrix LED display of claim 27, wherein the one or more integrated circuits comprise a controller configured to transmit the image or video data to one or more particular data drivers and one or more particular scanning drivers,
wherein the one or more particular scanning drivers are configured to select one or more LED pixels through corresponding word lines, and
wherein the one or more particular data drivers are configured to transmit a power signal based on the data signal through corresponding bit lines to the selected LED pixels such that the selected LED pixels emit light based on the power signal.

29. The integrated active-matrix LED display of claim 26, wherein a number of the plurality of conductive electrodes is no more than a number of the plurality of display drivers.

30. The integrated active-matrix LED display of claim 26, wherein the silicon semiconductor substrate comprises:
a first surface along a (111) crystalline plane direction on the first side, the array of active-matrix LED pixels and the display drivers being formed on the first surface; and
a second surface along the (111) crystalline plane direction on the second side, the second surface being opposite to the first surface, the one or more integrated circuits being formed on the second surface.

31. The integrated active-matrix LED display of claim 26, wherein the silicon semiconductor substrate including a first surface along a (111) crystalline plane direction on the first side, the light-emitting elements of the pixels being at least partially formed on the first surface;
a second surface along a (100) crystalline plane direction on the first side, the non-volatile memories of the pixels and the display drivers being formed on the second surface; and a third surface along the (100) crystalline plane direction on the second side, the one or more integrated circuits being formed on the third surface.

32. The integrated active-matrix LED display of claim 26, wherein each of the pixels includes at least three light-emitting elements operable to emit at least three different colors,
wherein the at least three light-emitting elements comprise same quantum well layers formed by Group III-V compounds and configured to emit light with a first color, and
wherein at least one of the at least three light-emitting elements comprises a phosphor material or a quantum-dot material configured to emit a second light different from the first color.

33. A method of forming integrated light-emitting pixel arrays for display, comprising:
preparing a semiconductor substrate that has a first side and a second side, the first and second sides being opposite sides of the semiconductor substrate;
monolithically forming light-emitting pixel arrays on the first side, each pixel comprising at least one light-emitting element and at least one non-volatile memory coupled to the at least one light-emitting element, the at least one non-volatile memory including at least one transistor, the at least one light-emitting element comprising multiple layers epitaxially grown on a semiconductor surface of the semiconductor substrate on the first side;
forming conductive interconnects through the semiconductor substrate; and
forming one or more integrated circuits on the second side, the interconnects conductively coupling the one or more integrated circuits to the light-emitting pixels such that the light-emitting pixels are operable by the one or more integrated circuits.

34. The method of claim 33, further comprising:
forming scanning drivers and data drivers on the first side; and
forming word lines and bit lines on the first side, such that each pixel is coupled to one of the scanning drivers through at least one word line and to one of the data drivers through at least one bit line,
wherein the scanning drivers and the data drivers are coupled to the one or more integrated circuits through the interconnects.

35. The method of claim 33, further comprising:
forming scanning drivers and data drivers on the second side, wherein the scanning drivers and the data drivers are conductively coupled to the one or more integrated circuits on the second side; and
forming word lines and bit lines on the second side, wherein the pixels are coupled to the word lines and bit lines through the interconnects, such that each pixel is coupled to one of the scanning drivers through at least one word line and to one of the data drivers through at least one bit line.

36. The method of claim 33, wherein the formed light-emitting elements are configured to emit light with a first color,
the method further comprising:
patterning by photoresist the first side to select particular light-emitting elements;
depositing a phosphor film or a quantum-dot film on the selected light-emitting elements; and removing the photoresist to form light-emitting elements for emitting light with a second color different from the first color.

37. The method of claim 33, wherein the substrate is a (111) silicon semiconductor substrate having a first surface on the first side and a second surface on the second side and opposite to the first surface, and wherein the light-emitting elements and the non-volatile memories are formed on the first surface, and the one or more integrated circuits are formed on the second surface.

38. The method of claim 33, wherein the substrate is a (100) silicon semiconductor substrate having a first surface along a (100) crystalline plane direction on the first side and a second surface along the (100) crystalline plane direction on the second side, the second surface being parallel to the first surface, wherein preparing a substrate comprises etching the first side of the substrate to form a third surface having along a (111) crystalline plane, the third surface being not parallel to the first surface.

39. The method of claim 38, wherein forming light-emitting pixel arrays on the first side comprises:

forming the light-emitting elements of the pixels on the third surface; and forming the non-volatile memories on the first surface, and wherein forming one or more integrated circuits on the second side comprises:

forming the one or more integrated circuits on the second surface.

40. The method of claim 33, wherein forming light-emitting pixel arrays on the first side comprises:

forming light-emitting diodes (LEDs) including one or more quantum well layers including Group III-V compounds.

41. A method of displaying an image on an integrated display system formed on a semiconductor substrate, the method comprising:

receiving an instruction to display an image on the display system;

analyzing, by a controller of the display system, the image to obtain image data, the controller being formed on a first side of the semiconductor substrate;

transmitting, by the controller, the image data to one or more display drivers formed on a second side of the semiconductor substrate via conductive interconnects penetrating through the semiconductor substrate, the first and second sides being opposite sides of the semiconductor substrate;

selecting, by the display drivers, one or more light-emitting pixels of an array of light-emitting pixels monolithically formed on the second side of the semiconductor substrate, each of the light-emitting pixels comprising at least one light-emitting element that includes multiple layers epitaxially grown on a semiconductor surface of the semiconductor substrate on the second side; and controlling, by the display drivers, the selected light-emitting pixels to emit light corresponding to the image data to display the image.

42. An integrated light-emitting diode (LED) display device, comprising:

a silicon substrate having a first side and a second side, the first and second sides being opposite sides of the silicon substrate;

an array of light-emitting pixels monolithically formed on the first side, each pixel including at least one light-emitting diode (LED) and at least one non-volatile memory, the at least one non-volatile memory comprising at least one transistor, the at least one LED comprising multiple layers epitaxially grown on a silicon surface of the silicon substrate on the first side;

a plurality of scanning drivers and a plurality of data drivers formed on the first side, wherein each pixel is coupled to a corresponding scanning driver through at least one word line and to a corresponding data driver through at least one data line, the word lines and the data lines being conductive metal lines;

one or more digital signal processors and one or more analog signal processors formed on the second side; and a plurality of conductive electrodes penetrating through the silicon substrate and between the first side and the second side, the conductive electrodes coupling the plurality of scanning drivers and the plurality of data drivers on the first side to the digital signal processors on the second side to form the integrated LED display device.

43. The integrated LED display device of claim 42, configured to display static or dynamic images or videos with multiple colors.

44. The integrated LED display device of claim 42, wherein each pixel comprises at least an III-V compound based LED operable to emitting a blue color.

45. The integrated LED display device of claim 42, wherein each pixel comprises at least one secondary light emitting material configured to change a primary color emitted by the LED in the pixel, and wherein the secondary light emitting material comprises at least one of a different color phosphor material or a different size quantum dot material.

46. The integrated LED display device of claim 42, wherein each pixel include at least three LEDs for emitting three primary colors, and where the three primary colors comprise red, blue, and green.

47. The integrated LED display device of claim 42, wherein each non-volatile memory comprises at least two transistors.

48. The integrated LED display device of claim 42, wherein an emitting surface of the LEDs is not parallel to a surface of the silicon substrate.

49. The integrated LED display device of claim 42, wherein the digital signal processors comprise at least one of: a digital signal analyzer, a digital processor, an image processor, a volatile memory, a non-volatile memory, or a touch screen signal processor.

50. The integrated LED display device of claim 42, wherein the analog signal processors comprise at least one of: a light signal sensor, an electrical signal sensor, a sound signal sensor, a sound signal processor, an analog signal amplifier, an analog to digital converter (ADC), a digital to analog converter (DAC), or a touch screen signal processor, or any other associated electronic components.

51. The integrated LED display device of claim 42, further comprising a transparent protective layer on the first side and configured to cover the light-emitting pixels, wherein the transparent protective layer and the non-volatile memories underneath in the light-emitting pixels form a touch screen position sensor.

52. A method of monolithically fabricating an integrate LED pixel display device, comprising:

forming an array of single crystal silicon surfaces parallel to a (111) crystalline plane on a first side of a silicon substrate, the single crystal silicon surfaces being substantially parallel to each other;

epitaxially growing an array of non-organic LEDs on the array of single crystal silicon surfaces of the silicon substrate on the first side;

forming, for each LED pixel, at least one non-volatile memory adjacent to each of the LEDs in the LED pixel and on the first side of the silicon substrate, the at least one non-volatile memory comprising at least one transistor;

forming a plurality of row scanning drivers and a plurality of column data drivers on the first side of the silicon substrate;

forming row metal connection lines and column metal connection lines on the first side of the silicon substrate, wherein each of the LEDs is connected to a corresponding non-volatile memory that is connected to one of the scanning drivers through at least one row metal connection line and to one of the data drivers through at least one column line;

forming conductive electrodes connecting the first side and a second side of the silicon substrate;

forming control electronics on the second side of the silicon substrate; and forming an array of secondary light emitting elements on surfaces of the formed LEDs by using different color phosphor materials or different size quantum dots materials.

53. A device comprising:

a semiconductor substrate having a first side and a second side, the first and second sides being opposite sides of the semiconductor substrate;

an array of light-emitting pixels monolithically formed on the first side, each pixel including at least one light-emitting element that includes multiple layers epitaxially grown on a semiconductor surface of the semiconductor substrate on the first side;

one or more display drivers formed on the first side and coupled to the array of light-emitting pixels;

control electronics formed on the second side; and interconnects penetrating through the semiconductor substrate and conductively coupling the control electronics on the second side to the one or more display drivers on the first side, the interconnects comprising conductive materials filled in through-holes of the semiconductor substrate and insulated from inner surfaces of the through-holes with isolation materials different from a material of the semiconductor substrate.

54. The device of claim 53, wherein the display drivers comprise scanning drivers and data drivers, and wherein each pixel is coupled to one of the scanning drivers through at least one word line and to one of the data drivers through at least one bit line, and the word lines and the bit lines are formed on the first side.

55. The device of claim 54, wherein the control electronics comprises a controller configured to transmit a data signal to one or more particular data drivers and one or more particular scanning drivers, wherein the one or more particular scanning drivers are configured to select one or more light-emitting pixels through corresponding word lines, and wherein the one or more particular data drivers are configured to transmit a power signal based on the data signal through corresponding bit lines to the selected light-emitting pixels such that the selected light-emitting pixels emit light based on the power signal.

56. The device of claim 55, wherein the control electronics comprises a processor configured to process an image for display, the data signal being based on a result of processing the image.

57. The device of claim 53, wherein each pixel includes at least three light-emitting elements operable to emit at least three different colors.

58. The device of claim 57, wherein the at least three light-emitting elements comprise red, blue, and green light-emitting diodes (LEDs).

59. The device of claim 57, wherein the at least three light-emitting elements comprise a white LED.

60. The device of claim 57, wherein the at least three light-emitting elements comprise one or more quantum well layers formed by Group III-V compounds.

61. The device of claim 60, wherein the at least three light-emitting elements have the same quantum well layers configured to emit light with a first color, and wherein at least one of the at least three light-emitting elements comprises a phosphor material or a quantum-dot material configured to emit a second light having a color different from the first color.

62. The device of claim 53, wherein the substrate is a silicon semiconductor substrate.

63. The device of claim 62, wherein the silicon substrate has a first surface having a (111) orientation on the first side and a second surface having a (111) orientation on the second side and opposite to the first surface, and wherein the light-emitting pixels and the display drivers are formed on the first surface, and the control electronics are formed on the second surface.

64. The device of claim 62, wherein the silicon substrate has a first surface having a (111) orientation on the first side and a second surface having a (100) orientation on the second side, the first surface being not parallel to the second surface, and wherein the light-emitting elements of the pixels are at least partially formed on the first surface, and the control electronics are formed on the second surface.

65. The device of claim 64, wherein the first side comprises an array of trenches defining a plurality of sub-surfaces each having a (111) orientation, the sub-surfaces including the first surface and being not parallel to the second surface, and wherein the light-emitting elements of the pixels are at least partially formed on the sub-surfaces of the trenches.

66. The device of claim 64, wherein the silicon substrate has a third surface having a (100) orientation on the first side and parallel to the second surface, and wherein the display drivers are formed on the third surface.

67. The device of claim 53, wherein the control electronics comprises:

one or more digital signal processors including at least one of: a digital signal analyzer, a digital processor, an image processor, a volatile memory, a non-volatile memory, or a touch screen processor; and one or more analog signal processors including at least one of: a light signal sensor, an electrical signal sensor, a sound signal sensor, a sound signal processor, an analog signal amplifier, an analog to digital converter (ADC), a digital to analog converter (DAC), or a touch screen signal processor.

* * * * *